US009653623B2

(12) United States Patent
Hong et al.

(10) Patent No.: US 9,653,623 B2

(45) Date of Patent: May 16, 2017

(54) METHODS OF MANUFACTURING A SEMICONDUCTOR DEVICE

(71) Applicant: Samsung Electronics Co., Ltd., Suwon-si, Gyeonggi-do (KR)

(72) Inventors: Yi-Koan Hong, Suwon-si (KR); Yeun-Sang Park, Yongin-si (KR); Byung-Lyul Park, Seoul (KR); Joo-Hee Jang, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/956,382

(22) Filed: Dec. 1, 2015

(65) Prior Publication Data

US 2016/0155862 A1 Jun. 2, 2016

(30) Foreign Application Priority Data

Dec. 2, 2014 (KR) ........................ 10-2014-0170417

(51) Int. Cl.

*H01L 31/02* (2006.01)
*H01L 31/0232* (2014.01)
*H01L 23/00* (2006.01)

(52) U.S. Cl.

CPC ........ *H01L 31/02005* (2013.01); *H01L 24/06* (2013.01); *H01L 24/29* (2013.01); *H01L 24/30* (2013.01); *H01L 24/32* (2013.01); *H01L 24/80* (2013.01); *H01L 24/83* (2013.01); *H01L 24/91* (2013.01); *H01L 31/02327* (2013.01); *H01L 24/05* (2013.01); *H01L 2224/04026* (2013.01); *H01L 2224/05547* (2013.01);

(Continued)

(58) Field of Classification Search

None

See application file for complete search history.

(56) References Cited

U.S. PATENT DOCUMENTS 6,138,348 A 10/2000 Kulesza et al.
7,588,964 B2 9/2009 Kwon et al.

(Continued)

FOREIGN PATENT DOCUMENTS

JP 2013038112 A 2/2013
JP 2013182985 A 9/2013

*Primary Examiner* — Whitney T Moore

(74) *Attorney, Agent, or Firm* — Renaissance IP Law Group LLP

(57) ABSTRACT

In a method for fabricating a semiconductor, a first conductive pattern structure partially protruding upwardly from first insulating interlayer is formed in first insulating interlayer. A first bonding insulation layer pattern covering the protruding portion of first conductive pattern structure is formed on first insulating interlayer. A first adhesive pattern containing a polymer is formed on first bonding insulation layer pattern to fill a first recess formed on first bonding insulation layer pattern. A second bonding insulation layer pattern covering the protruding portion of second conductive pattern structure is formed on second insulating interlayer. A second adhesive pattern containing a polymer is formed on second bonding insulation layer pattern to fill a second recess formed on second bonding insulation layer pattern. The first and second adhesive patterns are melted. The first and second substrates are bonded with each other so that the conductive pattern structures contact each other.

20 Claims, 48 Drawing Sheets

240
242 244 292
200
210
220
270 252
262
230
280
180
170 152
162
130
120
110
100
142 144 192
140

(52) U.S. Cl.
CPC ............... *H01L 2224/05557* (2013.01); *H01L 2224/05647* (2013.01); *H01L 2224/06505* (2013.01); *H01L 2224/08121* (2013.01); *H01L 2224/08147* (2013.01); *H01L 2224/27416* (2013.01); *H01L 2224/27602* (2013.01); *H01L 2224/29011* (2013.01); *H01L 2224/29013* (2013.01); *H01L 2224/29014* (2013.01); *H01L 2224/29022* (2013.01); *H01L 2224/2929* (2013.01); *H01L 2224/3013* (2013.01); *H01L 2224/3014* (2013.01); *H01L 2224/3015* (2013.01); *H01L 2224/3016* (2013.01); *H01L 2224/30051* (2013.01); *H01L 2224/32147* (2013.01); *H01L 2224/80895* (2013.01); *H01L 2224/80896* (2013.01); *H01L 2224/80903* (2013.01); *H01L 2224/8388* (2013.01); *H01L 2224/83193* (2013.01)

(56) References Cited

U.S. PATENT DOCUMENTS

| | | | |
|---|---|---|---|
| 7,897,431 | B2 | 3/2011 | Chen et al. |
| 8,614,146 | B2 | 12/2013 | Takesako et al. |
| 8,618,667 | B2 | 12/2013 | Takeda et al. |
| 8,697,493 | B2 | 4/2014 | Sadaka |
| 2012/0094469 | A1 | 4/2012 | Landru |
| 2013/0009321 | A1 | 1/2013 | Kagawa et al. |
| 2013/0252399 | A1* | 9/2013 | Leduc ................. H01L 21/0226 438/455 |
| 2013/0270328 | A1 | 10/2013 | Cioccio et al. |
| 2013/0285253 | A1* | 10/2013 | Aoki ................. H01L 21/76251 257/774 |

* cited by examiner 510
500
400
410
419b
419a
418
420
422
430
470
370
330
322
320
300
310
520
414
412
416
Tr7
Tr6
Tr5
Tr4
Tr3
Tr2
Tr1
448
458
468
348
358
368
340
440
480
380
312
314
316
444
454
464
344
354
364
446
456
466
346
356
366
442
452
462
342
352
362

510
500
400
410
419b
419a
418
420
422
430
470
370
330
322
320
300
310
514
520 530
520
530
414
412
416
Tr7
Tr6
Tr5
Tr4
Tr3
Tr2
Tr1
448
458
468
446
456
466
444
454
464
442
452
462
440
480
380
348
358
368
346
356
366
344 354
364
342
352
362
340
316
312
314

10
570
560
550
540
510
500
400
410
419b
419a
418
420
422
430
470
370
330
322
320
300
310
542
530
520
316
312
314
340
348
358
368
448
458
468
Tr7
Tr6
Tr3
414
412
440
480
380
344
354
364
444
454
464
416
Tr5
446
456
466
Tr2
346
356
366
Tr4
Tr1
442
452
462
342
352
362

METHODS OF MANUFACTURING A SEMICONDUCTOR DEVICE

CROSS-REFERENCE TO RELATED APPLICATION

This application claims priority under 35 USC §119 to Korean Patent Application No. 10-2014-0170417, filed on Dec. 2, 2014 in the Korean Intellectual Property Office (KIPO), the contents of which are herein incorporated by reference in their entirety.

BACKGROUND

1. Field

Example embodiments relate to a method of manufacturing a semiconductor device. More particularly, example embodiments relate to a method of manufacturing a semiconductor device having a stacked structure.

2. Description of the Related Art

In order to increase the integration degree of a semiconductor device, a technique of stacking substrates is needed. When substrates each of which has an insulating interlayer containing a conductive pattern therein are bonded to each other to form a stacked structure, the conductive patterns and the insulating interlayers have to be bonded well so that a semiconductor device including the stacked structure may be manufactured to have a good electrical reliability.

SUMMARY

In some embodiments, a method of manufacturing a semiconductor device having a stacked structure and a good electrical reliability is provided.

According to some embodiments, there is provided a method of manufacturing a semiconductor device. In the method, a first conductive pattern structure is formed in a first insulating interlayer formed on a first substrate. A portion of the first conductive pattern structure protrudes upwardly from the first insulating interlayer. A first bonding insulation layer pattern is formed on the first insulating interlayer. The first bonding insulation layer pattern covers the portion of the first conductive pattern structure protruding from the first insulating interlayer. A first recess is formed on the first bonding insulation layer pattern. A first adhesive pattern containing a polymer is formed to fill the first recess. A second conductive pattern structure is formed in a second insulating interlayer formed on a second substrate. A portion of the second conductive pattern structure protrudes upwardly from the second insulating interlayer. A second bonding insulation layer pattern is formed on the second insulating interlayer. The second bonding insulation layer pattern covers the portion of the second conductive pattern structure protruding from the second insulating interlayer. A second recess is formed on the second bonding insulation layer pattern. A second adhesive pattern containing a polymer is formed to fill the second recess. The first and second adhesive patterns are heated to be melted. The first and second substrates are bonded with each other so that the first and second conductive pattern structures contact with each other.

In some embodiments, the first recess may be formed to be spaced apart form the first conductive pattern structure. The second recess may be formed to be spaced apart from the second conductive pattern structure.

In some embodiments, a plurality of first recesses may be formed to be spaced apart from the first conductive pattern structure by different distances from each other. And, a plurality of second recesses may be formed to be spaced apart from the second conductive pattern structure by different distances from each other.

In some embodiments, the plurality of first recesses may have different shapes from each other, in a plan view. And, the plurality of second recesses may have different shapes from each other, in a plan view.

In some embodiments, in a plan view, the first recess may surround the first conductive pattern structure, and the second recess may surround the second conductive pattern structure.

In some embodiments, a plurality of first recesses may be formed to partially surround the first conductive pattern structure. A plurality of second recesses may be formed to partially surround the second conductive pattern structure.

In some embodiments, a top surface of the first bonding insulation layer pattern may be substantially coplanar with a top surface of the first conductive pattern structure. A top surface of the second bonding insulation layer pattern may be substantially coplanar with a top surface of the second conductive pattern structure.

In some embodiments, a height of a top surface of the first bonding insulation layer pattern may gradually decrease toward the first conductive pattern structure at a portion thereof adjacent to the first conductive pattern structure, so that an upper sidewall of the first conductive pattern structure may be exposed. And a height of a top surface of the second bonding insulation layer pattern may gradually decrease toward the second conductive pattern structure at a portion thereof adjacent to the second conductive pattern structure, so that and upper sidewall of the second conductive pattern structure may be exposed.

In some embodiments, at least one of the first and second adhesive patterns may protrude upwardly from the first bonding insulation layer pattern and/or the second bonding insulation layer pattern, respectively. Accordingly, when the first and second substrates are bonded with each other, generating an empty space between the first and second substrates may be prevented.

In some embodiments, when the first adhesive pattern is formed, a first adhesive layer may be formed on the first bonding insulation layer pattern by performing a spin coating process to sufficiently fill the first recess. The first adhesive layer may be planarized until a top surface of the first bonding insulation layer pattern is exposed. When the second adhesive pattern is formed, a second adhesive layer may be formed on the second bonding insulation layer pattern by performing a spin coating process to sufficiently fill the second recess. The second adhesive layer may be planarized until a top surface of the second bonding insulation layer pattern is exposed.

In some embodiments, when the first adhesive pattern is formed, a first adhesive layer may be formed on the first bonding insulation layer pattern by performing a contact printing process to sufficiently fill the first recess. The first adhesive layer may be planarized until a top surface of the first bonding insulation layer pattern is exposed. When the second adhesive pattern is formed, a second adhesive layer may be formed on the second bonding insulation layer pattern by performing a contact printing process to sufficiently fill the second recess. The second adhesive layer may be planarized until a top surface of the second bonding insulation layer pattern is exposed.

In some embodiments, when the first conductive pattern structure is formed in the first insulating interlayer, a first opening through the first insulating interlayer is formed to be exposed a top surface of the first substrate. A first barrier layer may be formed on the exposed top surface of the first substrate, a sidewall of the first opening, and the first insulating interlayer. A first conductive layer may be formed on the first barrier layer to fill a remaining portion of the first opening. The first conductive layer and the first barrier layer may be planarized by performing a CMP process until a top surface of the first insulating interlayer is exposed to form a first conductive pattern and a first barrier layer pattern, respectively. When the second conductive pattern structure is formed in the second insulating interlayer, a second opening penetrating the second insulating interlayer may be formed to be exposed a top surface of the second substrate. A second barrier layer may be formed on the exposed top surface of the second substrate, a sidewall of the second opening, and the second insulating interlayer. A second conductive layer may be formed on the second barrier layer to fill a remaining portion of the second opening. The second conductive layer and the second barrier layer may be planarized by performing a CMP process until the top surface of the second insulating interlayer is exposed to form a second conductive pattern and a second barrier layer pattern, respectively.

In some embodiments, when the first bonding insulation layer pattern partially surrounding the protruding portion of the first conductive pattern structure is formed on the first insulating interlayer, a first bonding insulation layer may be formed on the first conductive pattern structure and the first insulating interlayer. The first bonding insulation layer may be planarized by performing a CMP process until the top surface of the first conductive pattern structure is exposed. And, when the second bonding insulation layer pattern is formed on the second insulating interlayer, a second bonding insulation layer may be formed on the second conductive pattern structure and the second insulating interlayer. The second bonding insulation layer may be planarized by performing a CMP process until the top surface of the second conductive pattern structure is exposed.

In some embodiments, there is provided a method of manufacturing a semiconductor device. In the method, a first conductive pattern structure is formed in a first insulating interlayer formed on a first substrate. A portion of the first conductive pattern structure protrudes upwardly from the first insulating interlayer. A first bonding insulation layer pattern is formed on the first insulating interlayer. The first bonding insulation layer pattern partially covers the portion of the first conductive pattern structure protruding from the first insulating interlayer. A first adhesive layer containing a polymer is formed on the first insulating interlayer and the first conductive pattern structure. The first adhesive layer is planarized until a top surface of the first conductive pattern structure is exposed to form a first adhesive pattern. A second conductive pattern structure is formed in a second insulating interlayer formed on a second substrate. A portion of the second conductive pattern structure protrudes upwardly from the second insulating interlayer. A second bonding insulation layer pattern is formed on the second insulating interlayer. The second bonding insulation layer pattern partially covers the portion of the second conductive pattern structure protruding from the second insulating interlayer. A second adhesive layer containing a polymer is formed on the second insulating interlayer and the second conductive pattern structure. The second adhesive layer is planarized until a top surface of the second conductive pattern structure is exposed to form a second adhesive pattern. The first and second adhesive patterns are heated to be melted. The first and second substrates are bonded with each other so that the first and second conductive pattern structures contact with each other.

In some embodiments, when the first bonding insulation layer pattern is formed on the first insulating interlayer, a first bonding insulation layer may be formed on the first conductive pattern structure and the first insulating interlayer. The first bonding insulation layer may be planarized to form the first bonding insulation layer pattern by performing a chemical mechanical polishing (CMP) process until the top surface of the first conductive pattern structure is exposed. A height of the top surface of the first bonding insulation layer pattern may gradually decrease toward the first conductive pattern structure at a portion thereof adjacent to the first conductive pattern structure so that an upper sidewall of the protruding portion of the first conductive pattern structure may be exposed. And, when the second bonding insulation layer pattern is formed on the second insulating interlayer, a second bonding insulation layer may be formed on the second conductive pattern structure and the second insulating interlayer. The second bonding insulation layer may be planarized to form the second bonding insulation layer pattern by performing a CMP process until the top surface of the second conductive pattern structure is exposed. A height of the top surface of the second bonding insulation layer pattern may gradually decrease toward the second conductive pattern structure at a portion thereof adjacent to the second conductive pattern structure so that an upper sidewall of the protruding portion of the second conductive pattern structure may be exposed.

In some embodiments, the top surface of the first bonding insulation layer pattern may be substantially coplanar with the top surface of the first conductive pattern structure, except for the portion thereof adjacent to the first conductive pattern structure, which is lower than the top surface of the first conductive pattern structure. And the top surface of the second bonding insulation layer pattern may be substantially coplanar with the top surface of the second conductive pattern structure, except for the portion thereof adjacent to the second conductive pattern structure, which is lower than the top surface of the second conductive pattern structure.

In some embodiments, when the first conductive pattern structure is formed in the first insulating interlayer, a first opening through the first insulating interlayer may be formed to be exposed a top surface of the first substrate. A first barrier layer may be formed on the exposed top surface of the first substrate, a sidewall of the first opening, and the first insulating interlayer. A first conductive layer may be formed on the first barrier layer to fill a remaining portion of the first opening. The first conductive layer and the first barrier layer may be planarized by performing a CMP process until a top surface of the first insulating interlayer is exposed to form a first conductive pattern and a first barrier layer pattern, respectively. And when the second conductive pattern structure is formed in the second insulating interlayer, a second opening through the second insulating interlayer may be formed to be exposed a top surface of the second substrate. A second barrier layer may be formed on the exposed top surface of the second substrate, a side wall of the second opening, and the second insulating interlayer. A second conductive layer may be formed on the second barrier layer to fill a remaining portion of the second opening. The second conductive layer and the second barrier layer may be planarized by performing a CMP process until the top surface of the second insulating interlayer is exposed to form a second conductive pattern and a second barrier layer pattern, respectively.

In some embodiments, a top surface of the first barrier layer pattern may be lower than a top surface of the first conductive pattern, and a top surface of the second barrier layer pattern may be lower than a top surface of the second conductive pattern.

In some embodiments, the first adhesive pattern may contact a sidewall of the first conductive pattern and vertically overlap the first barrier layer pattern. The second adhesive pattern may contact a sidewall of the second conductive pattern and vertically overlap the second barrier layer pattern.

In some embodiments, the first adhesive pattern may be formed to contact a sidewall of the first barrier layer pattern, and the second adhesive pattern may be formed to contact a sidewall of the second barrier layer pattern.

In another embodiment, a semiconductor device is disclosed. The semiconductor device includes: a first substrate including a first conductive pattern structure formed in a first insulating interlayer formed on the first substrate, a portion of the first conductive pattern structure protruding upwardly from the first insulating interlayer, with a first bonding insulation layer pattern formed on the first insulating interlayer, the first bonding insulation layer pattern covering the portion of the first conductive pattern structure protruding from the first insulating interlayer, with a first recess formed on the first bonding insulation layer pattern, the first recess being filled with a first adhesive pattern containing a polymer; a second substrate including a second conductive pattern structure in a second insulating interlayer formed on the second substrate, a portion of the second conductive pattern structure protruding upwardly from the second insulating interlayer, with a second bonding insulation layer pattern formed on the second insulating interlayer, the second bonding insulation layer pattern covering the portion of the second conductive pattern structure protruding from the second insulating interlayer, with a second recess formed on the second bonding insulation layer pattern, the second recess being filled with a second adhesive pattern containing a polymer; wherein adhesive in the first adhesive pattern and adhesive in the second adhesive pattern have been melted together; and caused bonding of the first substrate and the second substrate so that the first and second conductive pattern structures are in contact with each other.

In some embodiments, semiconductor device is configured as a photosensor. The photosensor may further include an anti-reflective layer disposed over the photosensor. The photosensor may further include a waveguide layer disposed over the photosensor, and the waveguide layer may be configured to concentrate incident light.

BRIEF DESCRIPTION OF THE DRAWINGS

The introductory and non-limiting embodiments disclosed will be more clearly understood from the following detailed description taken in conjunction with the accompanying drawings.

FIGS. 1 to 8 and FIGS. 10 to 12 are cross-sectional views illustrating stages of a method of manufacturing a semiconductor device in accordance with the teachings contained in this disclosure;

FIGS. 47 to 58 are cross-sectional views illustrating stages of a method of manufacturing a semiconductor device in accordance with the teachings contained in this disclosure.

DESCRIPTION OF EMBODIMENTS

Figure 1:
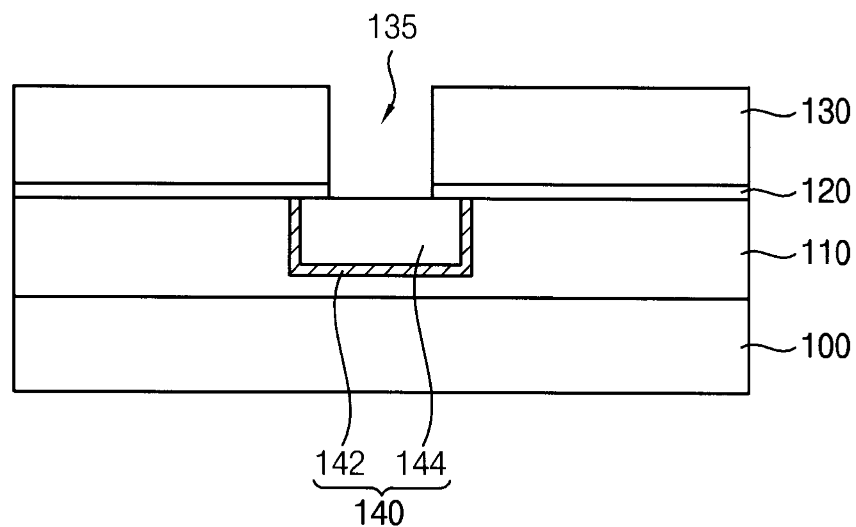
FIGS. 1 to 58 represent non-limiting, illustrative embodiments as described herein.

Various illustrative embodiments will be described more fully hereinafter with reference to the accompanying drawings, in which some example embodiments are shown. The technology disclosed herein may, however, be embodied in many different forms and should not be construed as limited to the illustrative embodiments set forth herein. Rather, these illustrative embodiments are provided so that this description will be thorough and complete, and will fully convey the scope of the technology disclosed herein to those skilled in the art. In the drawings, the sizes and relative sizes of layers and regions may be exaggerated for clarity. Where the term "exemplary" is used to describe an embodiment, this is to be construed as merely one example of many possible embodiments. That is, the term "exemplary" is not to be construed as a superlative. In some instances, the term "illustrative" is similarly used.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed herein could be termed a second element, component, region, layer or section without departing from the teachings of the present inventive concept.

Spatially relative terms, terms of orientation and the like, such as "beneath," "below," "lower," "above," "upper" and the like, may be used herein for ease of description to describe one element in relation to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Illustrative embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle may generally have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Where any dispute of terminology and definitions is concerned, interpretations should be considered as is most favorable to the technology disclosed herein.

Figure 7A:
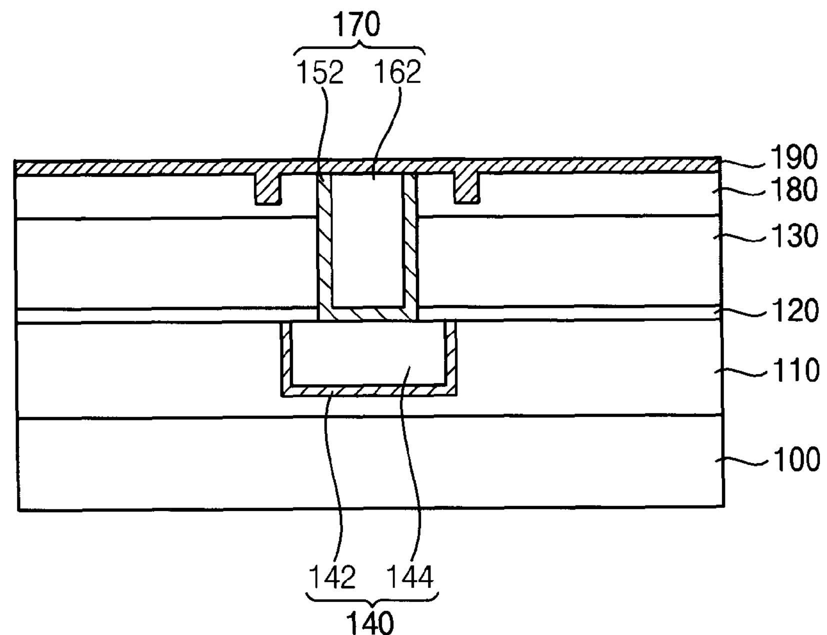
Figure 7B:
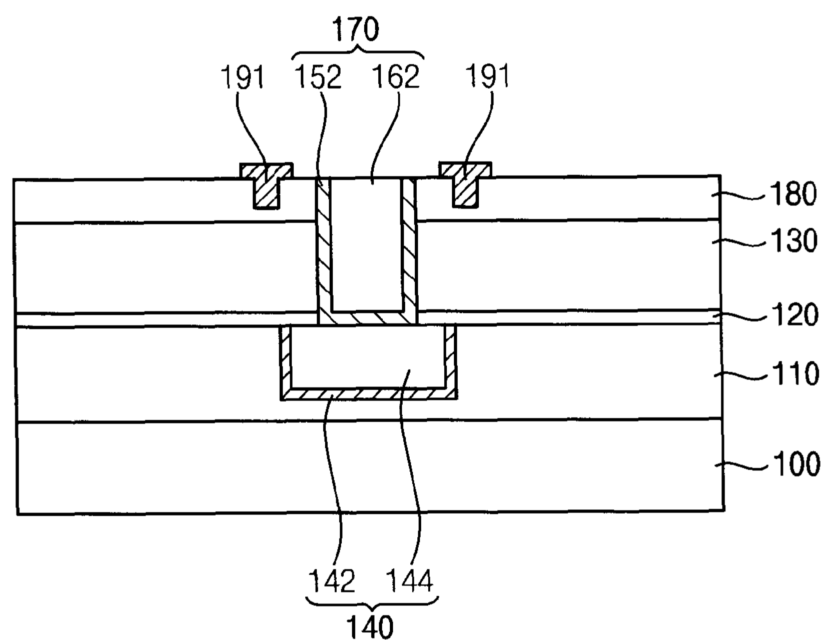
Figure 8:
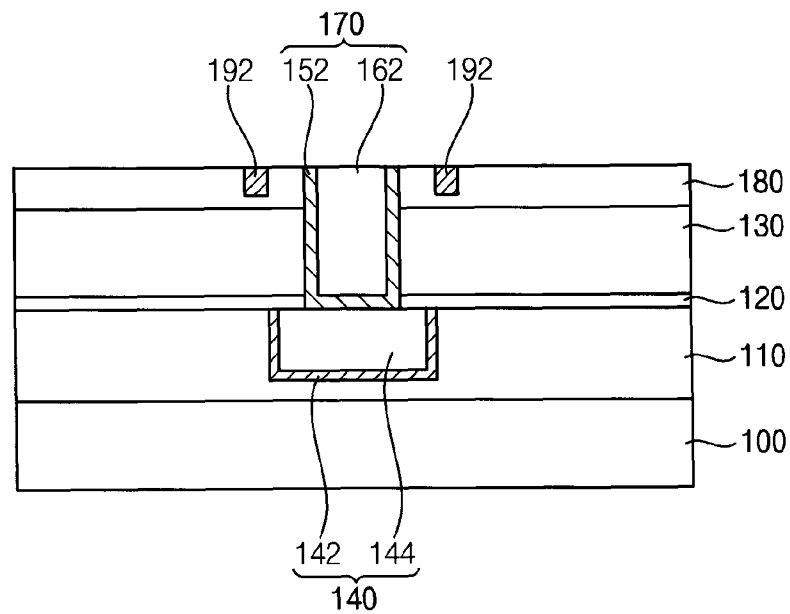
Figure 10:
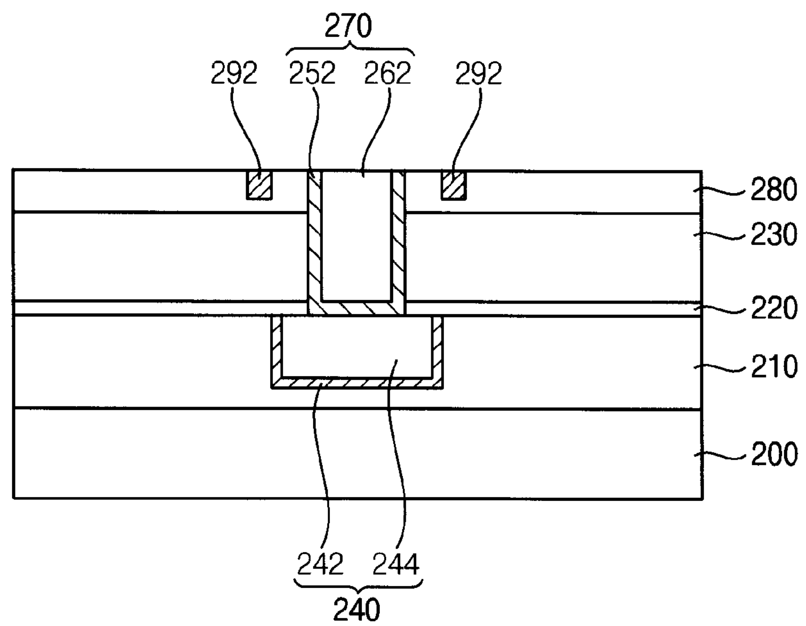
Figure 11:
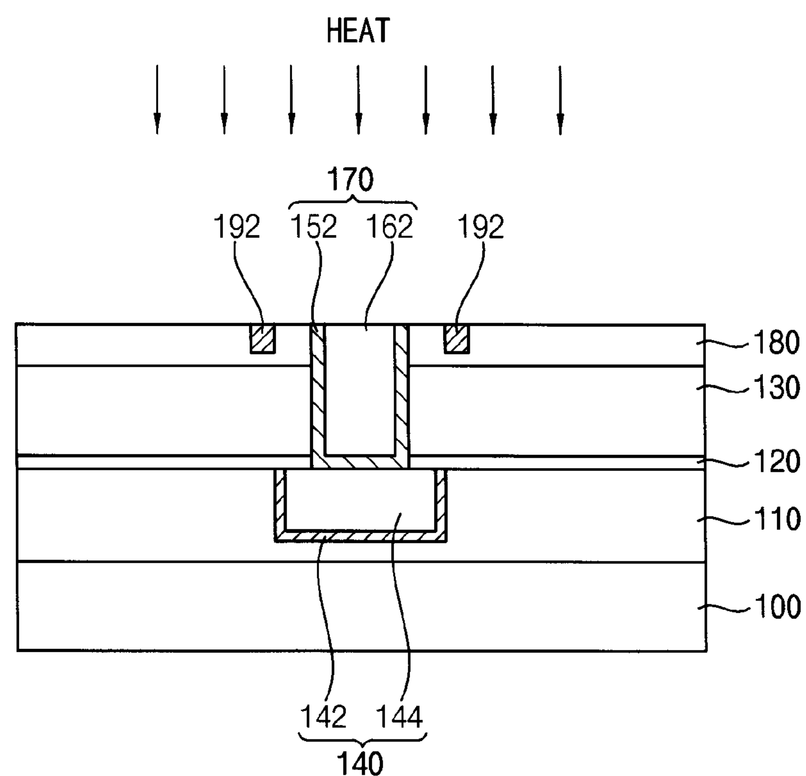
Figure 12:
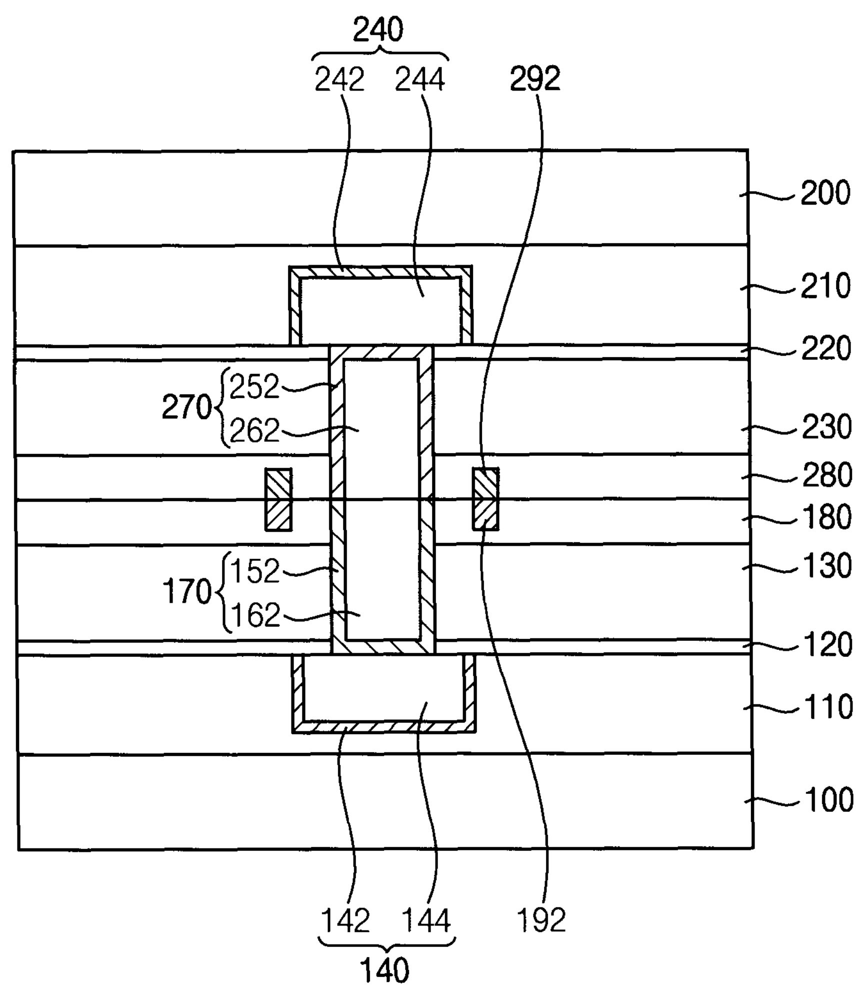
Figure 13:
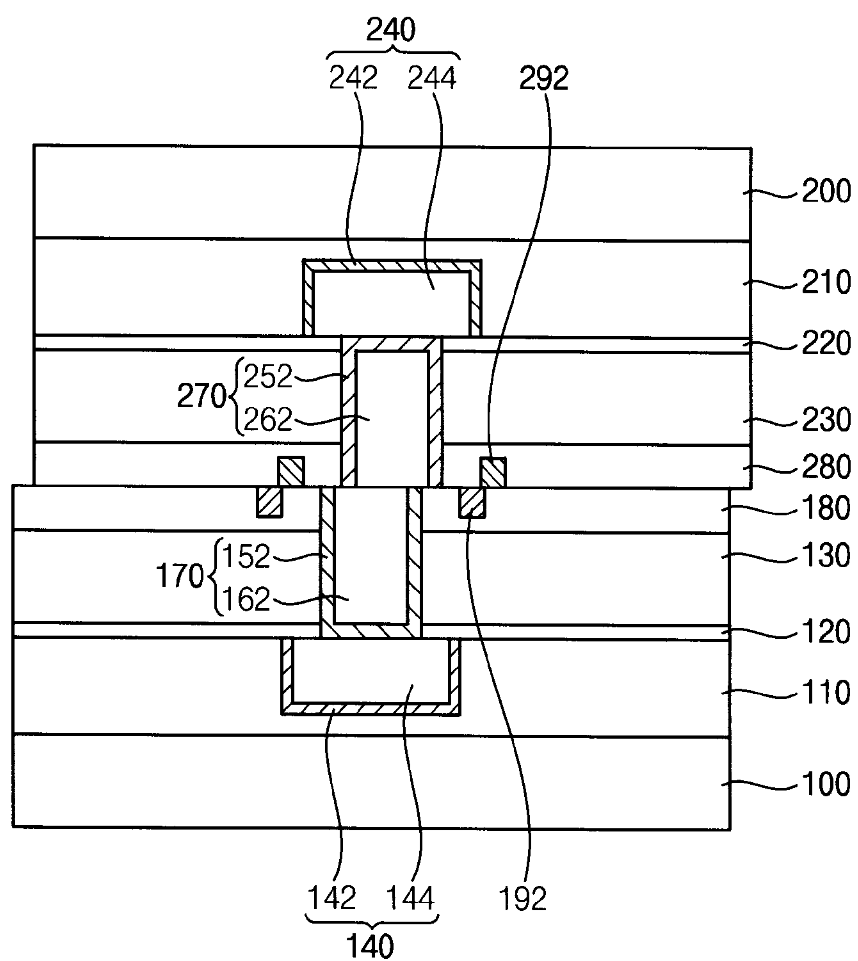
FIG. 13 is a cross-sectional view illustrating a semiconductor device in which first and second conductive pattern structures of FIG. 12 are bonded to be misaligned with each other.

FIGS. 1 to 8 and FIGS. 10 to 12 are cross-sectional views illustrating stages of a method of manufacturing a semiconductor device in accordance with the teachings herein. FIGS. 9A to 9G are plan views illustrating the semiconductor device shown in FIG. 8. FIG. 8 is a cross-sectional view taken along a line A-A' appearing in each of FIGS. 9A to 9G. FIG. 13 is a cross-sectional view illustrating a semiconductor device in which first and second conductive pattern structures of FIG. 12 are bonded to be misaligned with each other.

Referring to FIG. 1, a third insulating interlayer 110 containing a third conductive pattern structure 140 therein may be formed on a first substrate 100, a first etch stop layer 120 and a first insulating interlayer 130 may be sequentially formed on the third insulating interlayer 110 and the third conductive pattern structure 140. A first opening 135 may be formed through the first insulating interlayer 130 and the first etch stop layer 120 to expose a top surface of the third conductive pattern structure 140.

The first substrate 100 may include a semiconductor material, e.g., silicon, germanium, silicon-germanium, or the like. In some embodiments, the first substrate 100 may include a compound semiconductor, e.g., silicon carbide, gallium arsenide, gallium phosphate, indium phosphate, indium arsenide, indium antimonide, or the like, or glass.

The third insulating interlayer 110 may be formed of an oxide, e.g., silicon oxide, a low-k dielectric material.

In some embodiments, a recess (not shown) may be formed on the third insulating interlayer 110, a third barrier layer may be formed on an inner wall of the recess and the third insulating interlayer 110, a third conductive layer may be formed on the third barrier layer to sufficiently fill the recess, and the third conductive layer and the third barrier layer may be planarized until a top surface of the third insulating interlayer 110 is exposed. Thus, the third conductive pattern structure 140 including a third barrier layer pattern 142 on the inner wall of the recess, and a third conductive pattern 144 filling a remaining portion of the recess on the third barrier layer pattern 142 may be formed. A bottom and a sidewall of the third conductive pattern 144 may be covered by the third barrier layer pattern 142.

The third conductive layer may be formed of a metal, e.g., copper, aluminum, tungsten, nickel, or the like. The third barrier layer may be formed of a metal, e.g., titanium, tantalum, tungsten, ruthenium, cobalt, nickel, or the like, a metal nitride, e.g., titanium nitride, tantalum nitride, tungsten nitride, titanium zirconium nitride, titanium silicon nitride, tantalum aluminum nitride, tantalum silicon nitride, or the like, or a metal alloy, e.g., titanium tungsten. The third conductive layer may be formed by an electroplating process or an electroless plating process. Other techniques for forming conductive layers may be used.

The third conductive pattern 144 and the third barrier layer pattern 142 may be formed to have a single layer structure or a multi-layered structure.

The first etch stop layer 120 may be formed of a nitride, e.g., silicon nitride, silicon carbonitride, silicon oxynitride, or the like, or a carbide, e.g., silicon carbide. In some embodiments, the first etch stop layer 120 may not be formed.

The first insulating interlayer 130 may be formed of an oxide, e.g., silicon oxide, or a low-k dielectric material. In some embodiments, the first insulating interlayer 130 may be formed of a material substantially the same as that of the third insulating interlayer 110.

The first opening 135 may be formed by etching the third insulating interlayer 110 and the first etch stop layer 120 to expose at least a top surface of the third conductive pattern 144 of the third conductive pattern structure 140.

Figure 2:
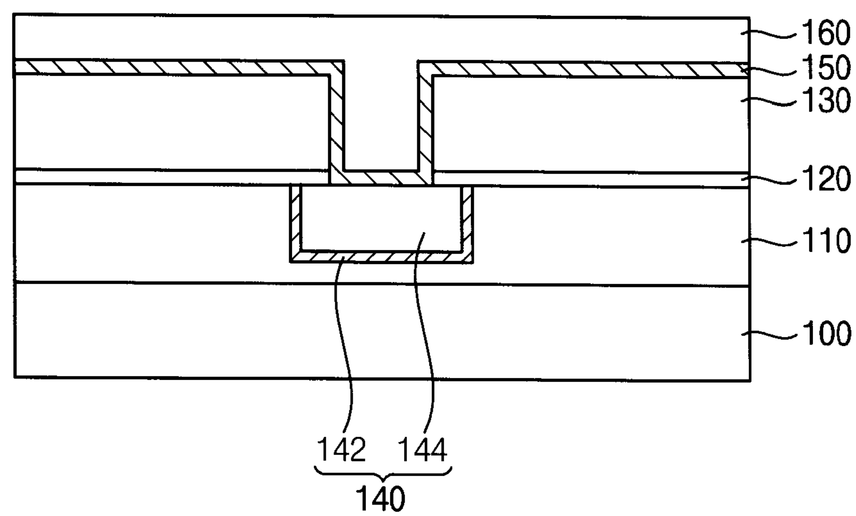

Referring to FIG. 2, a first barrier layer 150 may be formed on the exposed top surface of the third conductive pattern structure 140, a sidewall of the first opening 135 and the first insulating interlayer 130, and a first conductive layer 160 may be formed on the first barrier layer 150 to sufficiently fill a remaining portion of the first opening 135.

The first barrier layer 150 may be formed of a metal, e.g., titanium, tantalum, tungsten, ruthenium, cobalt, nickel, or the like, a metal nitride, e.g., titanium nitride, tantalum nitride, tungsten nitride, titanium zirconium nitride, titanium silicon nitride, tantalum aluminum nitride, tantalum silicon nitride, or the like, or a metal alloy, e.g., titanium tungsten. In some embodiments, the first barrier layer 150 may be formed of a material substantially the same as that of the third barrier layer pattern 142.

In some embodiments, the first conductive layer 160 may be formed of a material substantially the same as that of the third conductive pattern 144. The first conductive layer 160 may be formed of a metal, e.g., copper, aluminum, tungsten, nickel, or the like. The first conductive layer 160 may be formed by an electroplating process or an electroless plating process.

Figure 3:
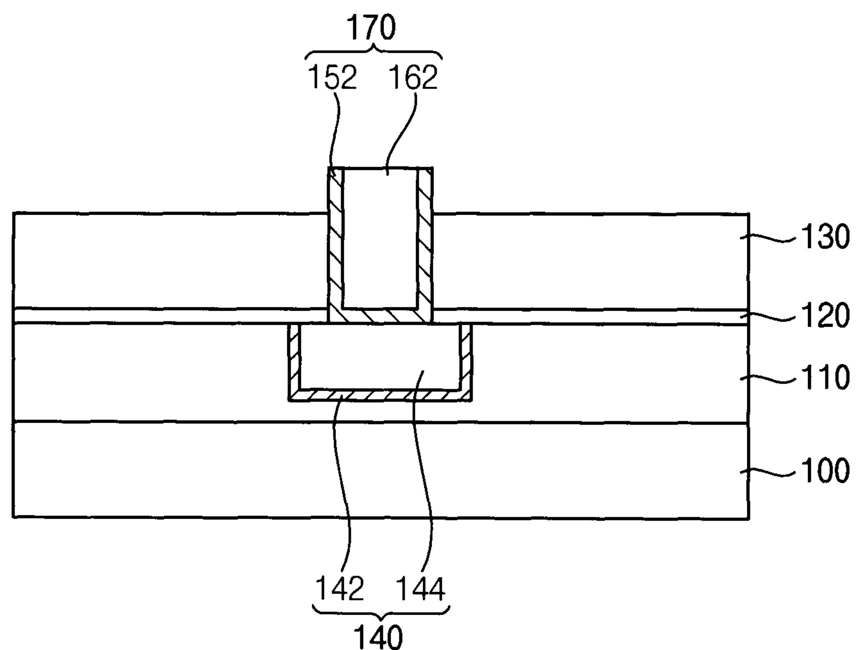

Referring to also FIG. 3, the first conductive layer 160 and the first barrier layer 150 may be planarized until a top surface of the first insulating interlayer 130 is exposed to form a first conductive pattern 162 and the first barrier layer pattern 152, respectively. The first conductive pattern 162 and the first barrier layer pattern 152 may form a first conductive pattern structure 170.

In some embodiments, the planarization process may include a chemical mechanical polishing (CMP) process. In the CMP process, the first conductive pattern structure 170 may protrude upwardly from the first insulating interlayer 130 depending on the degree of polishing.

Figure 4:
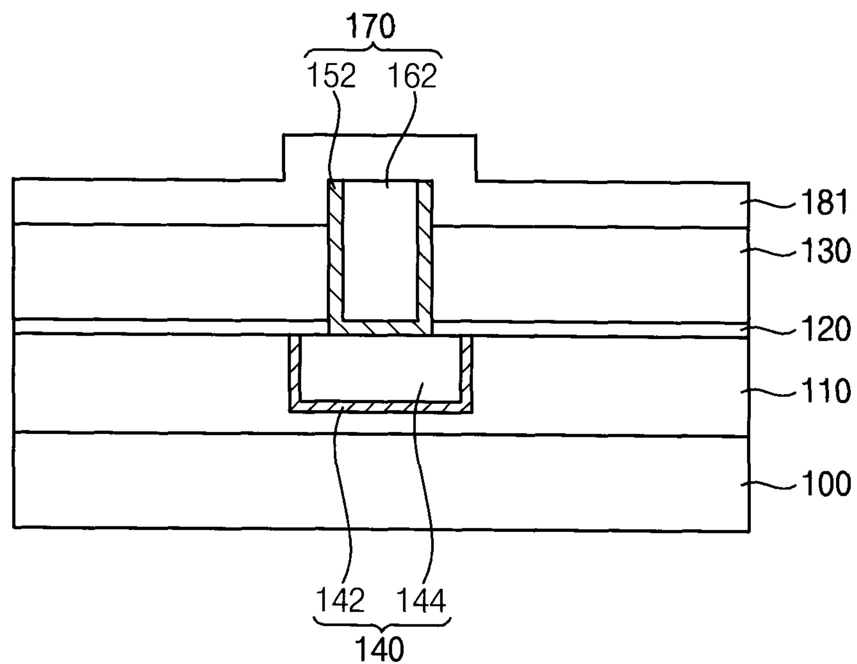

Referring to FIG. 4, a first bonding insulation layer 181 may be formed on the first conductive pattern structure 170 and the first insulating interlayer 130.

The first bonding insulation layer 181 may be formed of a nitride, e.g., silicon nitride, silicon carbonitride, silicon oxynitride, or the like, or a carbide, e.g., silicon carbide, or the like, and may be formed by a chemical vapor deposition (CVD) process, an atomic layer deposition (ALD) process, or a physical vapor deposition (PVD) process.

Figure 5:
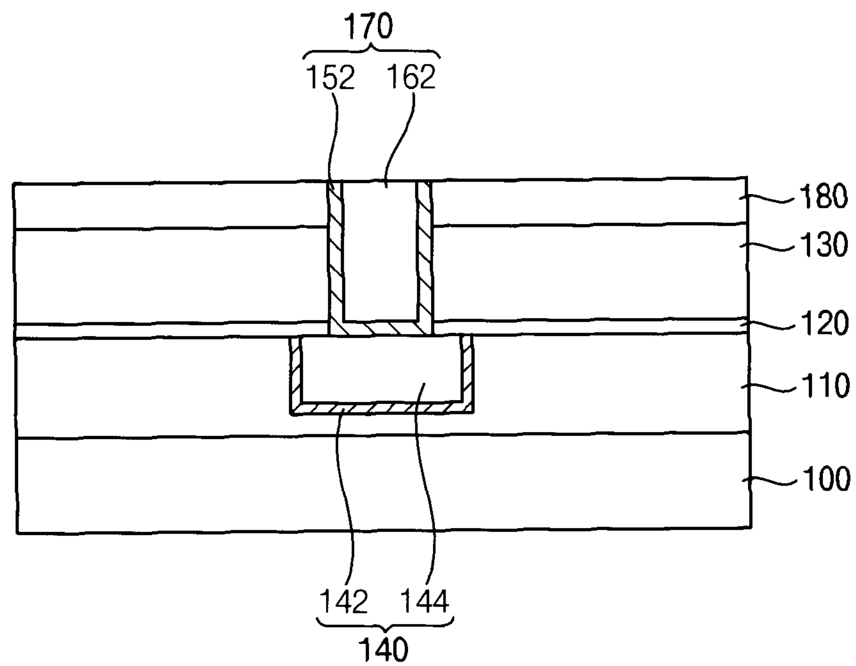

Referring also to FIG. 5, the first bonding insulation layer 181 may be planarized until a top surface of the first conductive pattern structure 170 is exposed to form a first bonding insulation layer pattern 180.

In some embodiments, the planarization process may include a CMP process. By performing the CMP process, a top surface of the first bonding insulation layer pattern 180 may be formed to be substantially coplanar with the top surface of the first conductive pattern structure 170.

Figure 6:
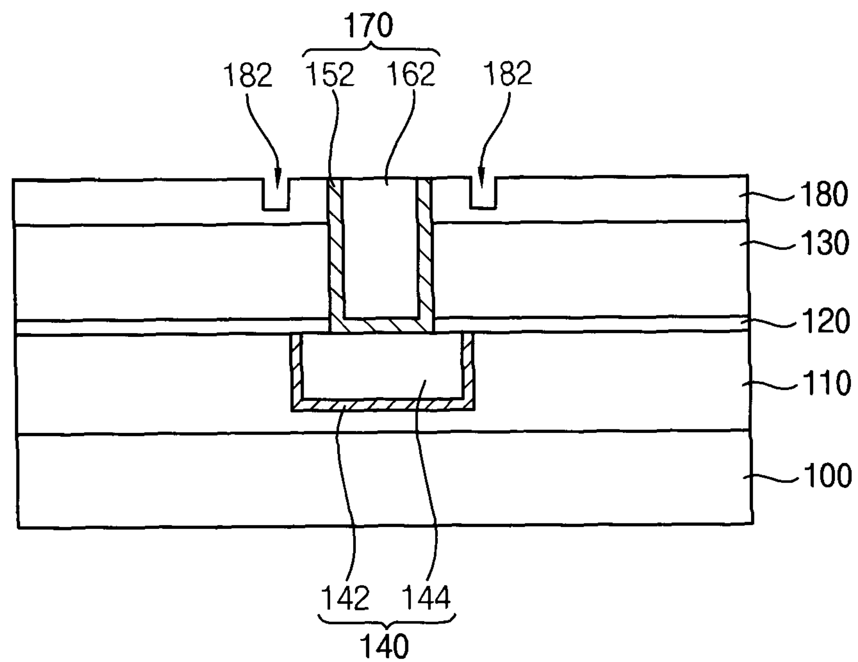

Referring to FIG. 6, the first bonding insulation layer pattern 180 may be partially etched to form a first recess 182.

In some embodiments, the first recess 182 may be formed to be spaced apart from the first conductive pattern structure 170, and to surround at least a portion of the first conductive pattern structure 170 in a plan view.

The first recess 182 may be formed not to fully penetrate the first bonding insulation layer pattern 180.

Referring to FIGS. 7A and 7B, first adhesive layers 190 and 191 may be formed on the first bonding insulation layer pattern 180 to sufficiently fill the first recess 182.

The first adhesive layer 190 may be formed to include a polymer, e.g., a thermoplastic resin such as polymethylmethacrylate (PMMA). The polymer may have a given uniformity and viscosity, so that each of the first adhesive layers 190 and 191 may have a substantially uniform top surface, and may completely fill the first recess 182. Additionally, the thermoplastic resin may be heated to be melted, and cooled to be hardened again.

In some embodiments, as illustrated in detail in FIG. 7A, the first adhesive layer 190 may be formed on the first bonding insulation layer pattern 180 to sufficiently fill the first recess 182. The first adhesive layer 190 may be formed by a spin coating process. In these embodiments, the first adhesive layer 190 generally covers the first bonding insulation layer pattern 180 as well as the first recess 182.

For example, when the spin coating process is performed, the polymer in a liquid state may be deposited on the first conductive pattern structure 170 and the first bonding insulation layer pattern 180. By spinning the first substrate 100 at a high speed, the polymer may form a thin film on the first conductive pattern structure 170 and the first bonding insulation layer pattern 180, which may be the first adhesive layer 190.

In some other embodiments, as illustrated in detail in FIG. 7B, the first adhesive layer 191 may be formed on the first bonding insulation layer pattern 180 to sufficiently fill the first recess 182, while generally leaving the first bonding insulation layer pattern 180 exposed. The first adhesive layer 191 may be formed by a contact printing process.

When the contact printing process is performed, the polymer may be filled in a water tank (not shown), and a silicon pad (not shown) may be soaked in the water tank so that the polymer may be coated onto the silicon pad. Then, the silicon pad coated with the polymer may contact the first recess 182 to form the first adhesive layer 191 on the first bonding insulation layer pattern 180.

Referring to FIG. 8, the first adhesive layers 190 and 191 may be planarized until the top surface of the first bonding insulation layer pattern 180 is exposed to form a first adhesive pattern 192 surrounding the first conductive pattern structure 170. For example, the planarization process may include a CMP process.

Figure 9A:
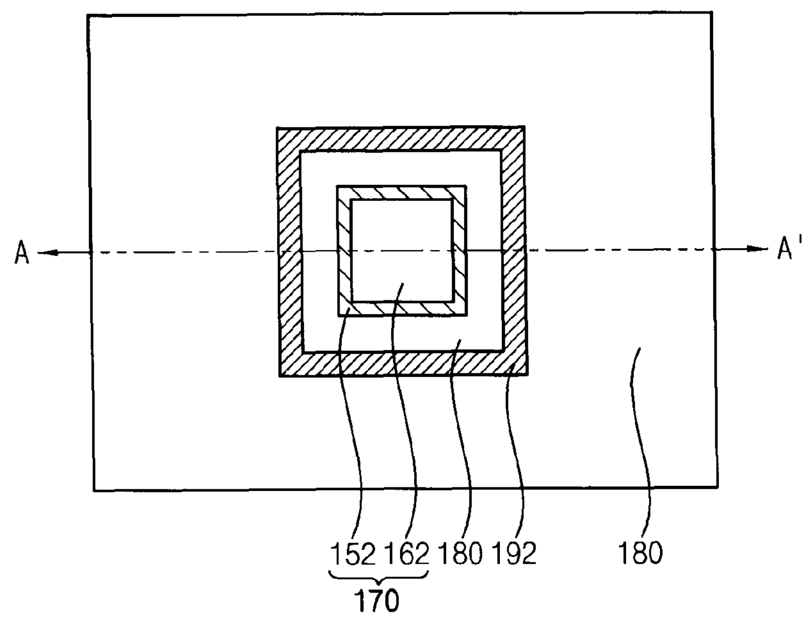
FIGS. 9A to 9G are plan views illustrating the semiconductor device in FIG. 8.
Figure 9B:
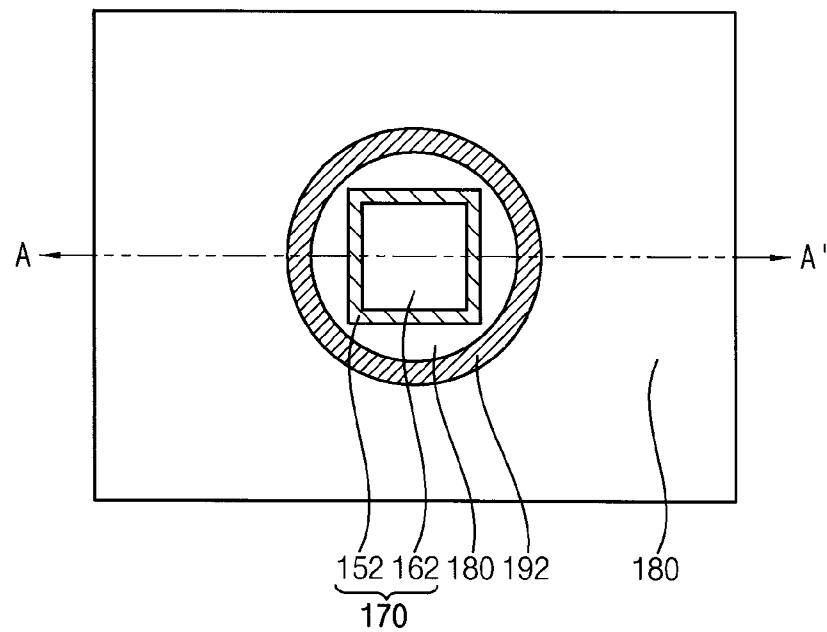

Referring to FIGS. 9A and 9B, in illustrative embodiments, the first adhesive pattern 192 may be formed to surround the first conductive pattern structure 170 in a plan view.

For example, in a plan view, the first adhesive pattern 192 may be formed to be spaced apart from the first conductive pattern structure 170, and to have a shape (for example, a shape of a rectangle (refer to FIG. 9A), a circle (refer to FIG. 9B), an oval (not shown), or the like).

Referring to FIGS. 9C to 9G, in illustrative embodiments, in a plan view, a plurality of first adhesive patterns 192 may be formed to partially surround the first conductive pattern structure 170.

Figure 9C:
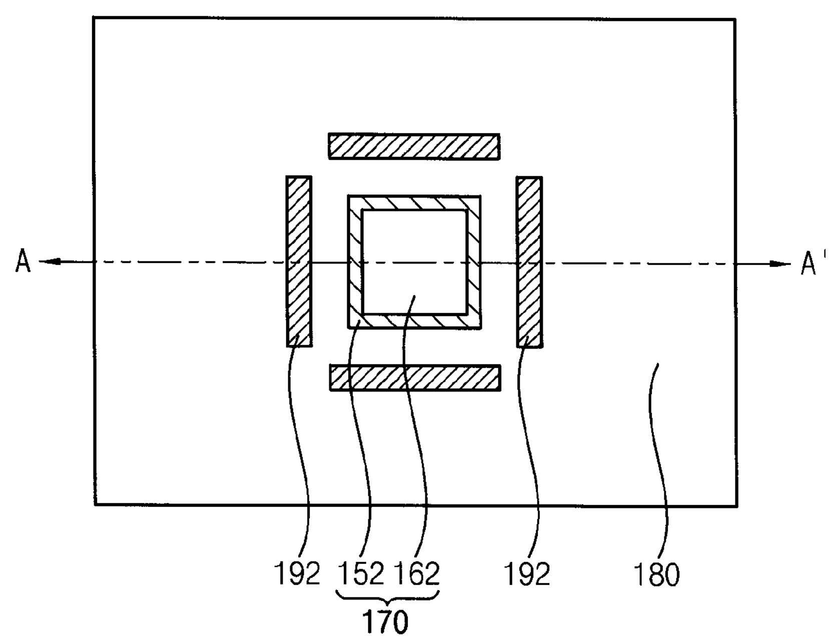
Figure 9D:
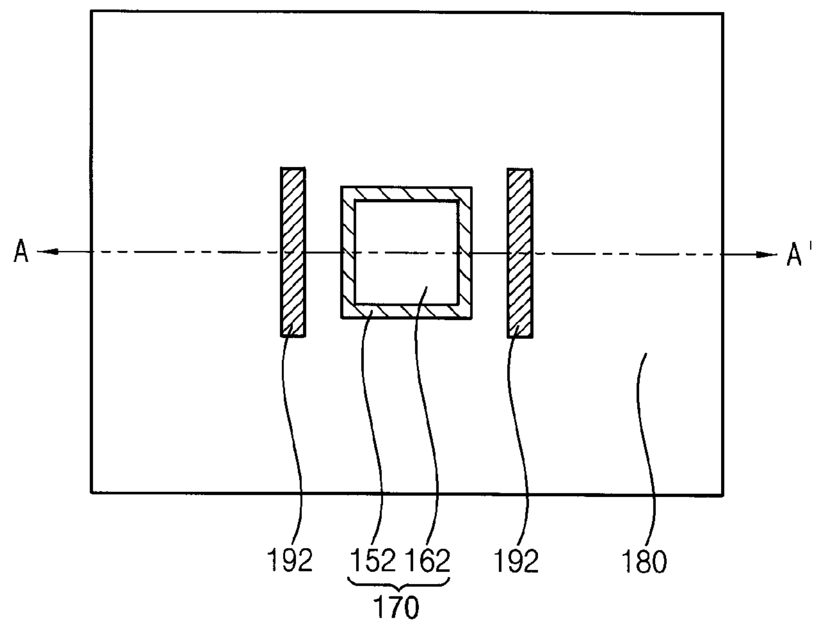
Figure 9E:
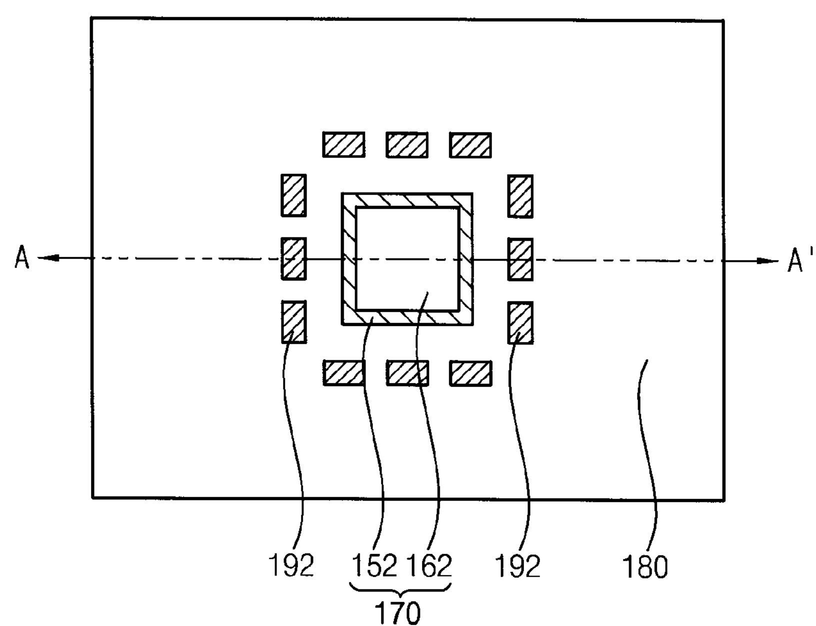
Figure 9F:
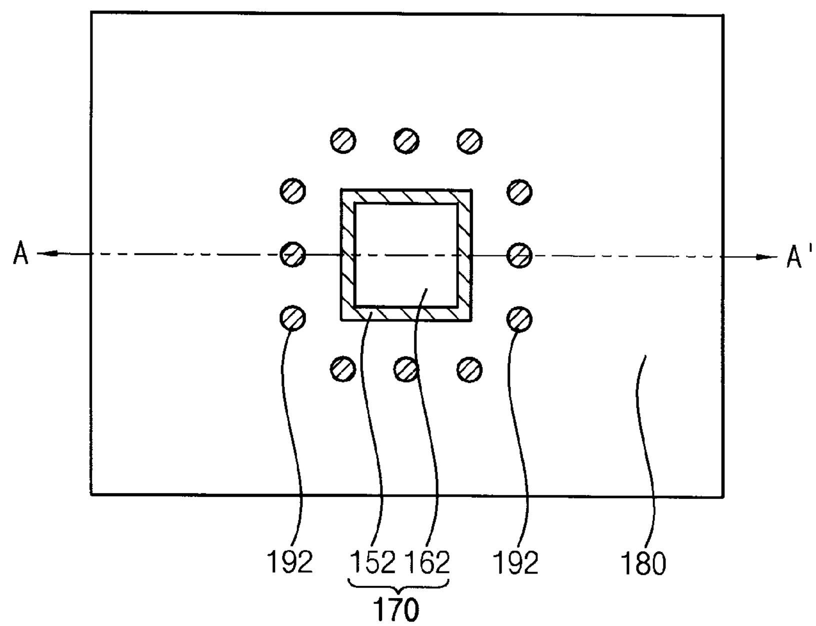
Figure 9G:
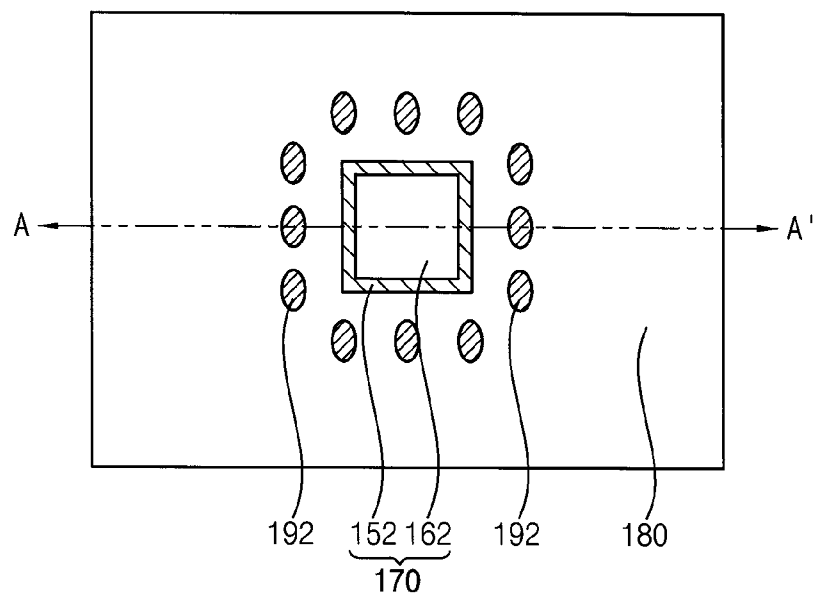

For example, in a plan view, a plurality of first adhesive patterns 192 each having a rectangular shape may be formed to be spaced apart from the first conductive pattern structure 170 and surround a portion of the first conductive pattern structure 170 (refer to FIGS. 9C and 9E). In some embodiments, the first adhesive patterns 192 may not completely surround the first conductive pattern structure 170 (refer to FIG. 9D), and each of the first adhesive patterns 192 may have various shapes, e.g., a circular shape (refer to FIG. 9F), an oval shape (refer to FIG. 9G), or the like. Additionally, although not shown, the plurality of first adhesive patterns 192 may be arranged in various shapes in a plan view, e.g., a rectangular shape, a circular shape, an oval shape, or the like around the first conductive pattern structure 170.

Referring to FIG. 10, processes substantially the same as or similar to those illustrated with reference to FIGS. 1 to 8 may be performed, so that fourth and second insulating interlayers 210 and 230, respectively, may be sequentially formed on a second substrate 200, and fourth and second conductive pattern structures 240 and 270, respectively, may be formed in the fourth and second insulating interlayers 210 and 230, respectively.

The second substrate 200 may include a material substantially the same as that of the first substrate 100. Each of the second and fourth insulating interlayers 230 and 210 may be formed of an oxide, e.g., silicon oxide, or a low-k dielectric material. In some embodiments, the second and fourth insulating interlayers 230 and 210 may be formed of materials substantially the same as those of the first and third insulating interlayers 130 and 110, respectively.

In some embodiments, a second etch stop layer 220 may be further formed between the second insulating interlayer 230 and the fourth insulating interlayer 210. The second etch stop layer 220 may include a nitride, e.g., silicon nitride, silicon carbonitride, silicon oxynitride, or the like, or a carbide, e.g., silicon carbide.

The second conductive pattern structure 270 may be formed to include a second conductive pattern 262 and a second barrier layer pattern 252. A sidewall and a bottom of the second conductive pattern 262 may be covered by the second barrier layer pattern 252. The fourth conductive pattern structure 240 may be formed to include a fourth conductive pattern 244 and a fourth barrier layer pattern 242. A sidewall and a bottom of the fourth conductive pattern 244 may be covered by the fourth barrier layer pattern 242.

The second and fourth conductive patterns 262 and 244 may be formed of a metal, e.g., copper, aluminum, tungsten, nickel, or the like, a metal nitride, and/or a metal silicide. The second and fourth barrier layer patterns 252 and 242 may be formed of a metal, e.g., titanium, tantalum, tungsten, ruthenium, cobalt, nickel, or the like, a metal nitride, e.g., titanium nitride, tantalum nitride, tungsten nitride, titanium zirconium nitride, titanium silicon nitride, tantalum aluminum nitride, tantalum silicon nitride, or the like, or a metal alloy, e.g., titanium tungsten.

The second bonding insulation layer structure 280 may be formed of a nitride, e.g., silicon nitride, silicon carbonitride, silicon oxynitride, or the like, or a carbide, e.g., silicon carbide by performing a planarization process, e.g., a CMP process. In some embodiments, a top surface of the second bonding insulation layer pattern 280 may be formed to be substantially coplanar with a top surface of the second conductive pattern structure 270.

A second adhesive layer may be formed on the second bonding insulation layer pattern 280 by a spin coating process or a contact printing process. The second adhesive layer may be planarized until a top surface of the second bonding insulation layer pattern 280 is exposed to form a second adhesive pattern 292. For example, the planarization process may include a CMP process.

In some embodiments, in a plan view, the second adhesive pattern 292 may be formed to surround the second conductive pattern structure 270. In some embodiments, a plurality of second adhesive patterns 292 may be formed to surround the second conductive pattern structure 270, or the second adhesive pattern 292 may not completely surround the second conductive pattern structure 270. Additionally, the second adhesive pattern 292 may have various shapes, e.g., a rectangular shape, a circular shape, an oval shape, or the like, and a plurality of second adhesive patterns 292 may be arranged in various shapes, e.g., a rectangular shape, a circular shape, an oval shape, or the like, around the second conductive pattern structure 270.

Referring to FIG. 11, the first and second adhesive patterns 192 and 292 may be heated to be melted. The first and second conductive patterns 162 and 262 may include a metal, e.g., copper, and thus may have a relatively high melting point. In contrast, the first and second adhesive patterns 192 and 292 may include a polymer, and thus may have a relatively low melting point. For example, the PMMA may have a melting point of about 160° C. Accordingly, the first and second substrates 100 and 200 may be bonded each other when using the first and second adhesive patterns 192 and 292 at a temperature lower than a temperature when not using the adhesive patterns. In some embodiments, adhesive in the first and second adhesive patterns 192 and 292 may be melted by chemical processes.

Referring to FIG. 12, the first and second substrates 100 and 200 may be bonded with each other so that the first and second conductive pattern structures 170 and 270 may contact with each other.

In some embodiments, after overturning the second substrate 200, the first and second substrates 100 and 200 may be bonded with each other. Hereinafter, a top surface of the second substrate 200 in FIG. 10 may be referred to as a bottom surface in FIG. 12, and a bottom surface of the second substrate 200 in FIG. 10 may be referred to as a top surface in FIG. 12.

When the first and second substrates 100 and 200 are bonded with each other so that the first and second conductive pattern structures 170 and 270 may be aligned with each other, the first and second conductive patterns 162 and 262 may contact with each other, and the first and second bonding insulation layer patterns 180 and 280 may also contact with each other. Furthermore, the first and second adhesive patterns 192 and 292 may also contact with each other. In this case, the first and second adhesive patterns 192 and 292 may be melted by performing a process substantially the same as or similar to that illustrated with reference to FIG. 11. Then, the first and second adhesive patterns 192 and 292 may be hardened with contacting each other, so that the first and second substrates 100 and 200 may be bonded with each other more strongly. Accordingly, the semiconductor device manufactured by bonding the first and second substrates 100 and 200 may have good electrical characteristics and good reliability.

The second substrate 200 may be removed later, if needed.

In some embodiments, when the first and second substrates 100 and 200 are bonded with each other, the first and second conductive pattern structures 170 and 270 may be misaligned, which is illustrated in FIG. 13.

Referring to FIG. 13, when the first and second conductive pattern structures 170 and 270 are misaligned, the first conductive pattern structure 170 may contact the second conductive pattern structure 270 and the second bonding insulation layer pattern 280, and the second conductive pattern structure 270 may contact the first conductive pattern structure 170 and the first bonding insulation layer pattern 180.

The first adhesive pattern 192 and the second adhesive pattern 292 may partially contact with each other. Accordingly, the first substrate 100 and the second substrate 200 may be bonded each other more strongly, and the semiconductor device may have good electrical characteristics and good reliability.

Figure 14:
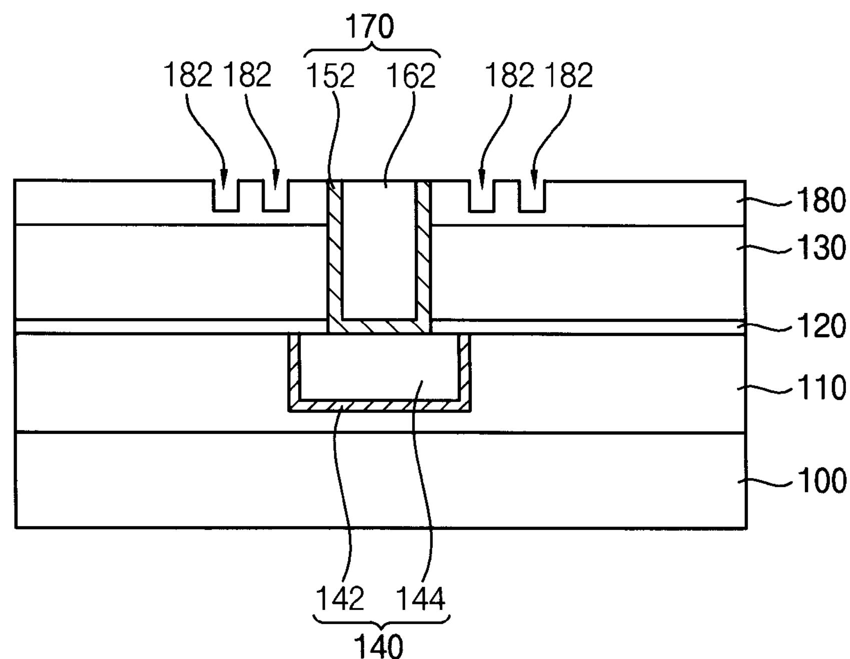
FIGS. 14, 15, and 17 are cross-sectional views illustrating stages of a method of manufacturing a semiconductor device in accordance with the teachings contained in this disclosure.
Figure 15:
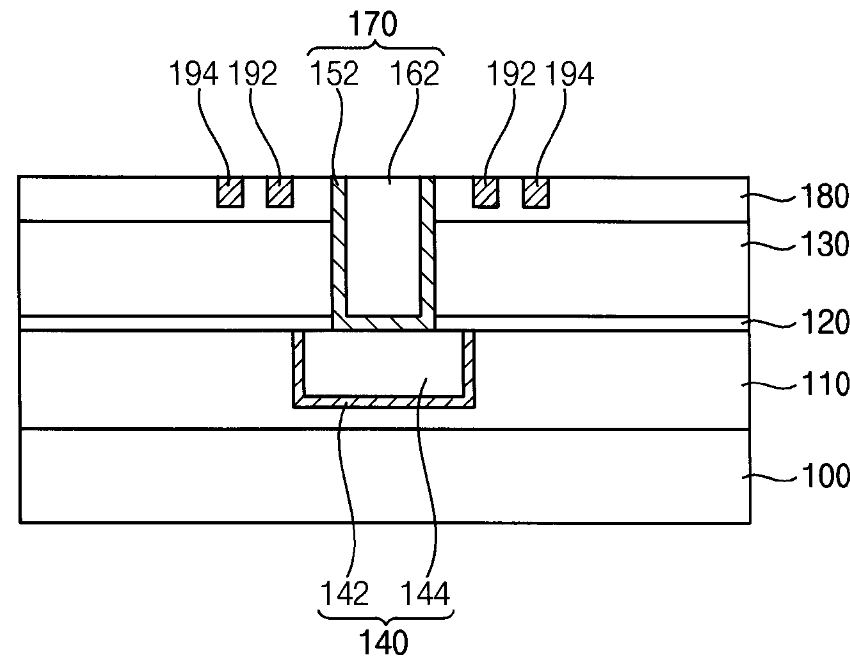
Figure 16A:
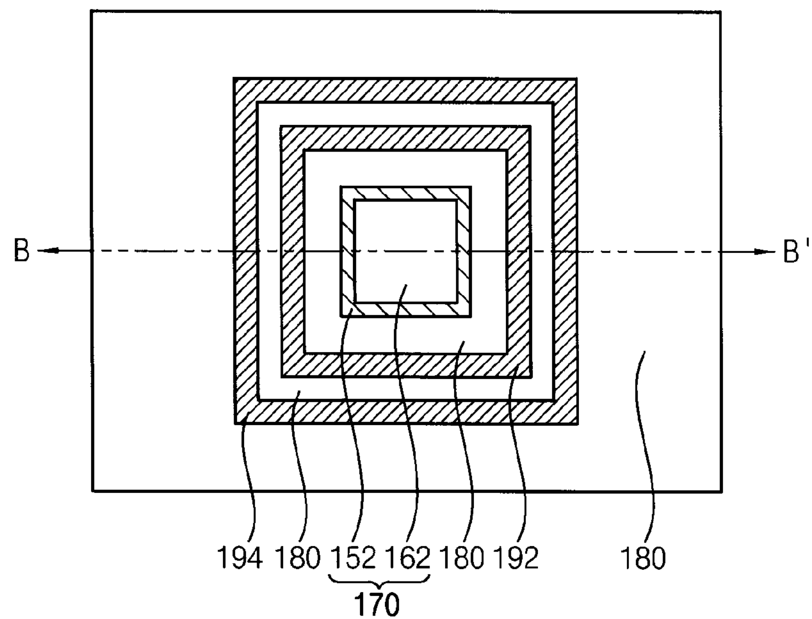
FIGS. 16A to 16C are plan views illustrating the semiconductor device in FIG. 15.
Figure 16B:
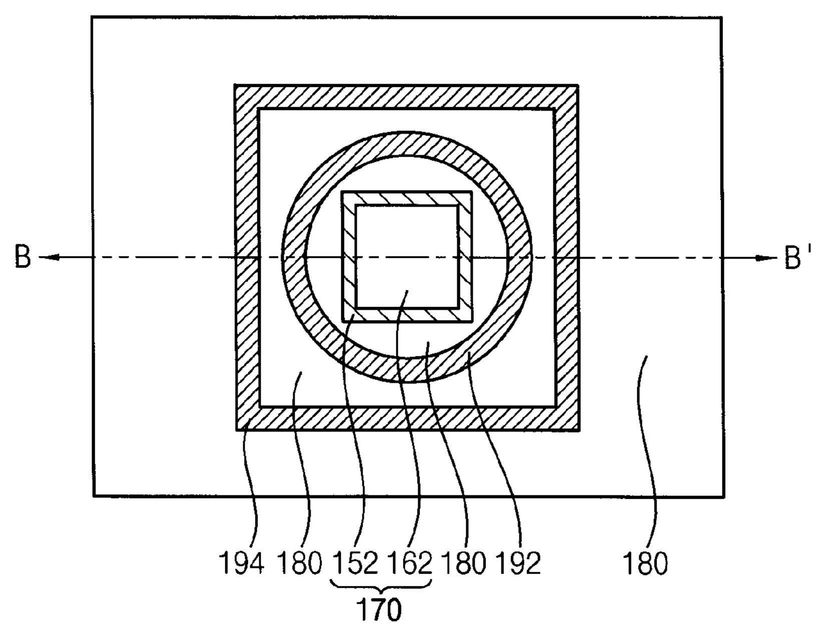
Figure 16C:
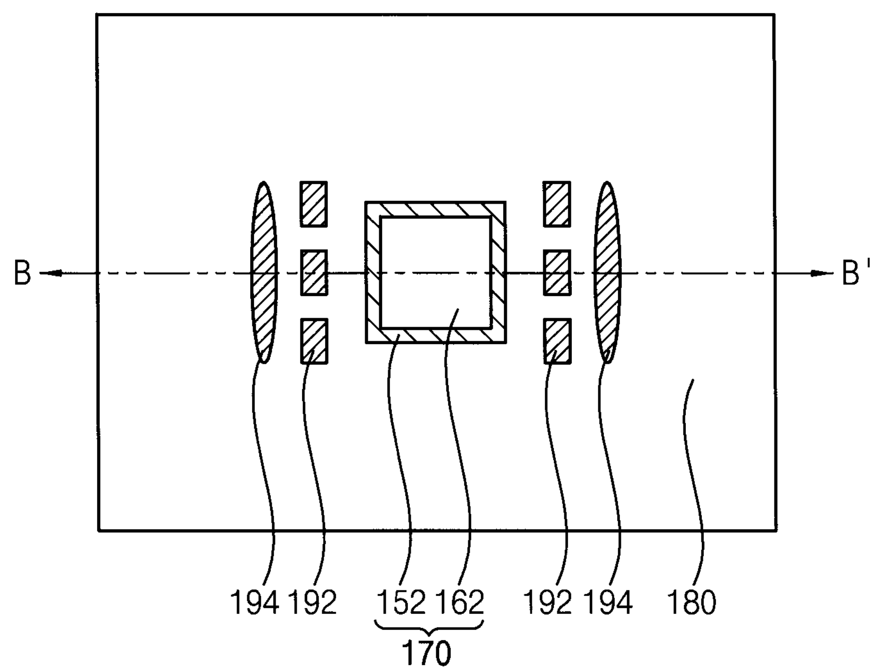
Figure 17:
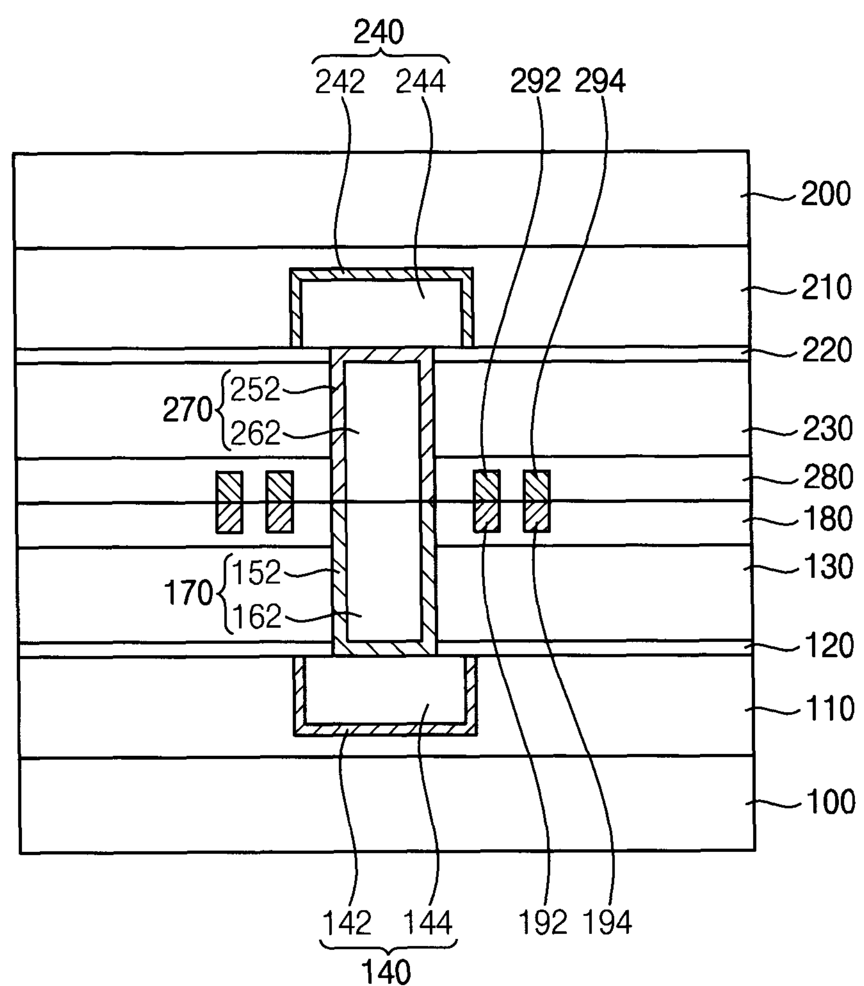

FIGS. 14, 15, and 17 are cross-sectional views illustrating stages of a method of manufacturing a semiconductor device in accordance with the teachings contained in this disclosure. FIGS. 16A to 16C are plan views illustrating a semiconductor device in FIG. 15. FIG. 15 is a cross-sectional view taken along a line B-B' in each of FIGS. 16A to 16C. This method may be substantially the same as or similar to that illustrated with reference to FIGS. 1 to 12, except for shapes of first and second adhesive patterns 192 and 292. Thus, like reference numerals refer to like elements, and detailed descriptions thereon may be omitted below in the interest of brevity.

First, processes substantially the same as or similar to those illustrated with reference to FIGS. 1 to 5 may be performed.

Referring to FIG. 14, the first bonding insulation layer pattern 180 may be partially etched to form a plurality of first recesses 182. The plurality of first recesses 182 may be spaced apart from the first conductive pattern structure 170 by different distances from each other.

Referring to FIG. 15, processes substantially the same as or similar to those illustrated with reference to FIGS. 7A to 8 may be performed to form a first adhesive pattern 192 and a third adhesive pattern 194. The first and third adhesive patterns 192 and 194 may be spaced apart from each other.

Referring to FIGS. 16A to 16C, in some embodiments, each of the first and third adhesive patterns 192 and 194 may have various shapes, e.g., a rectangular shape, a circular shape, an oval shape, or the like, and may be arranged in various shapes, e.g., a rectangular shape, a circular shape, an oval shape, or the like, to surround the first conductive pattern structure 170. The first and third adhesive patterns 192 and 194 may be formed to have different shapes from each other, and may not completely surround the first conductive pattern structure 170. In some embodiments, a plurality of first adhesive patterns 192 and a plurality of third adhesive patterns 194 may be formed.

Referring to FIG. 17, processes substantially the same as or similar to those illustrated with reference to FIGS. 10 to 12 may be performed. The first and second substrates 100 and 200 may be bonded with each other so that the first and second conductive pattern structures 170 and 270 may contact with each other, and thus the semiconductor device may be completed.

Figure 18:
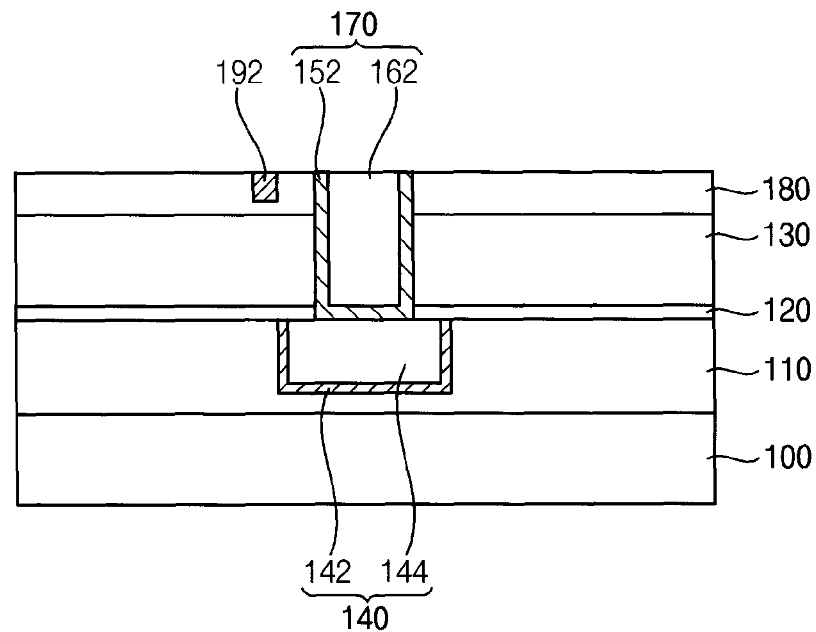
FIGS. 18 and 20 are cross-sectional views illustrating stages of a method of manufacturing a semiconductor device in accordance with the teachings contained in this disclosure.
Figure 19A:
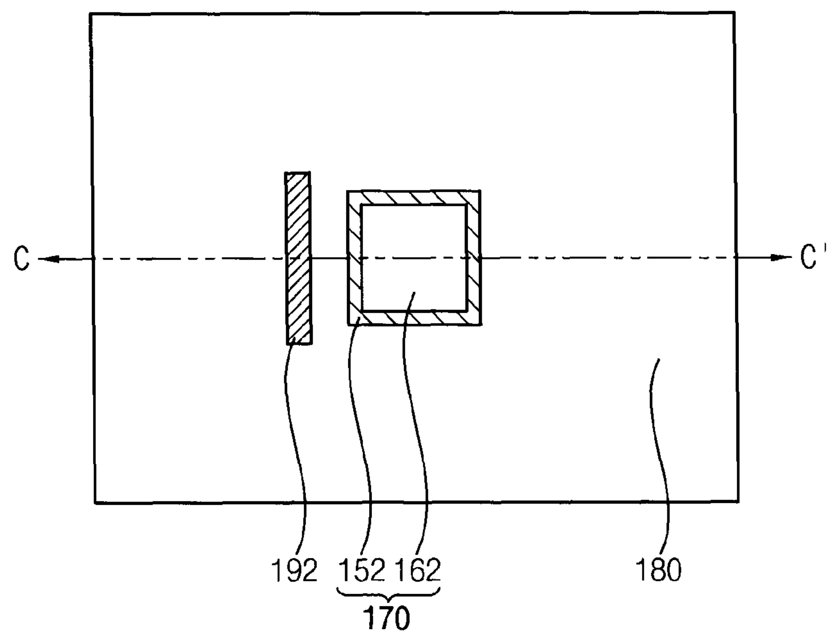
FIGS. 19A to 19D are plan views illustrating the semiconductor device in FIG. 18.
Figure 19B:
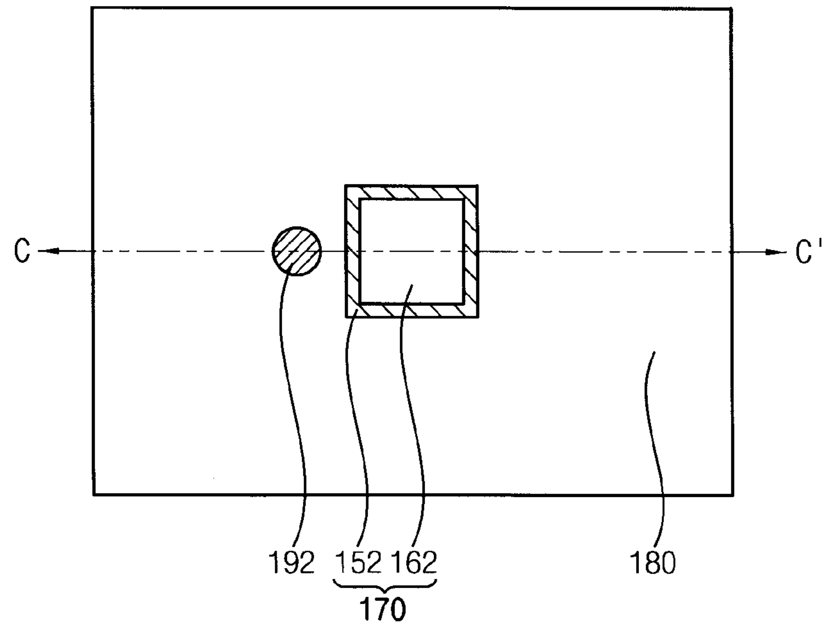
Figure 19C:
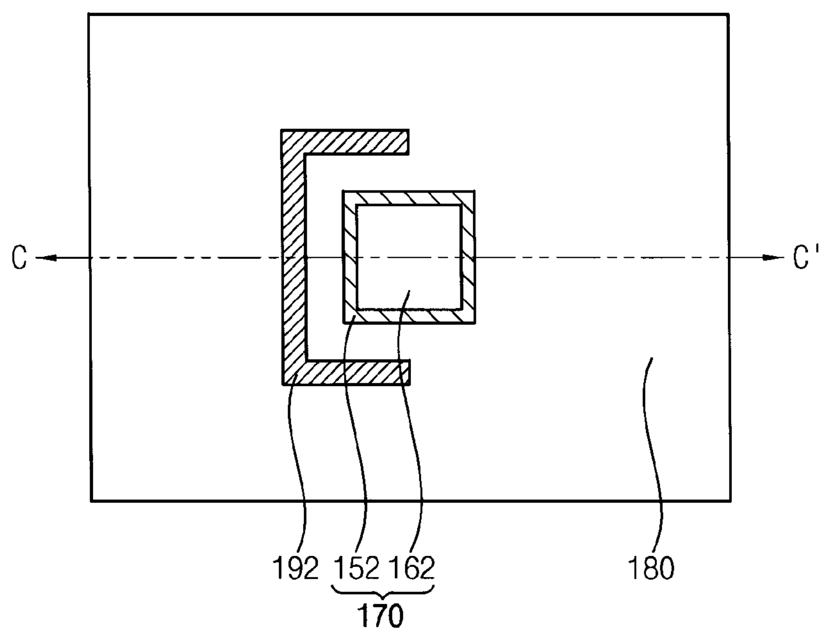
Figure 19D:
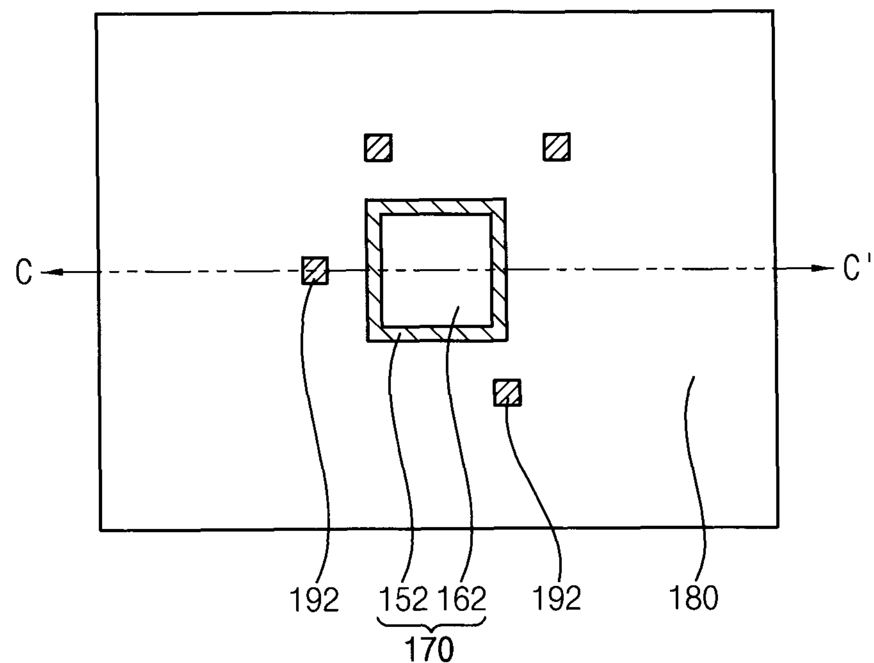
Figure 20:
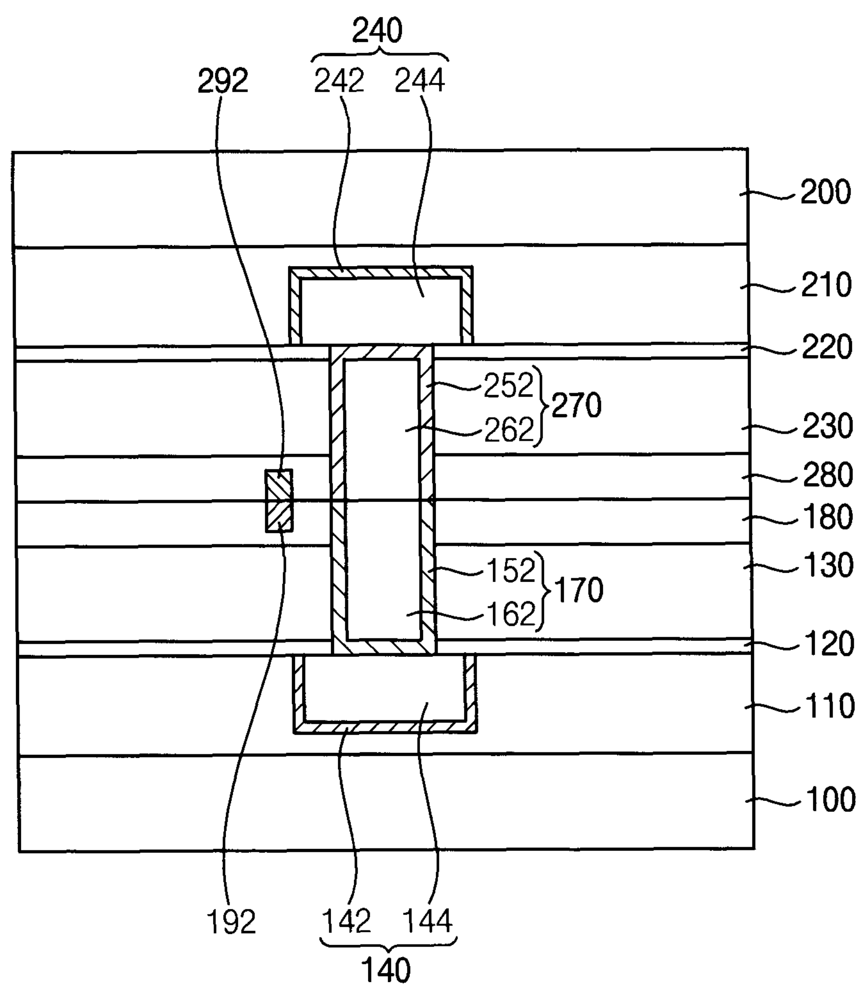

FIGS. 18 and 20 are cross-sectional views illustrating stages of a method of manufacturing a semiconductor device in accordance with the teachings contained in this disclosure. FIGS. 19A to 19D are plan views illustrating the semiconductor device in FIG. 18. FIG. 18 is a cross-sectional view taken along a line C-C' in each of FIGS. 19A to 19D. This method illustrated with reference to FIGS. 18 to 20 may be substantially the same as or similar to that illustrated with reference to FIGS. 1 to 12, except for shapes of first and second adhesive patterns 192 and 292. Thus, like reference numerals refer to like elements, and detailed descriptions thereon may be omitted below in the interest of brevity.

First, processes substantially the same as or similar to those illustrated with reference to FIGS. 1 to 8 may be performed. In this case, the first recess 182 may not completely surround the first conductive pattern structure 170.

Referring to FIG. 18, a first adhesive pattern 192 may be formed to fill the first recess 182. Accordingly, the first adhesive pattern 192 may not completely surround the first conductive pattern structure 170.

Referring to FIGS. 19A to 19D, in some embodiments, the first adhesive pattern 192 may be formed to have various shapes, e.g., a rectangular shape, a circular shape, an oval shape, or the like, and a plurality of first adhesive patterns 192 may be formed to be spaced apart from each other. Further, the first adhesive pattern 192 may not be necessarily formed only in the neighborhood of the first conductive pattern structure 170. That is, any number of the first adhesive pattern 192 may be formed in any position of the first bonding insulation layer pattern 180. Accordingly, when the first and second substrate 100 and 200 are bonded with each other, the adhesion between the substrate 100 and the second substrate 200 may be increased, so that the first and second substrate 100 and 200 may be bonded with each other more strongly.

Referring to FIG. 20, processes substantially the same as or similar to those illustrated with reference to FIGS. 10 to 12 may be performed. The first and second substrates 100 and 200 may be bonded with each other so that the first and second conductive pattern structures 170 and 270 may contact with each other, and thus the semiconductor device may be completed.

Figure 22:
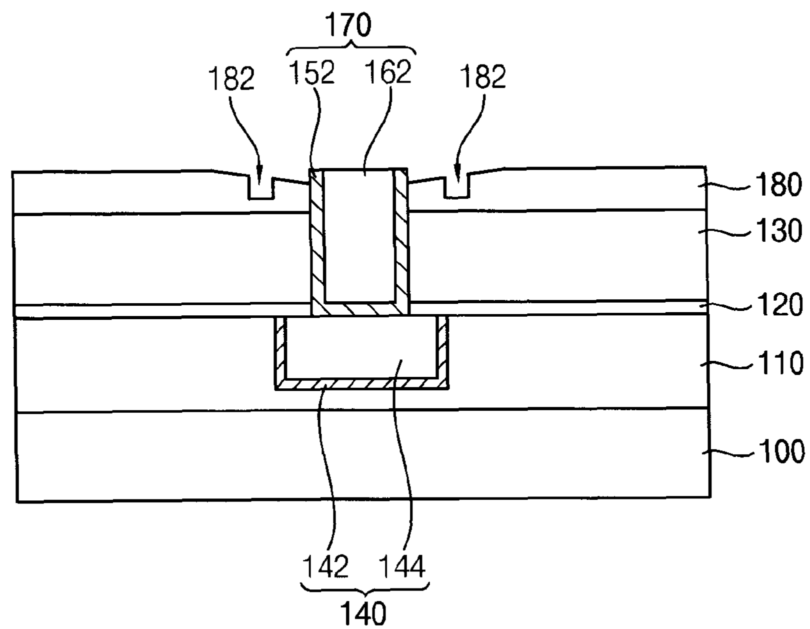
Figure 23:
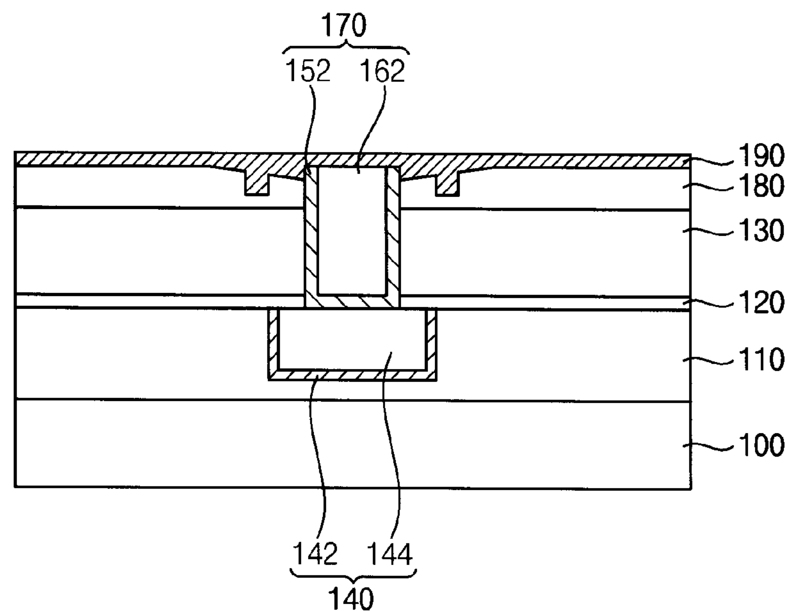
Figure 24:
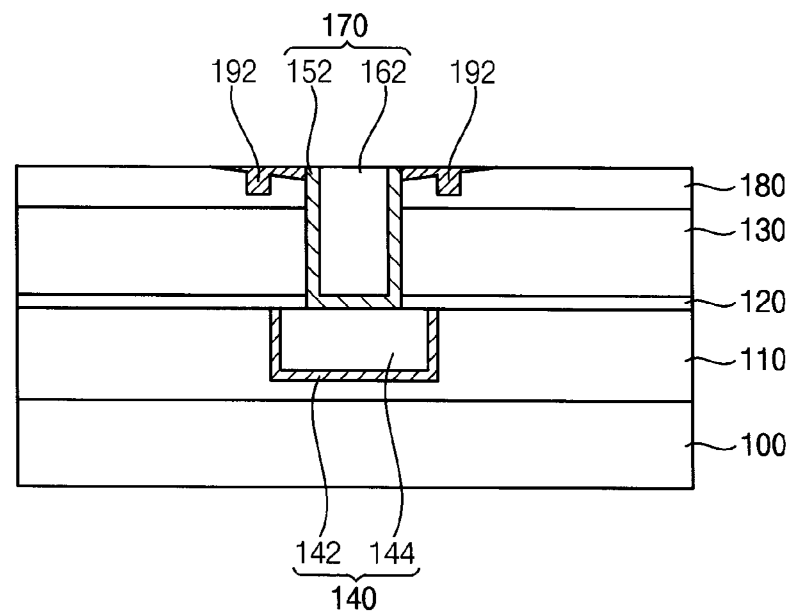
Figure 25A:
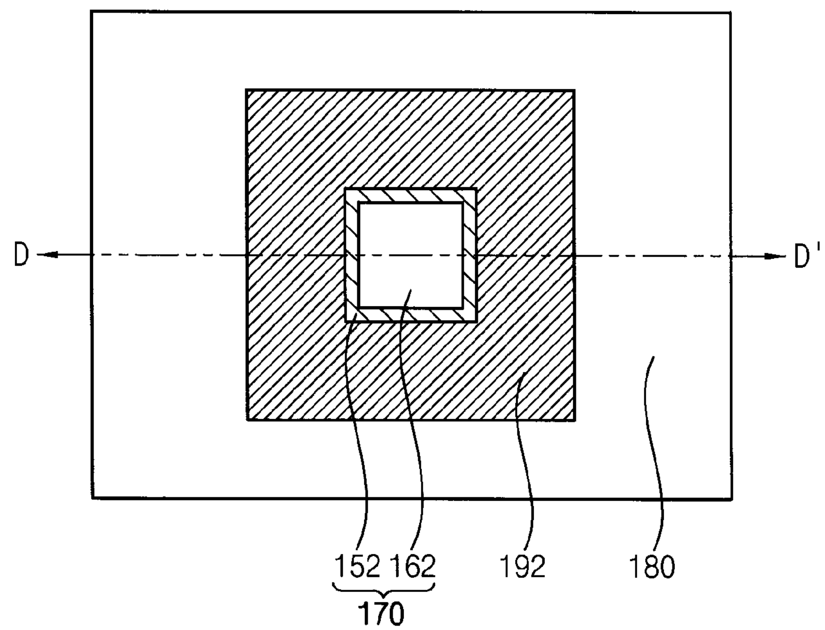
FIGS. 25A and 25B are plan views illustrating the semiconductor device in FIG. 24.
Figure 25B:
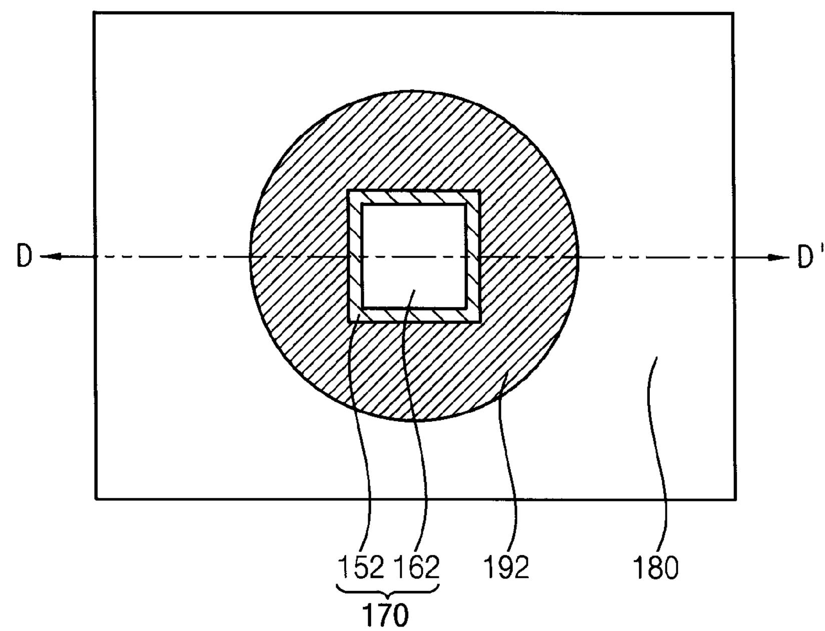
Figure 26:
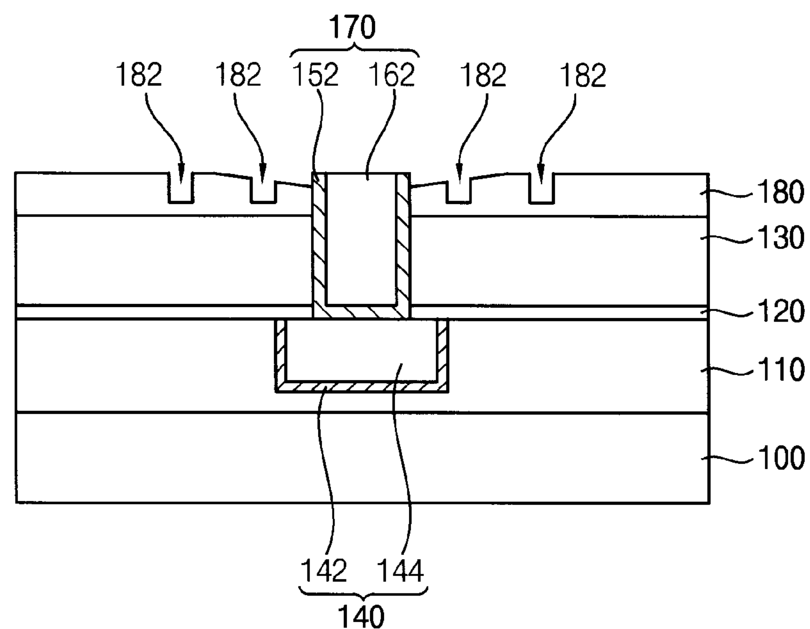
Figure 27:
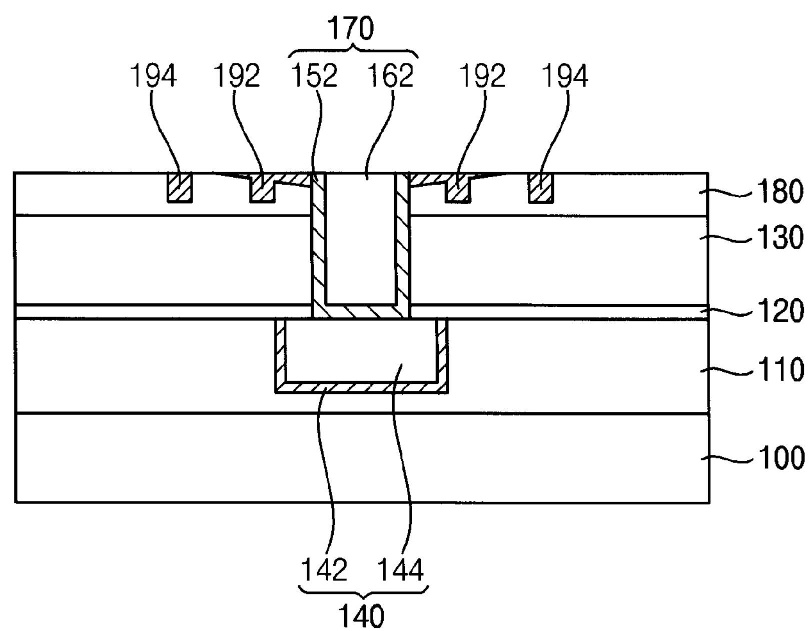
Figure 28:
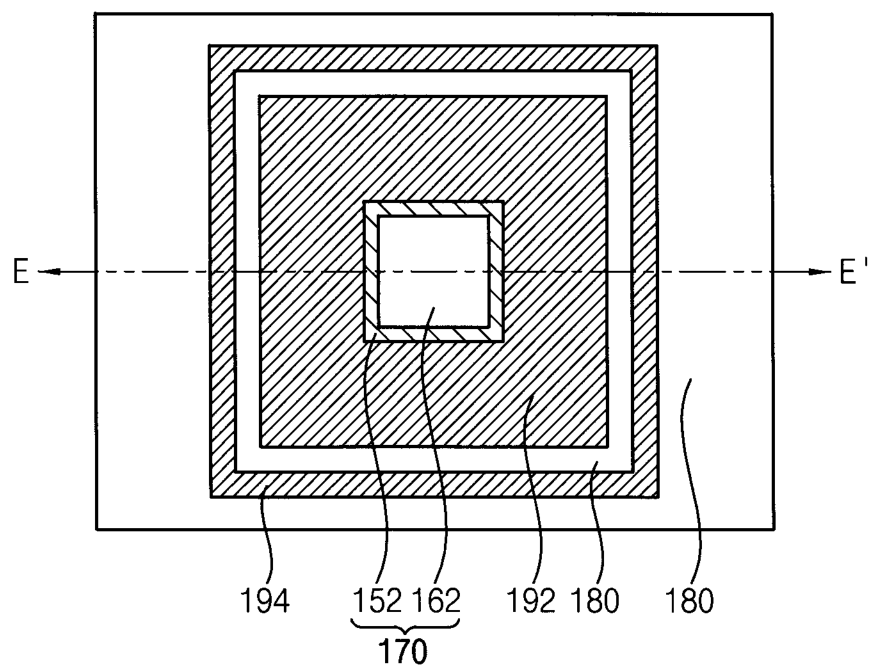
FIG. 28 is a plan view illustrating the semiconductor device in FIG. 27.

FIGS. 21 to 24, 26, 27, 29, 31, and 32 are cross-sectional views illustrating stages of a method of manufacturing a semiconductor device in accordance with the teachings contained in this disclosure. FIGS. 25A and 25B are plan views illustrating the semiconductor device in FIG. 24. FIG. 24 is a cross-sectional view taken along a line D-D' in each of FIGS. 25A and 25B. FIG. 28 is a plan view illustrating the semiconductor device in FIG. 27. FIG. 27 is a cross-sectional view taken along a line E-E' in FIG. 24. FIG. 30 is a cross-sectional view illustrating a semiconductor device in which first and second conductive pattern structures of FIG. 26 are bonded to be misaligned with each other. This method illustrated with reference to FIGS. 21 to 32 may be substantially the same as or similar to that illustrated with reference to FIGS. 1 to 12, except for shapes of first and second adhesive patterns 192 and 292. Thus, like reference numerals refer to like elements, and detailed descriptions thereon may be omitted below in the interest of brevity.

First, processes substantially the same as or similar to those illustrated with reference to FIGS. 1 to 4 may be performed to form a first bonding insulation layer 181 on a first conductive pattern structure 170 and a first insulating interlayer 130.

Figure 21:
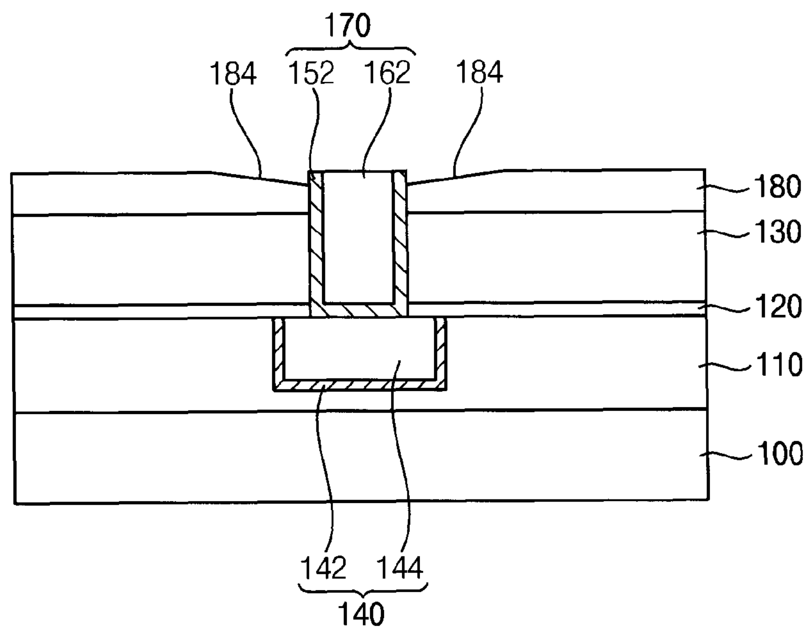
FIGS. 21 to 24, 26, 27, 29, 31, and 32 are cross-sectional views illustrating stages of a method of manufacturing a semiconductor device in accordance with the teachings contained in this disclosure.

Referring to FIG. 21, the first bonding insulation layer 181 may be planarized until a top surface of the first conductive pattern structure 170 is exposed to form a first bonding insulation layer pattern 180.

In some embodiments, the planarization process may include a CMP process. In the planarization process, the first bonding insulation layer 181 may be removed more than the first conductive pattern structure 170 by a slurry used in the CMP process.

In some embodiments, a top surface of the first bonding insulation layer pattern 180 may be substantially coplanar with the top surface of the first conductive pattern structure 170 except for a portion of the first bonding insulation layer pattern 180 adjacent to the first conductive pattern structure 170. Particularly, a height of the top surface of the first bonding insulation layer pattern 180 may gradually decrease toward the first conductive pattern structure 170 at the portion thereof, and thus an upper sidewall of the first conductive pattern structure 170 may not be covered by the first bonding insulation layer pattern 180, but may be exposed.

Referring to FIG. 22, the first bonding insulation layer pattern 180 may be partially etched to form a first recess 182.

In some embodiments, the first recess 182 may be formed to be space apart from the first conductive pattern structure 170. For example, the first recess 182 may be formed at a portion of the first bonding insulation layer pattern 180 of which a top surface may be lower than the top surface of the first conductive pattern structure 170.

Referring to FIG. 23, a first adhesive layer 190 may be formed on the first bonding insulation layer pattern 180 to sufficiently fill the first recess 182 by, e.g., a spin coating process.

Referring to FIG. 24, the first adhesive layer 190 may be planarized until the top surface of the first conductive pattern structure 170 is exposed to form a first adhesive pattern 192.

In some embodiments, the planarization process may include a CMP process. Accordingly, a top surface of the first adhesive pattern 192 may be formed to be substantially coplanar with the top surface of the first conductive pattern structure 170.

Referring to FIGS. 25A and 25B, in a plan view, the first adhesive pattern 192 may be formed to surround the first conductive pattern structure 170.

In some embodiments, the first adhesive pattern 192 may not be spaced apart from the first conductive pattern structure 170, but may contact the first conductive pattern structure 170. For example, the first adhesive pattern 192 may be formed to have various shapes, e.g., a rectangular shape (refer to FIG. 25A), a circular shape (refer to FIG. 25B), an oval shape (not shown), or the like.

Referring to FIG. 26, in some embodiments, a plurality of first recesses 182 may be formed to be spaced apart from the first conductive pattern structure 170 by different distances from each other.

Referring to FIG. 27, the first recesses 182 may be sufficiently filled with a polymer by a spin coating process or a contact painting process. A top surface of the polymer may be planarized until the top surface of the first conductive pattern structure 170 is exposed to form the first adhesive pattern 192 and a third adhesive pattern 194.

Referring to FIG. 28, in a plan view, the first adhesive pattern 192 may be formed to contact the first conductive pattern structure 170, and completely surround the first conductive pattern structure 170. The third adhesive pattern 194 may be formed to be spaced apart from the first adhesive pattern 192, and surround the first conductive pattern structure 170. Accordingly, the first and second substrates 100 and 200 may be bonded with each other more strongly.

In a plan view, each of the first and third adhesive patterns 192 and 194 may be formed to have various shapes, e.g., a rectangular shape, a circular shape, an oval shape, or the like. In some embodiments, a plurality of first adhesive patterns 192 and a plurality of third adhesive patterns 194 may be formed to partially surround the first conductive pattern structure 170.

Processes substantially the same as or similar to those illustrated with reference to FIGS. 21 to 24 may be performed, so that fourth and second insulating interlayers 210 and 230 may be sequentially formed on a second substrate 200, and fourth and second conductive pattern structures 240 and 270 may be formed in the fourth and second insulating interlayers 210 and 230, respectively. Processes substantially the same as or similar to those illustrated with reference to FIG. 11 may be performed to heat the first and second adhesive patterns 192 and 292. Accordingly, the first and second adhesive patterns 192 and 292 may be melted.

Figure 29:
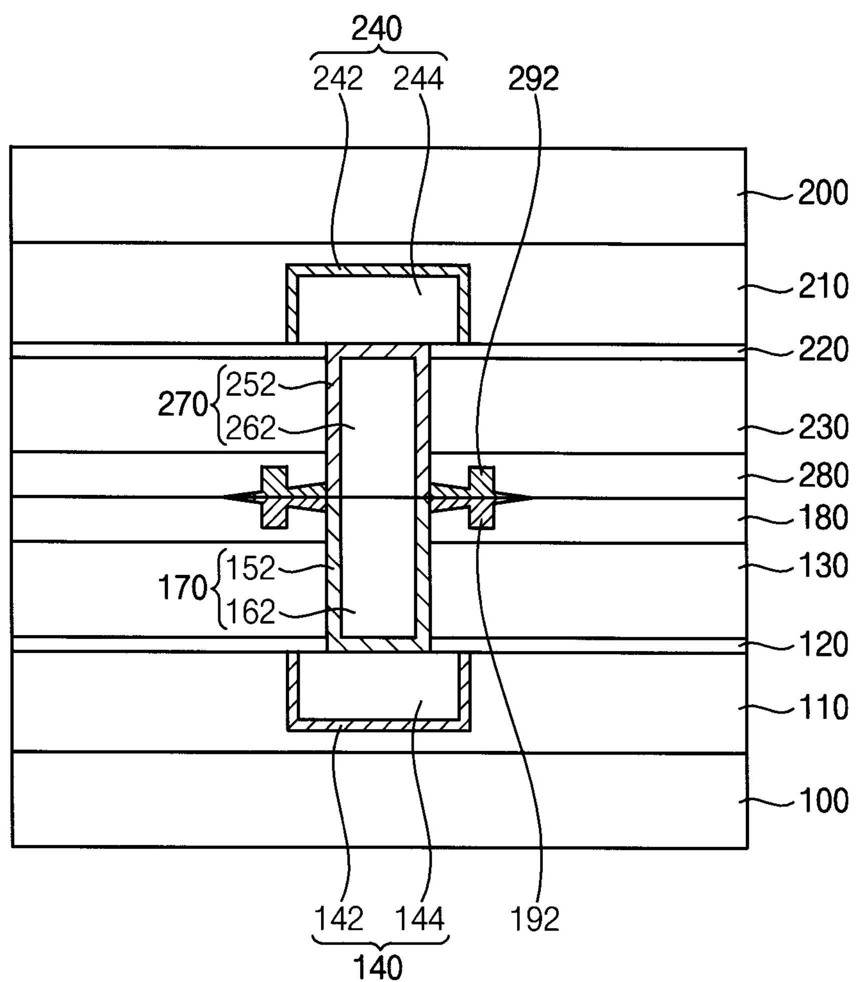
Figure 30:
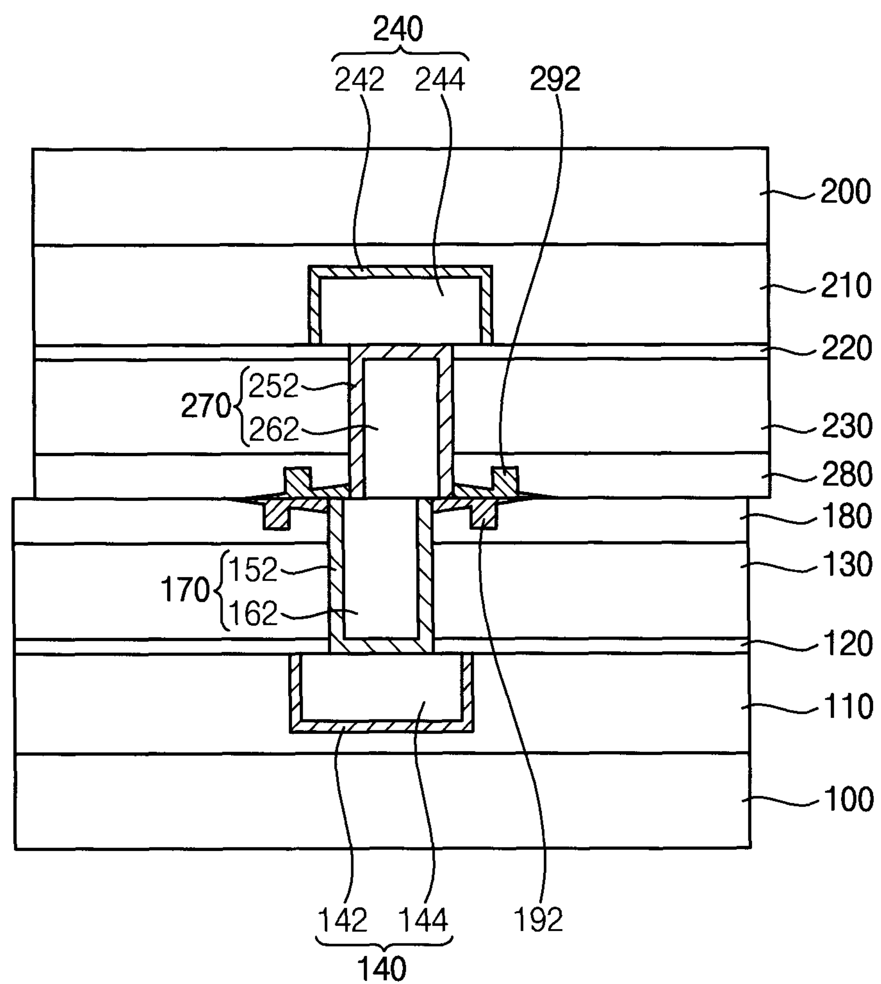
FIG. 30 is a cross-sectional view illustrating a semiconductor device in which first and second conductive pattern structures of FIG. 26 are bonded to be misaligned with each other.

Referring to FIG. 29, the first and second substrates 100 and 200 may be bonded with each other so that the first and second conductive pattern structures 170 and 270 may contact with each other. The first and second adhesive patterns 192 and 292 may be melted by performing process substantially the same as or similar to that illustrated with reference to FIG. 11. The first and second adhesive patterns 192 and 292 may be hardened with contacting each other, so that the first and second substrates 100 and 200 may be bonded with each other more strongly. Accordingly, the semiconductor device manufactured by bonding the first and second substrates 100 and 200 may have good electrical characteristics and good reliability.

Referring to FIG. 30, even when the first and second conductive pattern structures 170 and 270 are misaligned, the first conductive pattern structure 170 may contact the second conductive pattern structure 270 and the second bonding insulation layer pattern 280, and the second conductive pattern structure 270 may contact the first conductive pattern structure 170 and the first bonding insulation layer pattern 180. Accordingly, the first and second adhesive patterns 192 and 292 may prevent a metal included in the first and second conductive pattern structures 170 and 270 from diffusing into neighboring structures.

Figure 31:
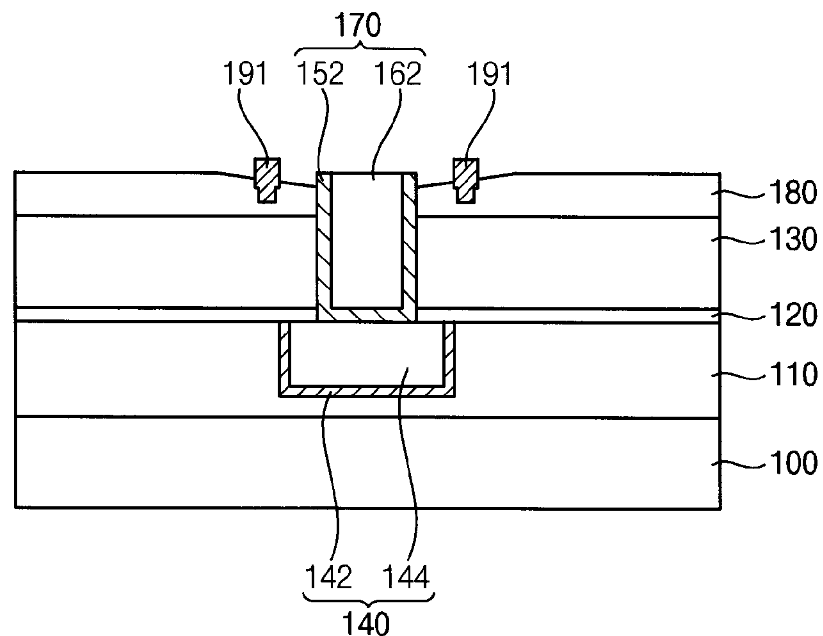

Alternatively, referring to FIG. 31, a first adhesive layer 191 sufficiently filling the first recess 182 may be formed by a contact printing process instead of a spin coating process. The first adhesive layer 191 may sufficiently fill the first recess 182, however, may not completely surround the exposed upper sidewall of the first conductive pattern structure 170.

Figure 32:
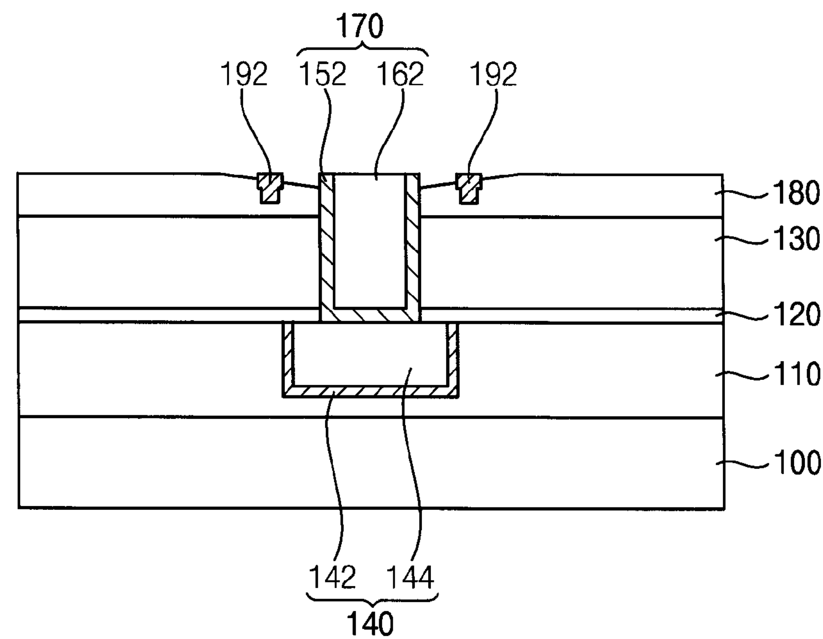

Referring to FIG. 32, the first adhesive layer 191 may be planarized to form the first adhesive pattern 192. For example, the planarization process may include a CMP process.

Processes substantially the same as or similar to those illustrated with reference to FIGS. 21 to 24 may be performed, so that fourth and second insulating interlayers 210 and 230 may be sequentially formed on a second substrate 200, and fourth and second conductive pattern structures 240 and 270 may be formed in the fourth and second insulating interlayers 210 and 230, respectively. Processes substantially the same as or similar to those illustrated with reference to FIG. 11 may be performed to heat the first and second adhesive patterns 192 and 292. Accordingly, the first and second adhesive patterns 192 and 292 may be melted.

Referring again to FIG. 29, the first and second substrates 100 and 200 may be bonded with each other so that the first and second conductive pattern structures 170 and 270 may contact with each other. In this case, the first and second adhesive patterns 192 and 292 in a molten state may fill an empty space between the first bonding insulation layer pattern 180 and the second bonding insulation layer pattern 280, so as to increase a bonding force between the first substrate 100 and the second substrate 200. Further, even when the first and second substrates 100 and 200 are misaligned with each other, the first and second adhesive patterns 192 and 292 may surround the first and second conductive pattern structures 170 and 270 so that the diffusion of metal may be prevented.

FIGS. 33 to 37 are cross-sectional views illustrating stages of a method of manufacturing a semiconductor device in accordance with the teachings contained in this disclosure. This method illustrated with reference to FIGS. 33 to 37 may be substantially the same as or similar to that illustrated with reference to FIGS. 1 to 12, except that the recess may not be formed when first and second adhesive patterns 192 and 292 are formed. Thus, like reference numerals refer to like elements, and detailed descriptions thereon may be omitted below in the interest of brevity.

First, processes substantially the same as or similar to those illustrated with reference to FIGS. 1 to 5 may be performed, so that a first conductive pattern structure 170 and a first bonding insulation layer pattern 180 covering the first conductive pattern structure 170 may be formed on a first substrate 100. The first bonding insulation layer pattern 180 may be formed by a planarization process, e.g., a CMP process, and in the CMP process, the first bonding insulation layer pattern 180 may be removed more than the first conductive pattern structure 170 by a slurry. By performing the CMP process, a top surface of the first bonding insulation layer pattern 180 may be formed to be substantially coplanar with a top surface of the first conductive pattern structure 170. Accordingly, the top surface of the first bonding insulation layer pattern 180 may be substantially coplanar with the top surface of the first conductive pattern structure 170 except a portion of the first bonding insulation layer pattern 180 adjacent to the first conductive pattern structure 170. Particularly, a height of the top surface of the first bonding insulation layer pattern 180 may gradually decrease toward the first conductive pattern structure 170 at the portion thereof, and thus an upper sidewall of the first conductive pattern structure 170 may not be covered by the first bonding insulation layer pattern 180, but may be exposed.

Figure 33:
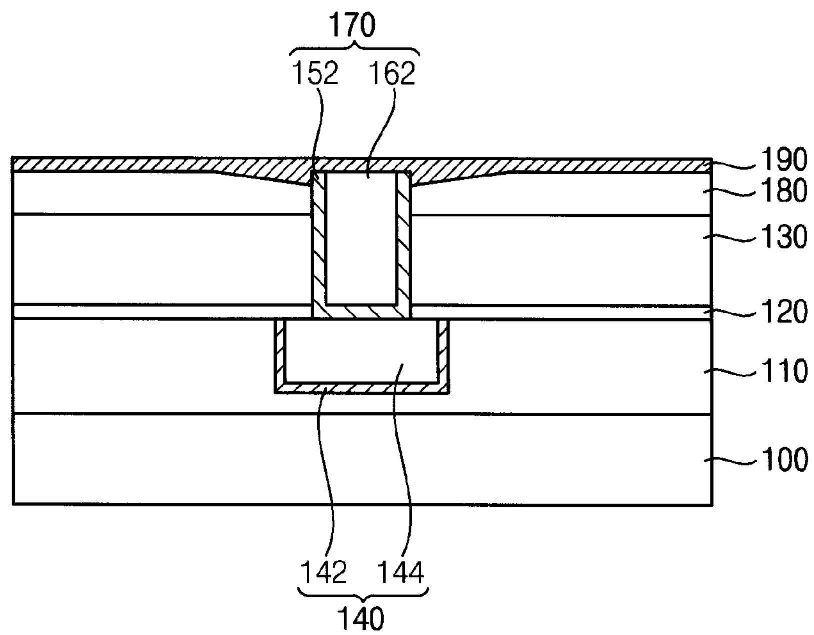
FIGS. 33 to 37 are cross-sectional views illustrating stages of a method of manufacturing a semiconductor device in accordance with the teachings contained in this disclosure.

Referring to FIG. 33, a first adhesive layer 190 may be formed on the first bonding insulation layer pattern 180 and the first conductive pattern structure 170. For example, the first adhesive layer 190 may be formed by a spin coating process. Accordingly, the first adhesive layer 190 may be sufficiently formed on the top surface of the first bonding insulation layer pattern 180 so as to fill a space between the upper sidewall of the first conductive pattern structure 170 and the top surface of the portion of the first bonding insulation layer pattern 180 adjacent to the first conductive pattern structure 170, which may be lower than the top surface of the first conductive pattern structure 170.

Figure 34:
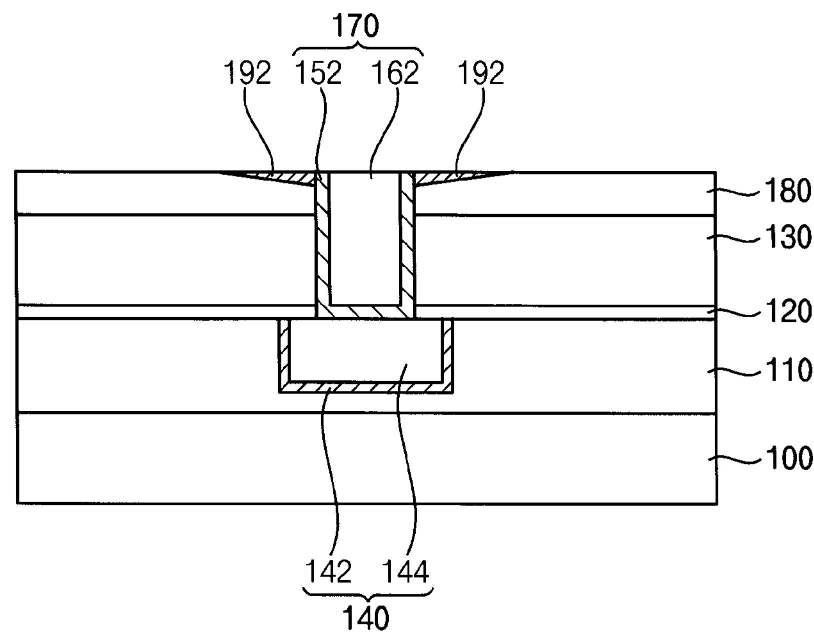

Referring to FIG. 34, the first adhesive layer 190 may be planarized until the top surface of the first conductive pattern structure 170 is exposed to form a first adhesive pattern 192 surrounding the first conductive pattern structure 170. For example, the planarization process may include a CMP process.

The first and second substrates 100 and 200 may be bonded with each other by performing processes substantially the same as or similar to those illustrated with reference to FIGS. 10 to 12.

Figure 35:
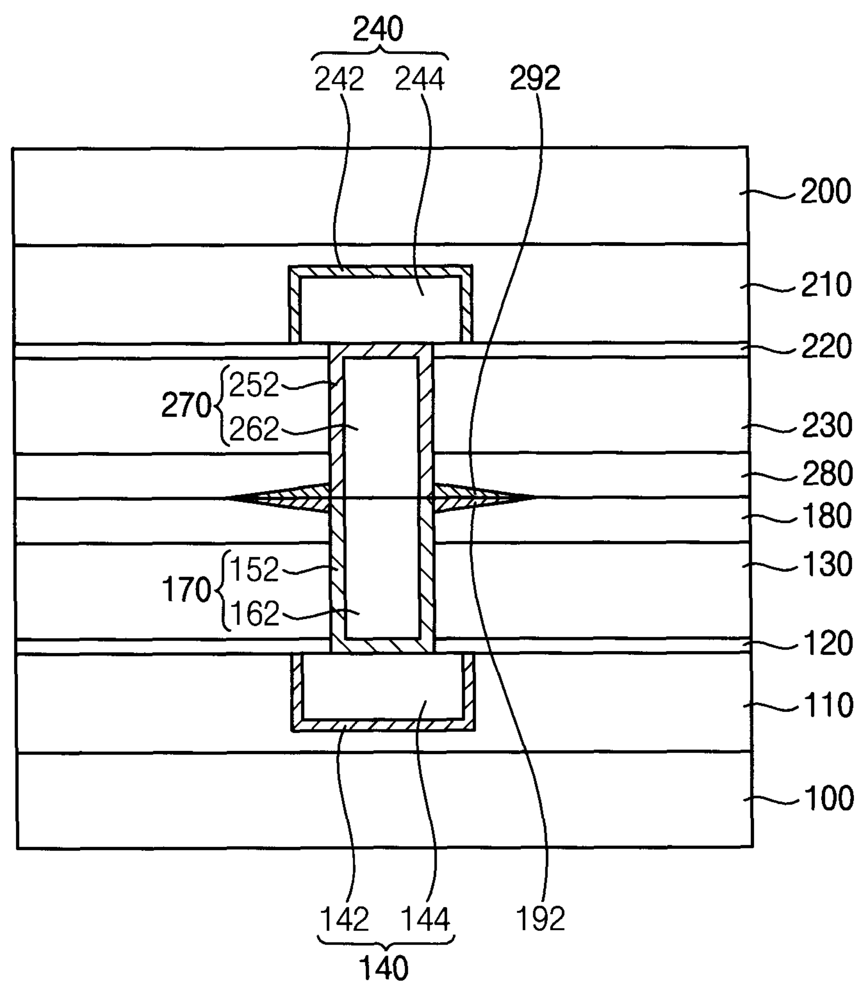

Referring to FIG. 35, the first and second conductive pattern structures 170 and 270 may contact with each other. Accordingly, the first and second adhesive patterns 192 and 292 may be bonded with each other, so that the first and second substrates 100 and 200 may be bonded with each other more strongly, and the metal included in the first and second conductive pattern structures 170 and 270 may not diffuse to neighboring structures.

Figure 36:
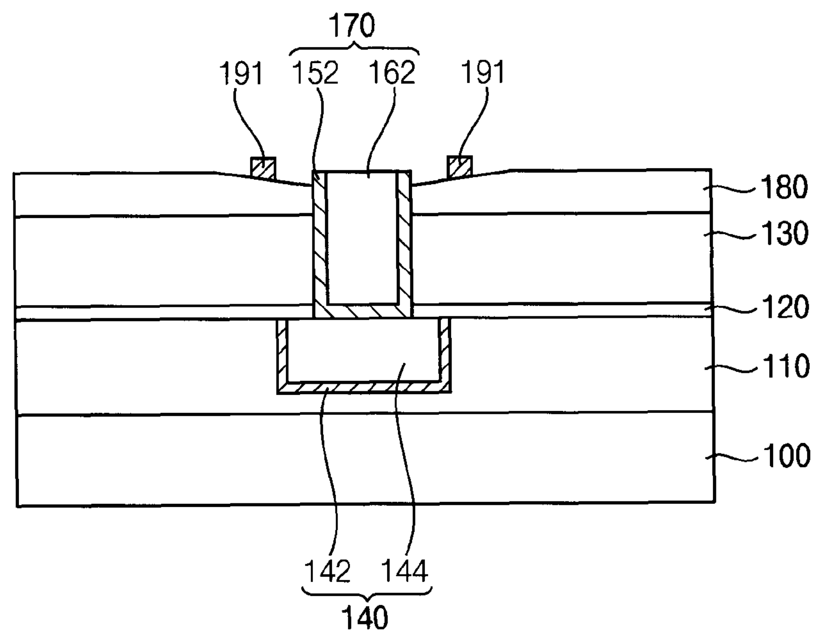

Alternatively, referring to FIG. 36, a first adhesive layer 191 may be formed by a contact printing process instead of a spin coating process. For example, the first adhesive layer 191 may be formed at a portion of the first bonding insulation layer pattern 180 of which a top surface may be lower than the top surface of the first conductive pattern structure 170. In some embodiments, the first adhesive layer 191 may not completely surround the exposed upper sidewall of the first conductive pattern structure 170.

Figure 37:
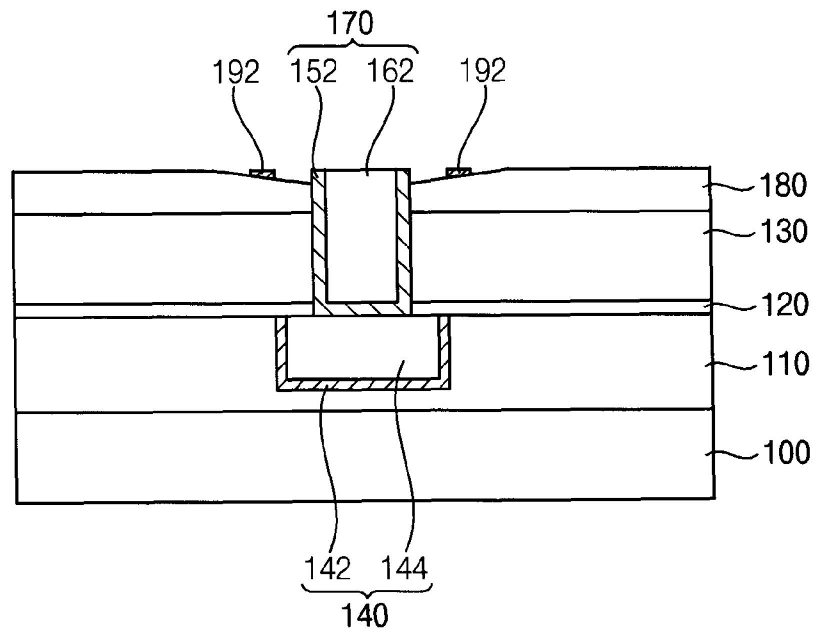

Referring to FIG. 37, the first adhesive layer 191 may be planarized to form a first adhesive pattern 192. For example, the planarization process may include a CMP process.

Processes substantially the same as or similar to those illustrated with reference to FIGS. 21 to 24 and FIG. 26 may be performed. The first and second substrates 100 and 200 may be bonded with each other so that the first and second conductive pattern structures 170 and 270 may contact with each other. In this case, the first and second adhesive patterns 192 and 292 in a molten state may fill an empty space between the first bonding insulation layer pattern 180 and the second bonding insulation layer pattern 280, so as to increase a bonding force between the first substrate 100 and second substrate 200. Further, even when the first and second substrates 100 and 200 are misaligned with each other, the first and second adhesive patterns 192 and 292 may surround the first and second conductive pattern structures 170 and 270 so that the diffusion of metal may be prevented.

Figure 39:
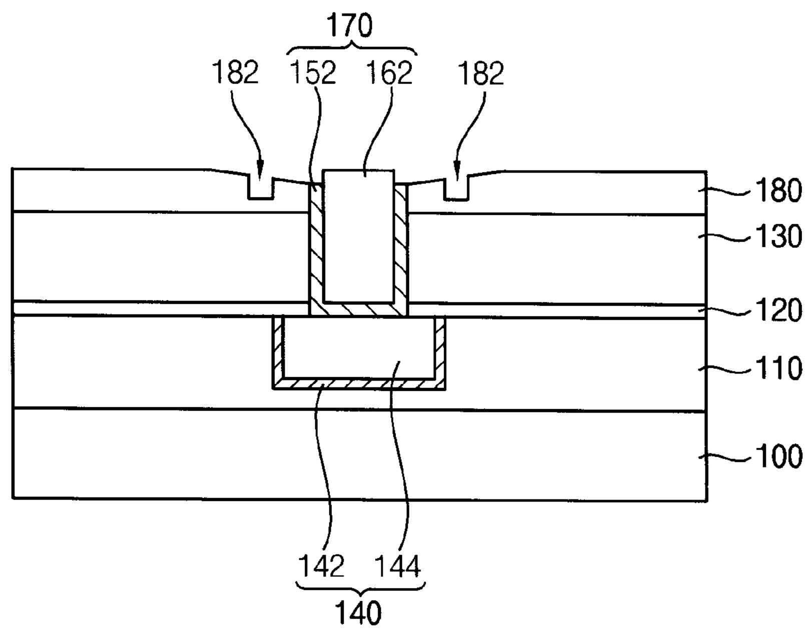
Figure 40:
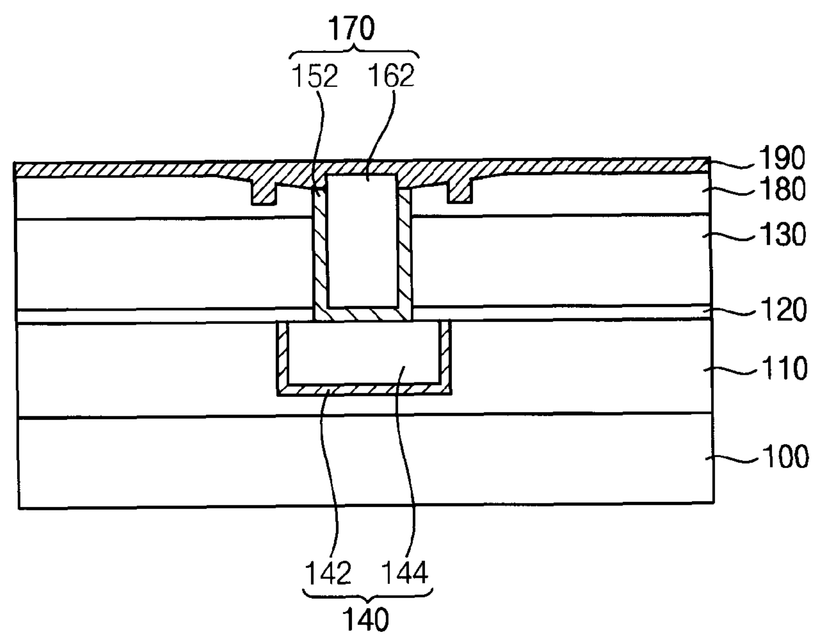
Figure 41:
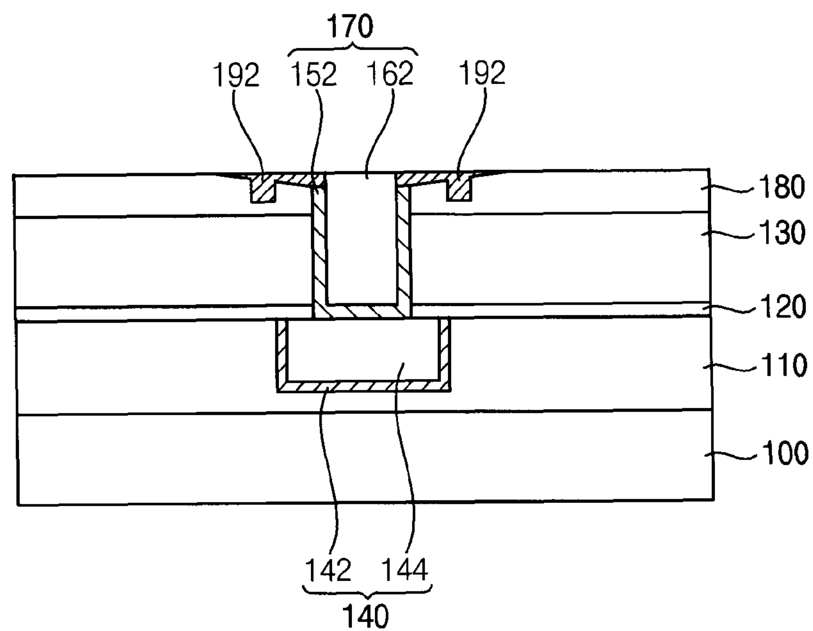
Figure 42:
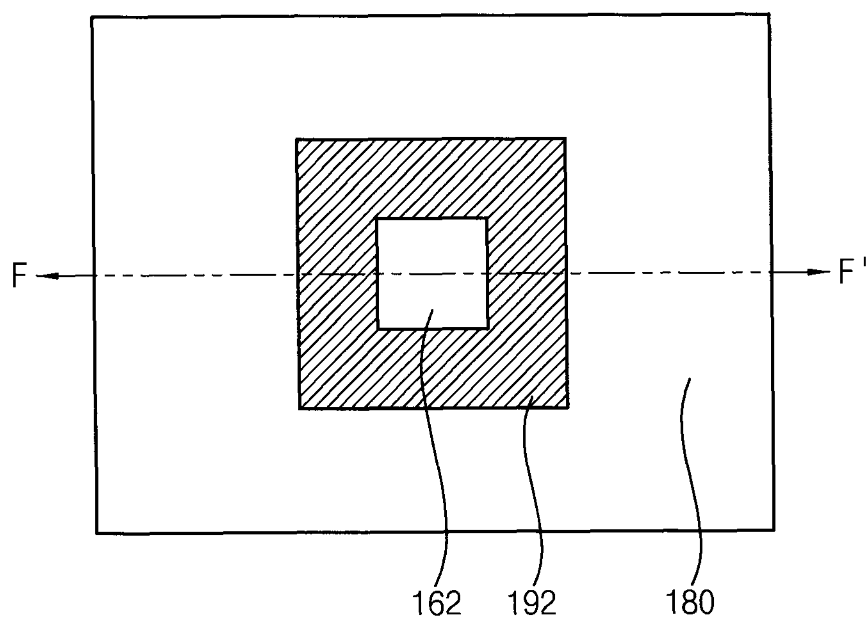
FIG. 42 is a plan view illustrating the semiconductor device in FIG. 41.

FIGS. 38 to 41 and FIGS. 43 to 46 are cross-sectional views illustrating stages of a method of manufacturing a semiconductor device in accordance with the teachings contained in this disclosure. FIG. 42 is a plan view illustrating the semiconductor device in FIG. 41. FIG. 41 is a cross-sectional view taken along a line F-F' in FIG. 42. This method illustrated with reference to FIGS. 38 to 46 may be substantially the same as or similar to that illustrated with reference to FIGS. 1 to 12, except for shapes of first and second adhesive patterns 192 and 292. Thus, like reference numerals refer to like elements, and detailed descriptions thereon may be omitted below in the interest of brevity.

First, processes substantially the same as or similar to those illustrated with reference to FIGS. 1 to 4 may be performed to form a first bonding insulation layer 181 on a first conductive pattern structure 170 and a first insulating interlayer 130.

Figure 38:
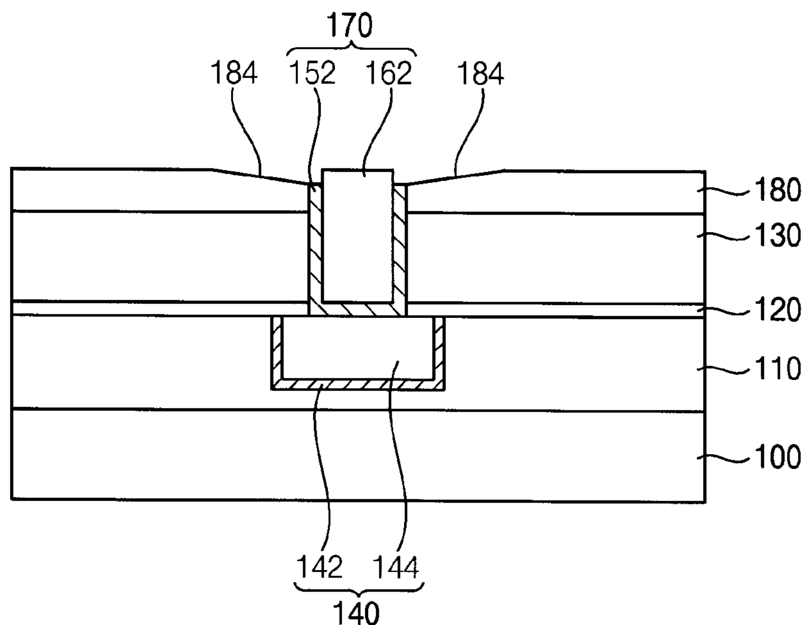
FIGS. 38 to 41 and FIGS. 43 to 46 are cross-sectional views illustrating stages of a method of manufacturing a semiconductor device in accordance with the teachings contained in this disclosure.

Referring to FIG. 38, the first bonding insulation layer 181 may be planarized until a top surface of a first conductive pattern 162 is exposed to form a first bonding insulation layer pattern 180.

In some embodiments, the planarization process may include a CMP process. A top surface of the first barrier layer pattern 152 may be formed to be lower than a top surface of the first conductive pattern 162 by a slurry used in the CMP process. A top surface of the first bonding insulation layer pattern 180 may be substantially coplanar with the top surface of the first conductive pattern 162 except a portion of the first bonding insulation layer pattern 180 adjacent to the first conductive pattern structure 170, which may be lower than the top surface of the first conductive pattern structure 170.

Referring to FIG. 39, the first bonding insulation layer pattern 180 may be partially etched to form a first recess 182. The first recess 182 may be formed to be spaced apart from the first conductive pattern structure 170, and to surround the first conductive pattern structure 170. In some embodiments, a plurality of first recesses 182 may be formed to be spaced apart from each other.

Referring to FIG. 40, a first adhesive layer 190 may be formed on the first bonding insulation layer pattern 180 and the first conductive pattern structure 170 to sufficiently fill the first recess 182. For example, the first adhesive layer 190 may be formed by a spin coating process, a contact printing process, or the like.

Referring to FIGS. 41 and 42, the first adhesive layer 190 may be planarized until the top surface of the first conductive pattern 162 is exposed to form a first adhesive pattern 192. The first adhesive pattern 192 may contact a sidewall of the first conductive pattern 162, and vertically overlap the first barrier layer pattern 152.

Processes substantially the same as or similar to those illustrated with reference to FIGS. 10 to 12 may be performed, and thus the first and second substrates 100 and 200 may be bonded with each other so that the first and second conductive pattern structures 170 and 270 may contact with each other to complete the semiconductor device.

Figure 43:
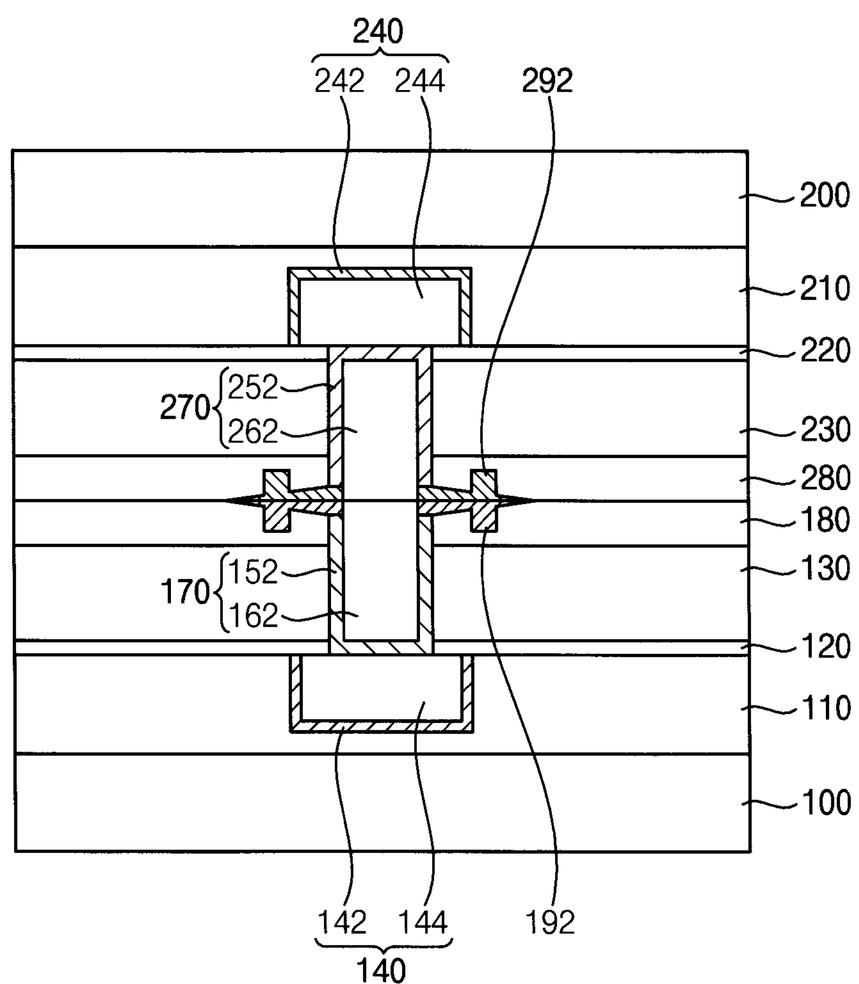

Referring to FIG. 43, the first and second conductive patterns 162 and 262 may contact with each other, while the first and second barrier layer patterns 152 and 252 may not contact with each other. In this case, the first and second adhesive patterns 192 and 292 may fill empty spaces between the first barrier layer pattern 152 and the second barrier layer pattern 252, and between the first bonding insulation layer pattern 180 and the second bonding insulation layer pattern 280, so as to increase a bonding force between the first substrate 100 and second substrate 200. Further, the diffusion of metal included in the first and second conductive patterns 162 and 262 may be prevented.

Figure 44:
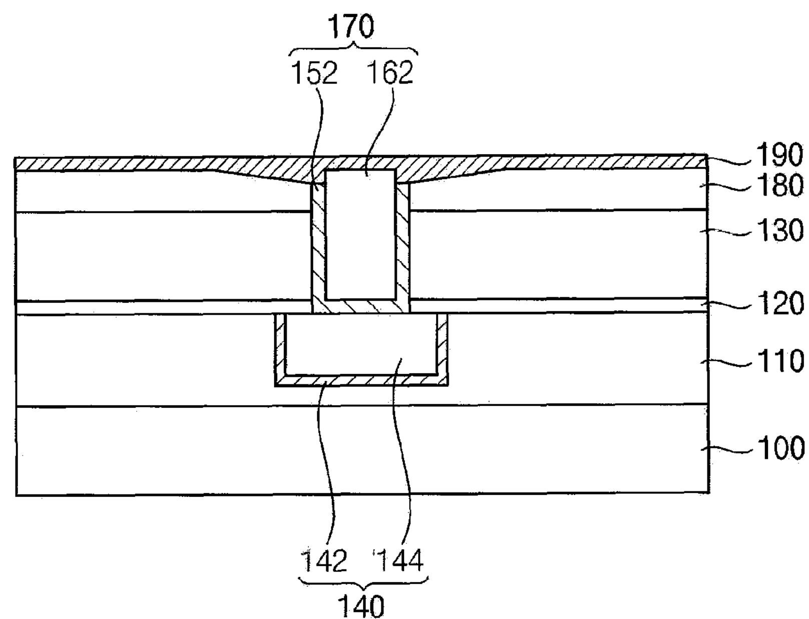

Referring to FIG. 44, in some embodiments, a first adhesive layer 190 may be formed on the first bonding insulation layer pattern 180 having no recess thereon. For example, the first adhesive layer 190 may be formed by a spin coating process or a contact printing process, and the first adhesive layer 190 may sufficiently cover a top surface of the first bonding insulation layer pattern 180 and a top surface of the first barrier layer pattern 152, and further may fill a space between an upper sidewall of the first conductive pattern structure 170 and the top surfaces of the first barrier layer pattern 152 and a portion of the first bonding insulation layer pattern 180 adjacent to the first conductive pattern structure 170 and, which may be lower than the top surface of the first conductive pattern structure 170.

Figure 45:
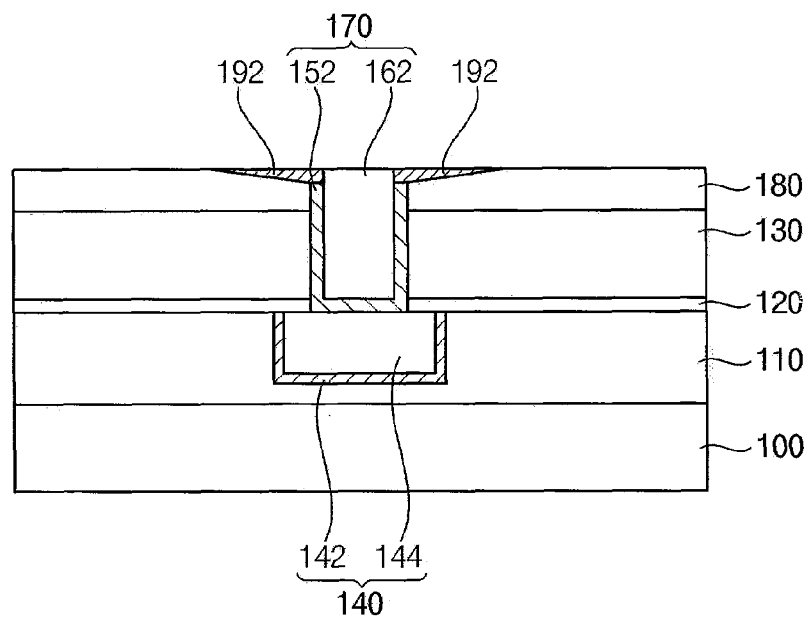

Referring to FIG. 45, the first adhesive layer 190 may be planarized until a top surface of the first conductive pattern 162 is exposed to form a first adhesive pattern 192. As illustrated in FIG. 42, the first adhesive pattern 192 may contact a sidewall of the first conductive pattern 162, and vertically overlap the first barrier layer pattern 152.

Processes substantially the same as or similar to those illustrated with reference to FIGS. 10 to 12 may be performed. The first and second substrates 100 and 200 may be bonded with each other so that the first and second conductive pattern structures 170 and 270 may contact with each other to complete the semiconductor device.

Figure 46:
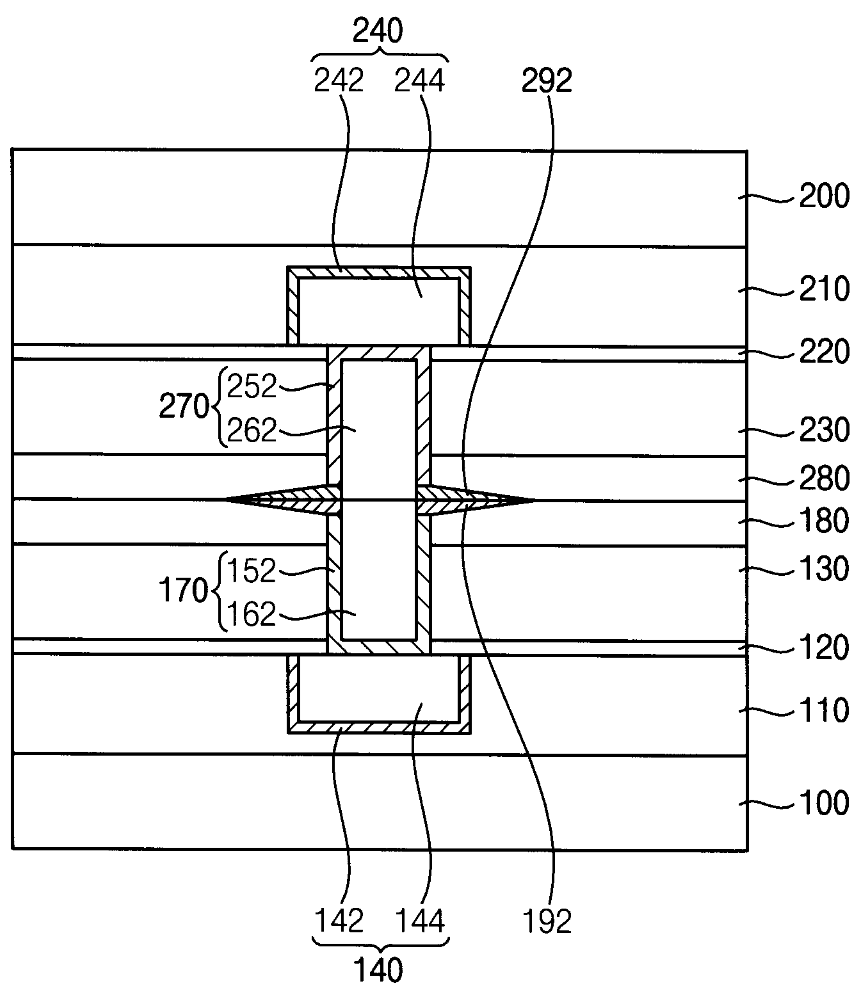

Referring to FIG. 46, the first and second conductive patterns 162 and 262 may contact with each other, while the first and second barrier layer patterns 152 and 252 may not contact with each other. In this case, the first and second adhesive patterns 192 and 292 may fill an empty space between the first barrier layer pattern 152 and the second barrier layer pattern 252, and between the first bonding insulation layer pattern 180 and the second bonding insulation layer pattern 280. Accordingly, the first substrate 100 and second substrate 200 may be bonded with each other more strongly, and the diffusion of metal included in the first and second conductive patterns 162 and 262 may be prevented.

FIGS. 47 to 58 are cross-sectional views illustrating stages of a method of manufacturing a semiconductor device in accordance with the teachings contained in this disclosure. The semiconductor device may include a solid-state imaging device.

Figure 47:
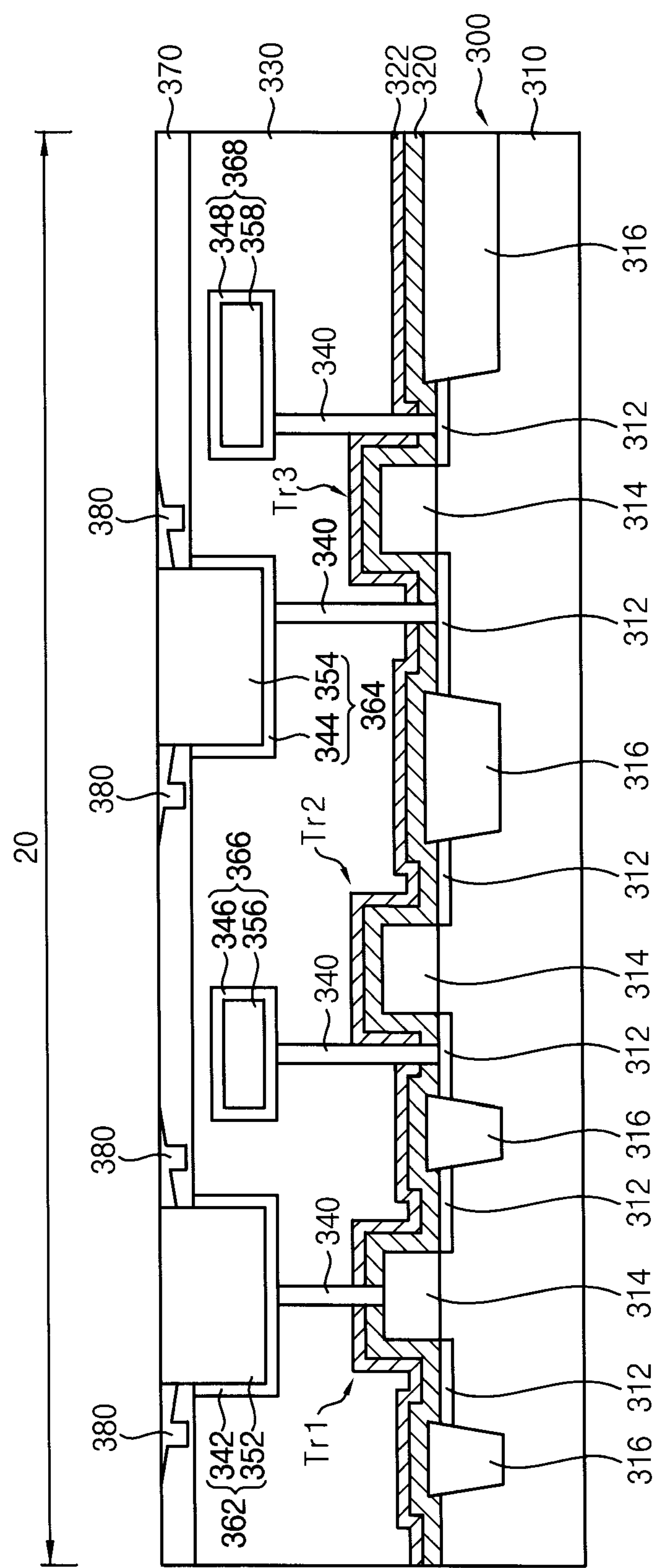

Referring to FIG. 47, a first gate structure 314 may be formed on a first substrate 300 having a first isolation layer 316 thereon.

A first well region 310 may be formed in the first substrate 300. For example, the first well region 310 may be formed by implanting p-type impurities into the first substrate 300.

A first source/drain region 312 may be formed at an upper portion of the first substrate 300 adjacent to the first gate structure 314. For example, the first source/drain region 312 may be formed by implanting n-type impurities into the first substrate 300.

Accordingly, the first gate structure 314 and the first source/drain region 312 may form a transistor. In some embodiments, a plurality of transistors, for example, first to third transistors Tr1, Tr2, and Tr3 may be formed on the first substrate 300. The first to third transistors Tr1, Tr2, and Tr3 may be formed in a logic area 20.

First and second insulating films 320 and 322 may be sequentially formed on the first substrate 300 to cover the first to third transistors Tr1, Tr2, and Tr3. The first insulating film 320 may be formed of, e.g., silicon oxide, and the second insulating film 322 may be formed of, e.g., silicon nitride.

A first insulating interlayer 330 having a first contact plug 340 therein may be formed on the second insulating film 322.

The first contact plug 340 may contact the first source/drain region 312, thereby being electrically connected to the first to third transistors Tr1, Tr2, and Tr3. The first contact plug 340 may be formed of, e.g., doped polysilicon, a metal, a metal nitride, or the like.

Fifth and sixth conductive pattern structures 366 and 368 contacting the first contact plug 340 may be formed in the first insulating interlayer 330. In some embodiments, the fifth conductive pattern structure 366 may be formed to include a fifth conductive pattern 356 and a fifth barrier layer pattern 346, and the sixth conductive pattern structure 368 may be formed to include a sixth conductive pattern 358 and a sixth barrier layer pattern 348. The fifth barrier layer pattern 346 may cover the fifth conductive pattern 356, and the sixth barrier layer pattern 348 may cover the sixth conductive pattern 358.

Processes substantially the same as or similar to those illustrated with reference to FIGS. 1 to 8 may be performed, so that first and second conductive pattern structures 362 and 364 contacting the first contact plug 340, and a first bonding insulation layer pattern 370 may be sequentially formed on the first insulating interlayer 330. Then, a first adhesive pattern 380 partially covering the first and second conductive pattern structures 362 and 364 may be formed on the first bonding insulation layer pattern 370.

In some embodiments, the first conductive pattern structure 362 may be formed to include a first conductive pattern 352 and a first barrier layer pattern 342, and the second conductive pattern structure 364 may be formed to include a second conductive pattern 354 and a second barrier layer pattern 344. The first barrier layer pattern 342 may cover the first conductive pattern 352, and the second barrier layer pattern 344 may cover the second conductive pattern 354.

Each of the first and second conductive pattern structures 362 and 364 may be formed by a CMP process to have a top surface higher than that of the first insulating interlayer 330.

In some embodiments, in a plan view, the first adhesive pattern 380 may be formed to have various shapes, e.g., a rectangular shape, a circular shape, an oval shape, or the like. In some embodiments, a plurality of first adhesive patterns 380 may be formed on the first bonding insulation layer pattern 370 to be spaced apart from each other.

Figure 48:
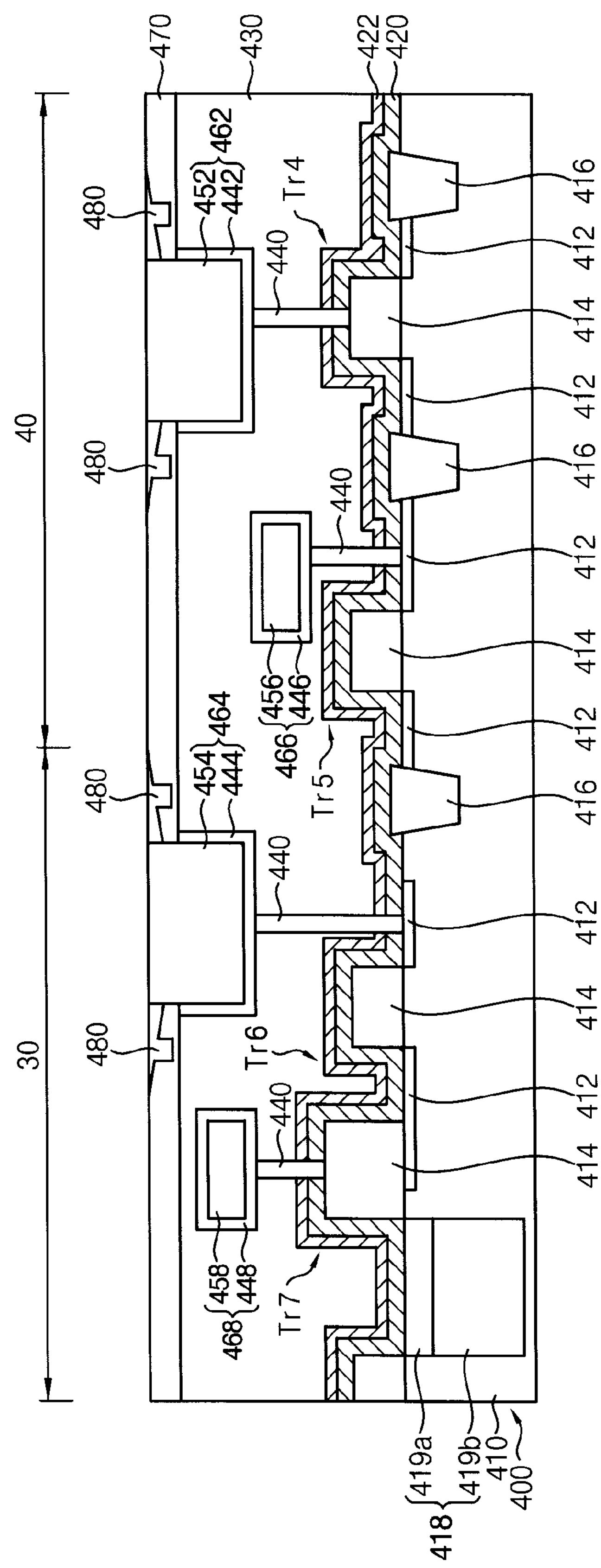

Referring to FIG. 48, a photodiode 418 may be formed in a second substrate 400 having a second isolation layer 416 thereon. The photodiode 418 may serve as a photoelectric conversion part of each pixel.

A second well region 410 may be formed in the second substrate 400. For example, the second well region 410 may be formed by implanting p-type impurities into the second substrate 400.

In some embodiments, the photodiode 418 may include a second semiconductor region 419*b* and a first semiconductor region 419*a* sequentially stacked. The first semiconductor region 419*a* may be formed by implanting p-type impurities into the second substrate 400, and the second semiconductor region 419*b* may be formed by implanting n-type impurities into the second substrate 400.

Processes substantially the same as or similar to those illustrated with reference to FIG. 47 may be performed so that a second gate structure 414 may be formed on the second substrate 400, and a second source/drain region 412 may be formed at an upper portion of the second substrate 400 adjacent to the second gate structure 414. Thus, a transistor defined by the second gate structure 414 and the second source/drain region 412 may be formed.

In some embodiments, a plurality of transistors, e.g., fourth to seventh transistors Tr4, Tr5, Tr6, and Tr7 may be formed on the second substrate 400. The fourth and fifth transistors Tr4 and Tr5 may be formed in a pixel area 30, and the sixth and seventh transistors Tr6 and Tr7 may be formed in a control area 40.

Alternatively, the first to third transistors Tr1, Tr2, and Tr3 may be formed in the logic area 20 and the control area 40, and the fourth to seventh transistors Tr4, Tr5, Tr6, and Tr7 may be formed in the pixel area 30.

Third and fourth insulating films 420 and 422 may be sequentially formed on the second substrate 400 to cover the fourth to seventh transistors Tr4, Tr5, Tr6, and Tr7. The third insulating film 420 may be formed of, e.g., silicon oxide, and the fourth insulating film 422 may be formed of, e.g., silicon nitride.

A second insulating interlayer 430 having a second contact plug 440 therein may be formed on the fourth insulating film 422.

The second contact plug 440 may contact the second source/drain region 412, thereby being electrically connected to the fourth to seventh transistors Tr4, Tr5, Tr6, and Tr7. The second contact plug 340 may be formed of, e.g., doped polysilicon, a metal, and/or a metal nitride.

Seventh and eighth conductive pattern structures 466 and 468 contacting the second contact plug 440 may be formed in the second insulating interlayer 430. In some embodiments, the seventh conductive pattern structure 466 may be formed to include a seventh conductive pattern 456 and a seventh barrier layer pattern 446, and the eighth conductive pattern structure 468 may be formed to include an eighth conductive pattern 458 and an eighth barrier layer pattern 448. The seventh barrier layer pattern 446 may cover the seventh conductive pattern 456, and the eighth barrier layer pattern 448 may cover the eighth conductive pattern 458.

Processes substantially the same as or similar to those illustrated with reference to FIGS. 1 to 8 may be performed, so that third and fourth conductive pattern structures 462 and 464 contacting the second contact plug 440, and a second bonding insulation layer structure 470 may be sequentially formed on the second insulating interlayer 430. Then, a second adhesive pattern 480 partially covering the third and fourth conductive pattern structures 462 and 464 may be formed on the second bonding insulation layer pattern 470. In some embodiments, the third conductive pattern structure 462 may be formed to include a third conductive pattern 452 and a third barrier layer pattern 442, and the fourth conductive pattern structure 464 may be formed to include a fourth conductive pattern 454 and a fourth barrier layer pattern 444. The third barrier layer pattern 442 may cover the third conductive pattern 452, and the fourth barrier layer pattern 444 may cover the fourth conductive pattern 454.

Each of the third and fourth conductive patterns 462 and 464 may be formed by a CMP process to have a top surface higher than a top surface of the second insulating interlayer 430.

In some embodiments, in a plan view, the second adhesive pattern 480 may be formed to have various shapes, e.g., a rectangular shape, a circular shape, an oval shape, or the like. In some embodiments, a plurality of second adhesive patterns 480 may be formed on the second bonding insulation layer pattern 470 to be spaced apart from each other.

Figure 49:
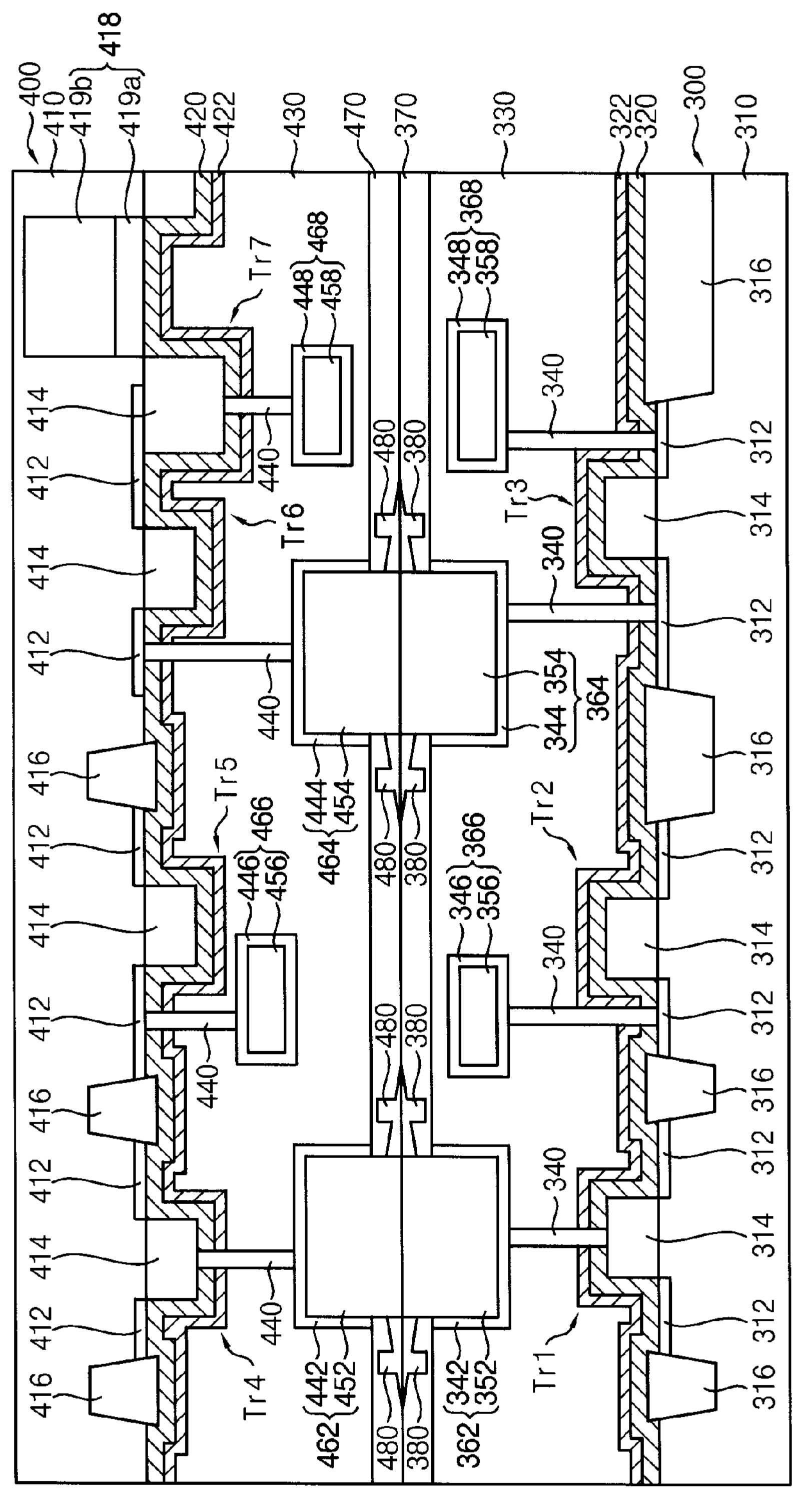

Referring to FIG. 49, the first and second substrates 300 and 400 may be bonded by processes substantially the same as or similar to those illustrated with reference to FIGS. 11 and 12.

In this case, the first and second adhesive patterns 192 and 292 may be melted by performing process substantially the same as or similar to that illustrated with reference to FIG. 11. Then, the first and second adhesive patterns 192 and 292 may be hardened with contacting with each other, so that the first and second substrates 100 and 200 may be bonded with each other more strongly. Further, the first and second adhesive patterns 192 and 292 in a molten state may fill an empty space between the first substrate 100 and the second substrate 200, so as to increase a bonding force between the first substrate 100 and second substrate 200. Accordingly, even when the first and third conductive pattern structures 362 and 462 are misaligned with each other, the diffusion of metal included in the first and third conductive pattern structures 362 and 462 may be prevented.

Figure 50:
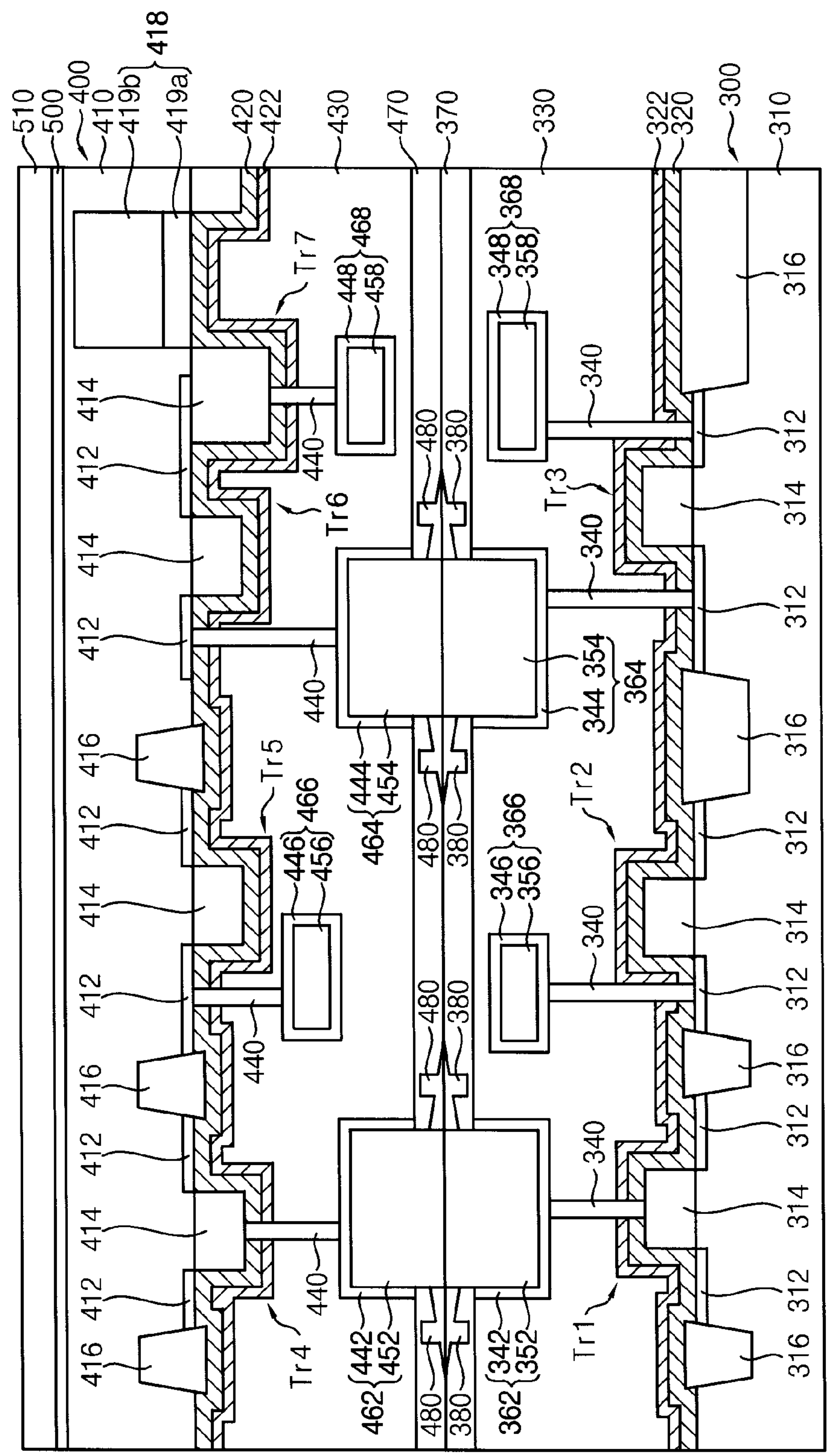

Referring to FIG. 50, an anti-reflective layer 500 and a third insulating interlayer 510 may be sequentially formed on the second substrate 400. The anti-reflective layer 500 may be formed of, e.g., hafnium oxide. The third insulating interlayer 510 may be formed of a material substantially the same as that of the first and second insulating interlayers 330 and 430. The third insulating interlayer 510 may be formed of an oxide, e.g., silicon oxide, or a low-k dielectric material.

Figure 51:
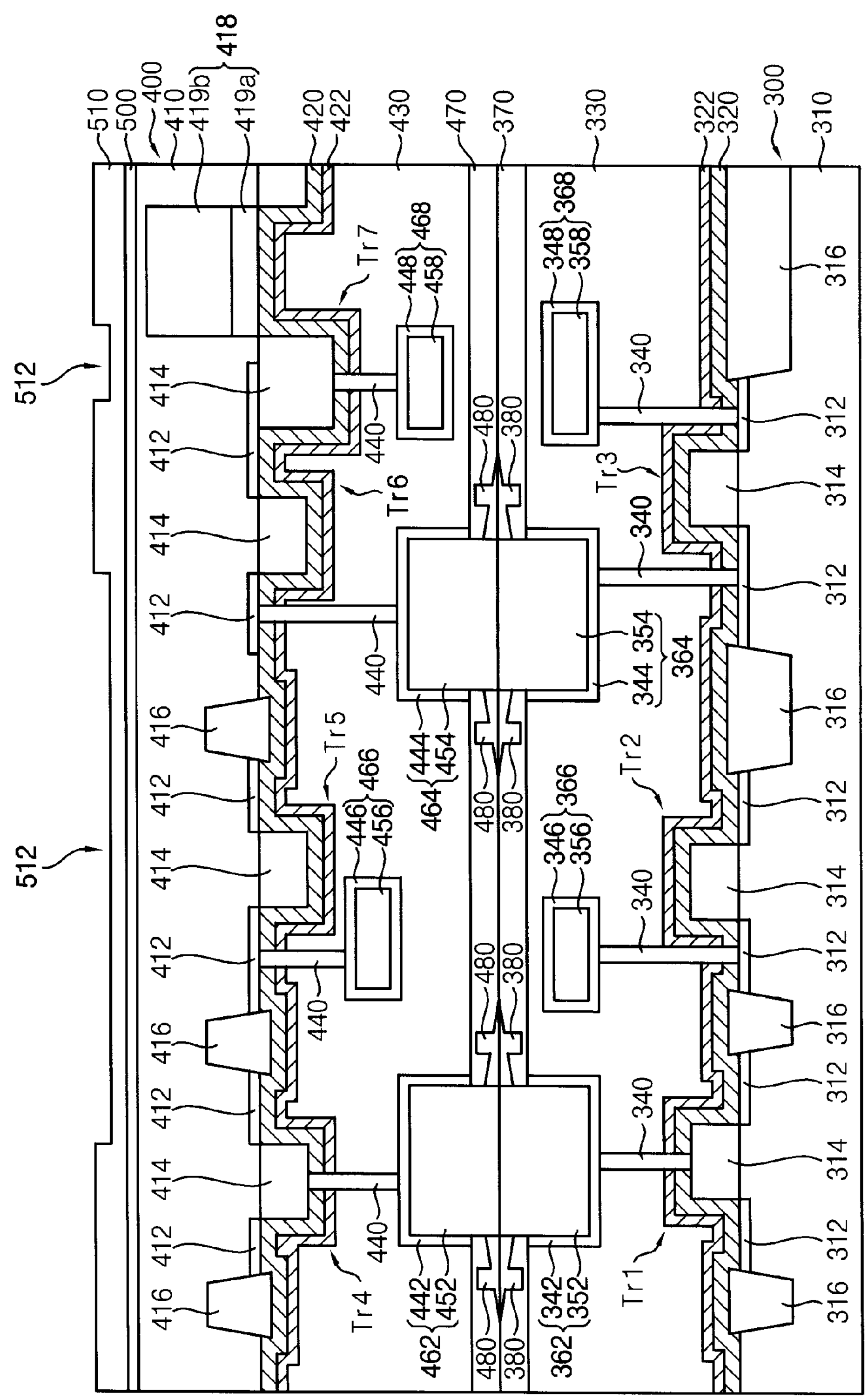

Referring to FIG. 51, a first trench 512 may be formed on the third insulating interlayer 510. In some embodiments, a plurality of first trenches 512 may be formed.

Figure 52:
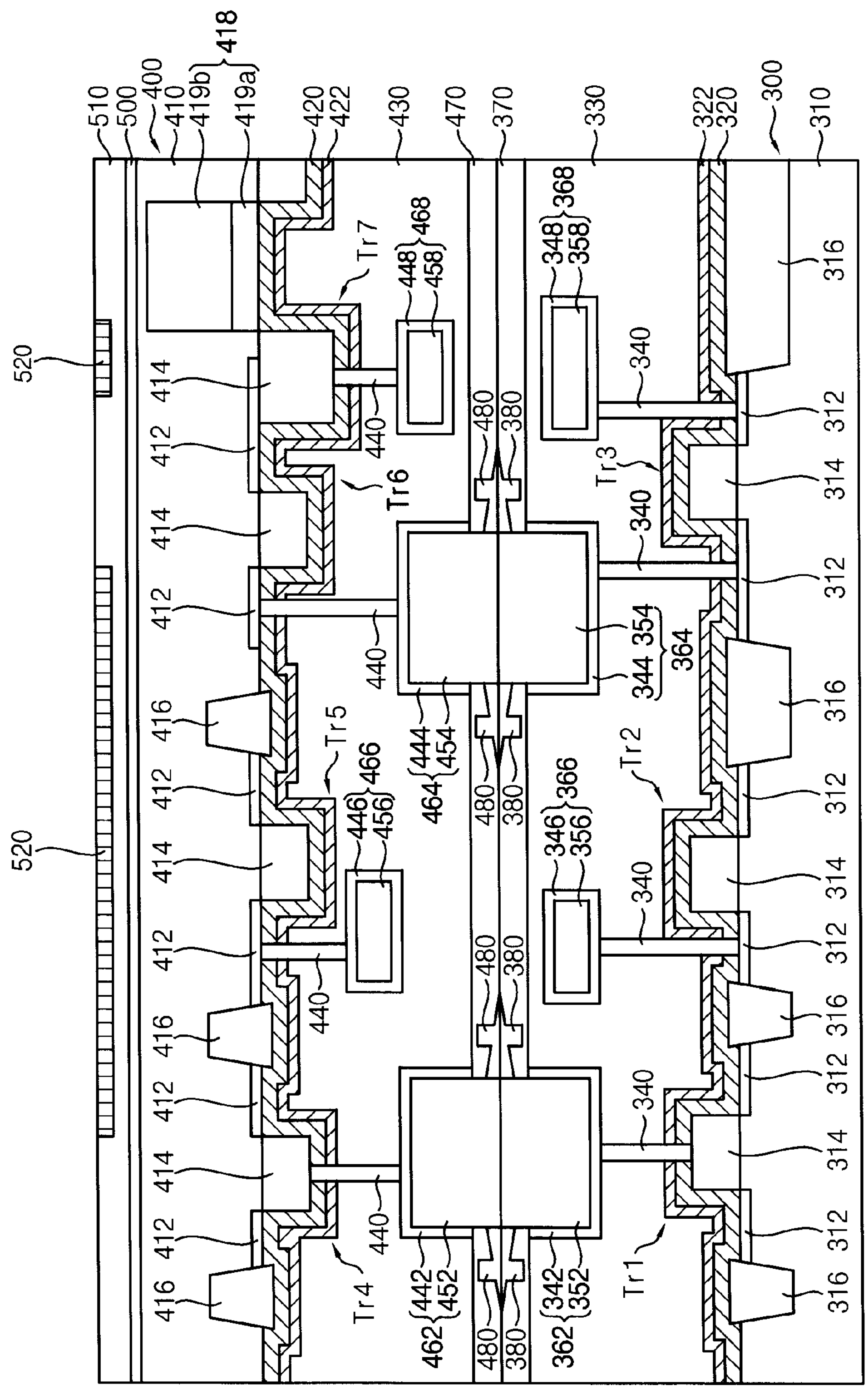

Referring to FIG. 52, a shielding layer may be formed on the third insulating interlayer 510 to sufficiently fill the first trench 512. The shielding layer may be formed of a conductive material, e.g., copper.

The shielding layer may be planarized until a top surface of the third insulating interlayer 510 is exposed to form a shielding layer pattern 520. For example, the planarization process may be performed by a CMP process.

Figure 53:
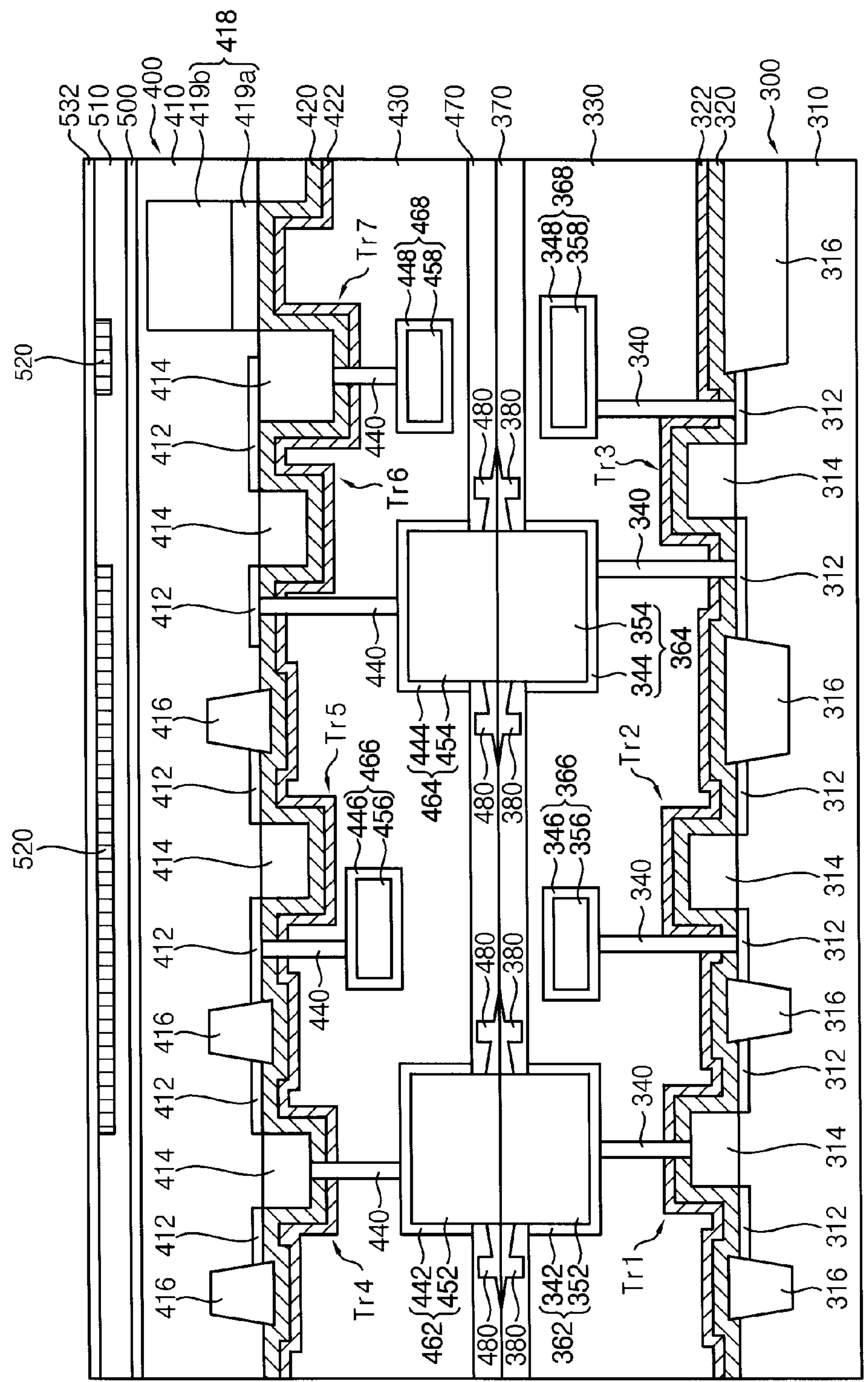

Referring to FIG. 53, a capping layer 532 may be formed on the third insulating interlayer 510 and the shielding layer pattern 520 to include a nitride, e.g., silicon nitride, silicon carbonitride, or the like.

Figure 54:
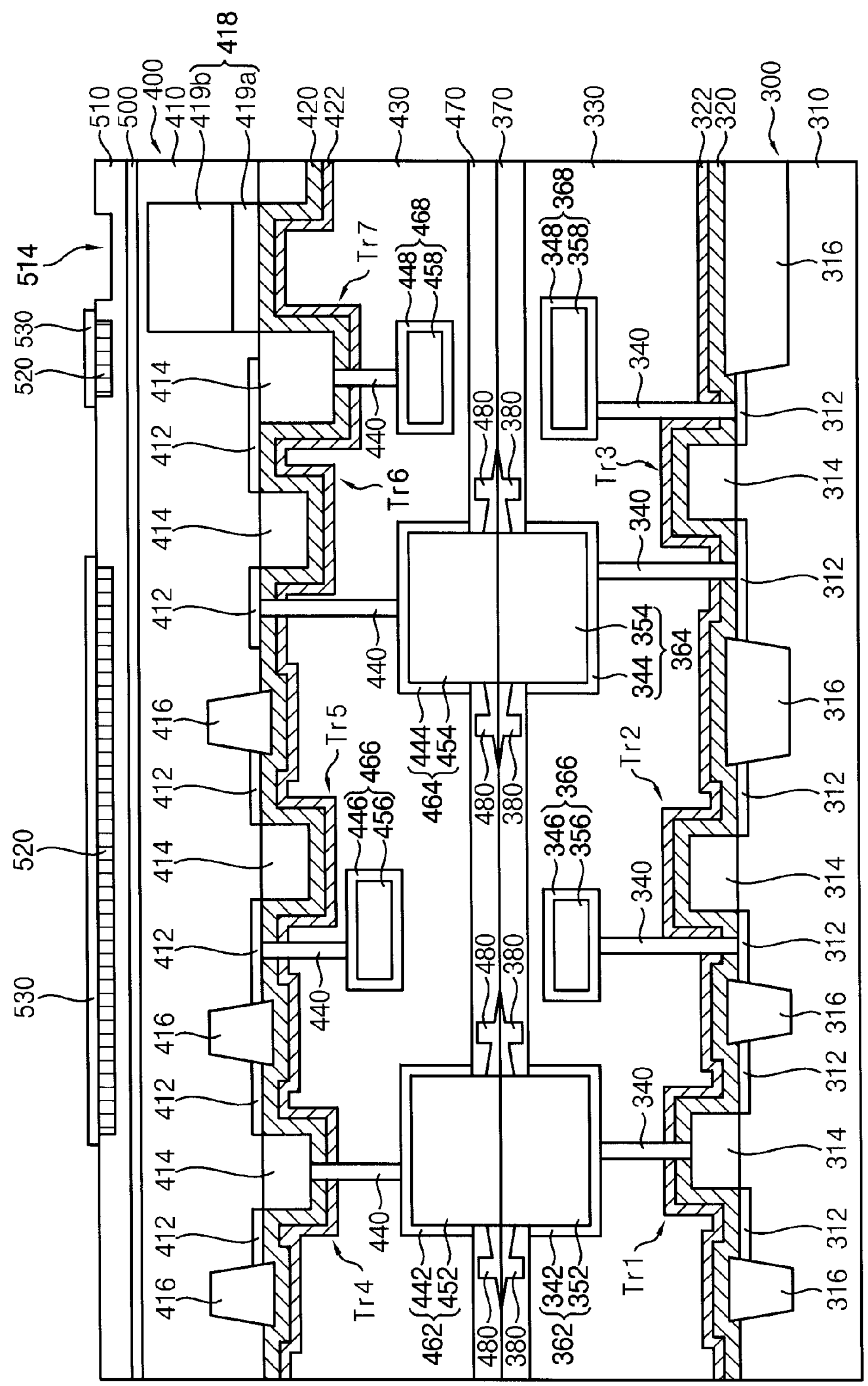

Referring to FIG. 54, the capping layer 532 and the third insulating interlayer 510 may be partially etched to form a capping layer pattern 530 and a second trench 514 thereon, respectively.

In some embodiments, the capping layer pattern 530 may be formed to sufficiently cover the shielding layer pattern 520, and the second trench 514 may be formed to overlap the photodiode 418.

Figure 55:
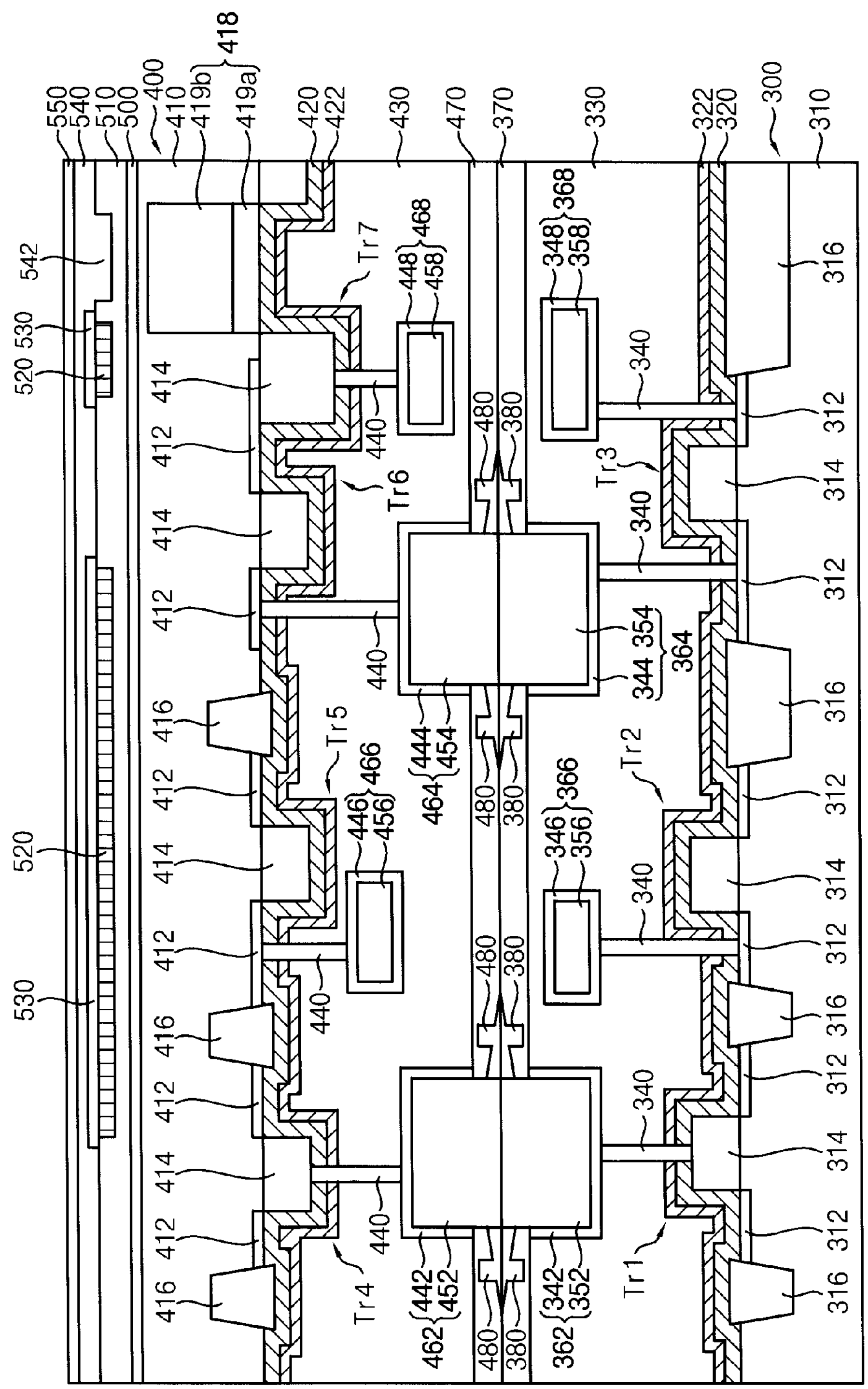

Referring to FIG. 55, a waveguide material layer 540 may be formed on the third insulating interlayer 510 and capping layer pattern 530 to sufficiently fill the second trench 514. The waveguide material layer 540 may be formed of a nitride, e.g., silicon nitride, or the like.

A portion of the waveguide material layer 540 filling the second trench 514 may form a waveguide 542. The waveguide 542 may efficiently concentrate an incident light on the photodiode 418.

A planarization layer 550 may be formed on the waveguide material layer 540.

Figure 56:
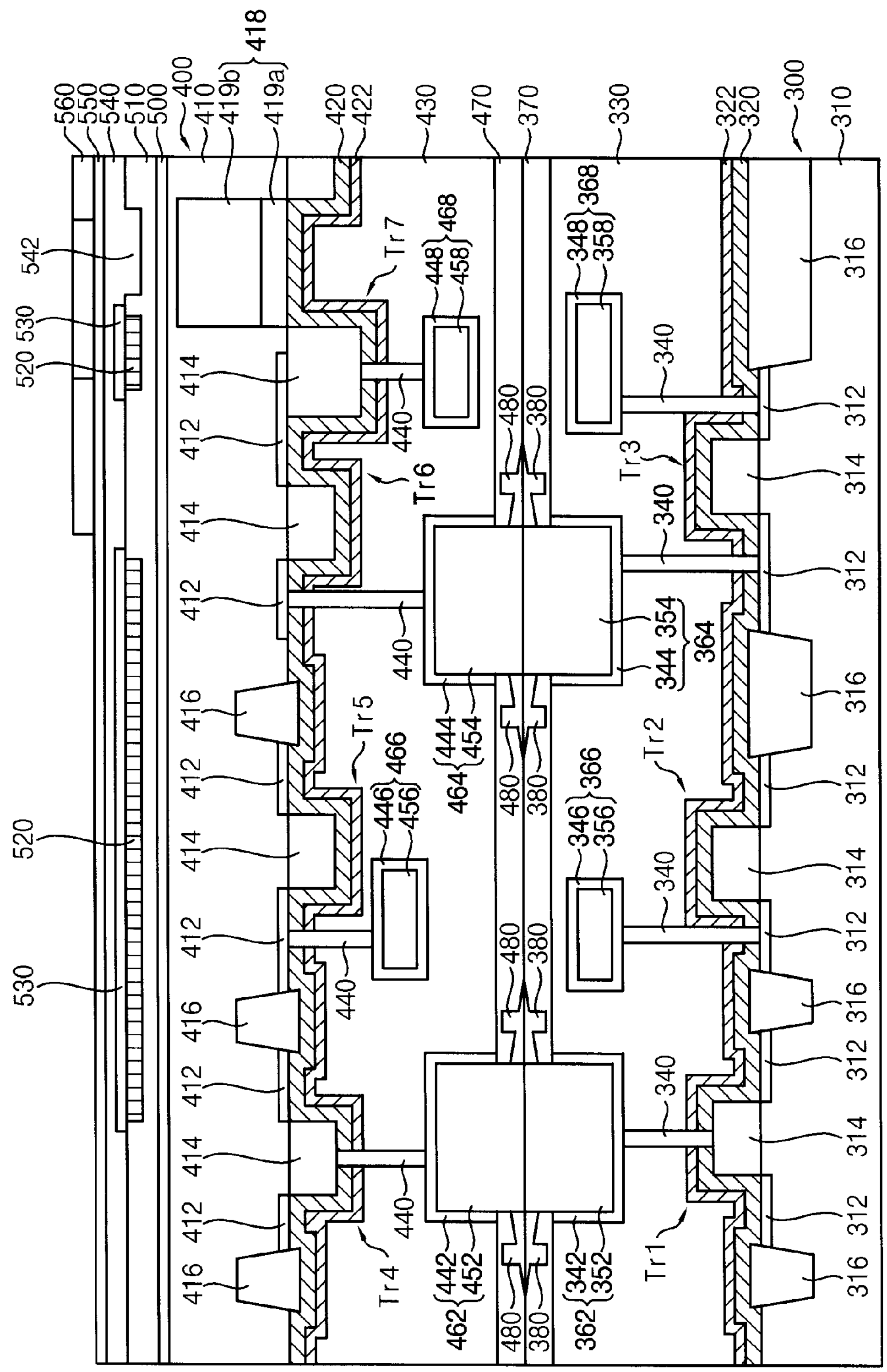

Referring to FIG. 56, a color filter 560 corresponding to each pixel may be formed on the planarization layer 550 to overlap the photodiode 418.

The color filter 560 may be formed by forming an organic layer containing red, green, or blue pigment and patterning the organic layer.

Figure 57:
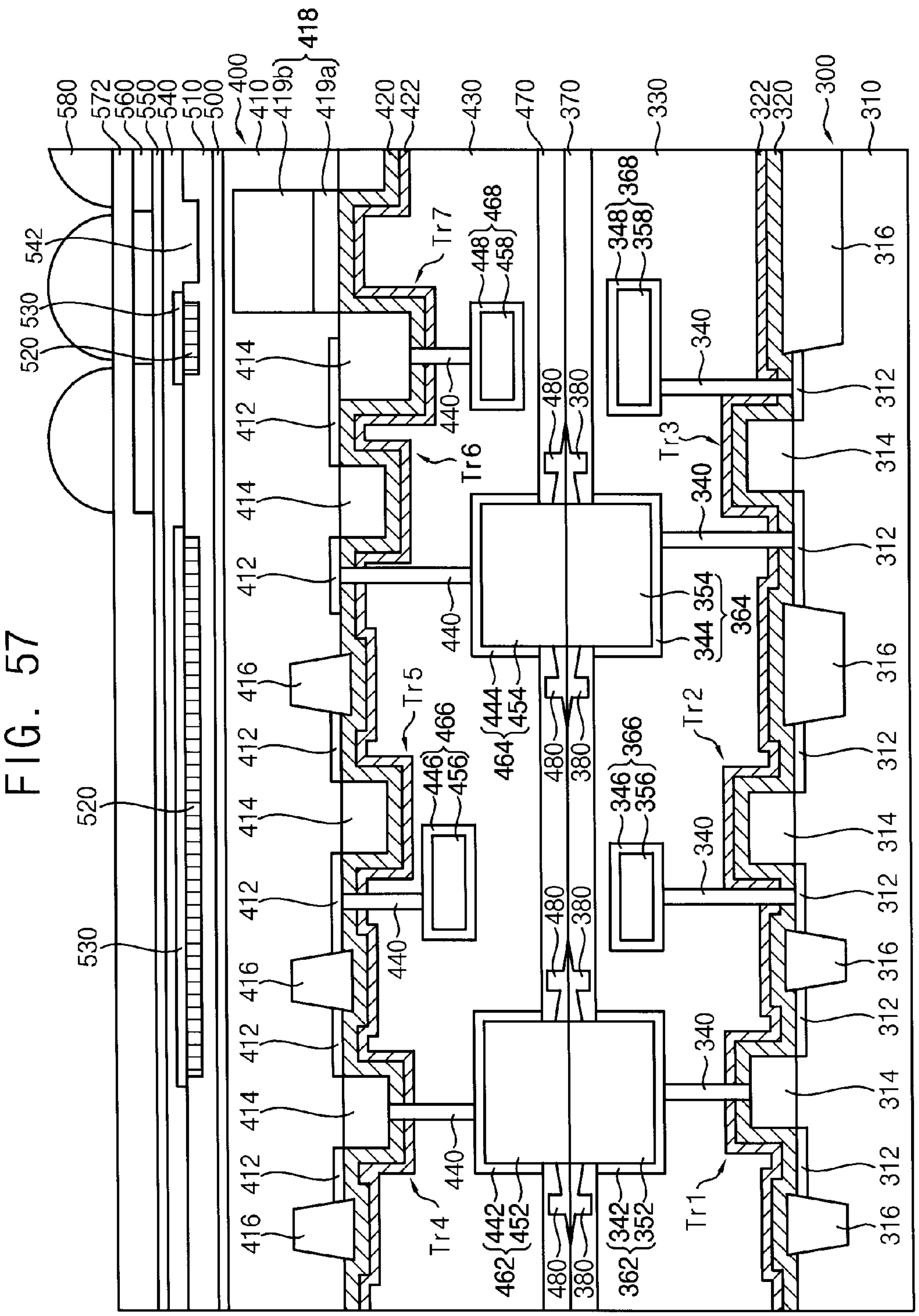

Referring to FIG. 57, a lens material layer 572 may be formed on the planarization layer 550 and the color filter 560. The lens material layer 572 may be formed of an organic material, or an inorganic material, e.g., silicon oxide, silicon nitride, silicon oxynitride, or the like.

A resist film 580 may be formed on the lens material layer 572 in a region corresponding to each pixel.

Figure 58:
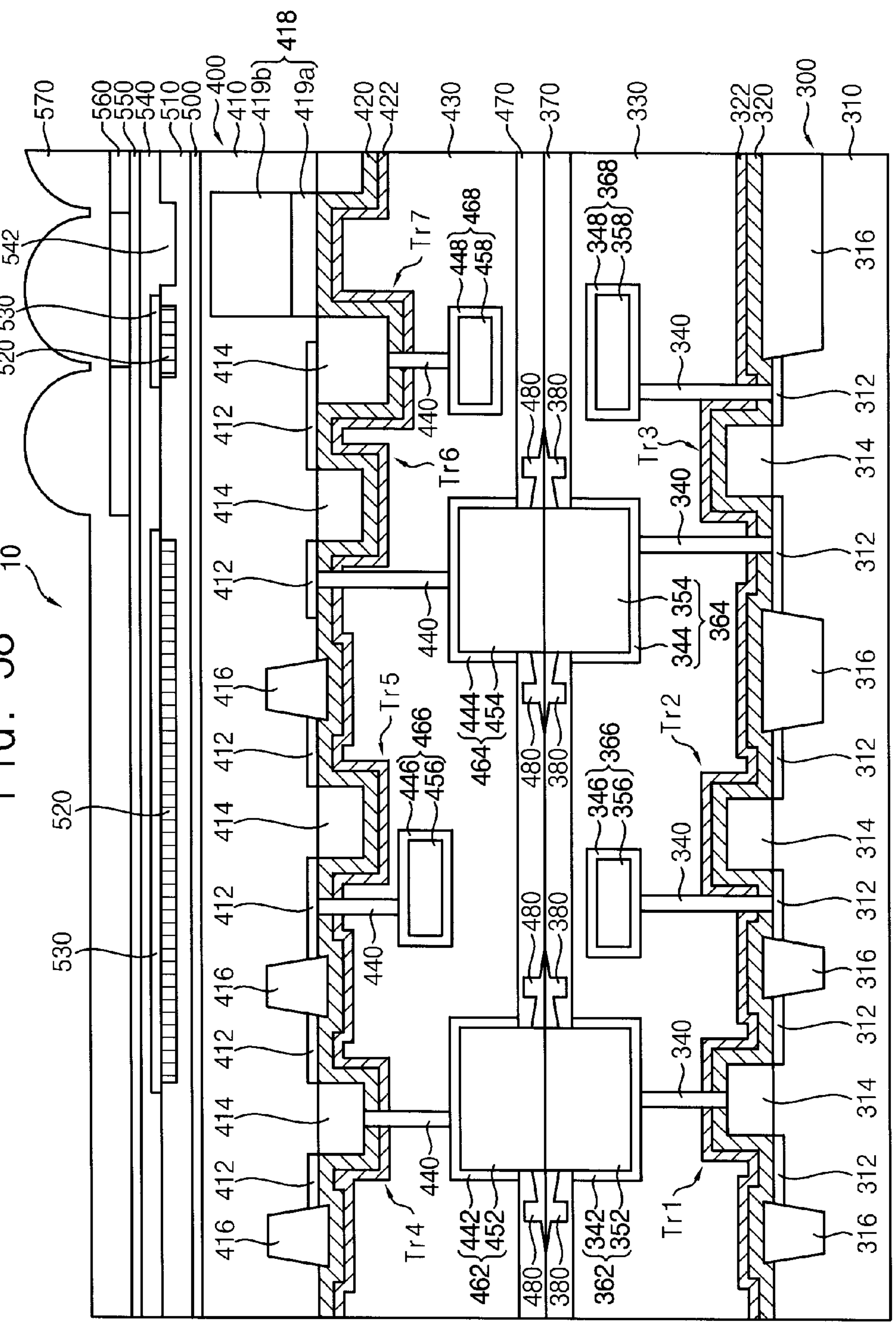

Referring to FIG. 58, a lens 570 may be formed by etching the lens material layer 572 so that a shape of the resist film 580 may be transferred.

A light incident on the lens 570 of a semiconductor device 10 may pass through the color filter 560 and the waveguide 542, sequentially, to be concentrated onto the photodiode 418, and thus may be converted into an electrical energy.

The foregoing is illustrative of the teachings contained in this disclosure and is not to be construed as limiting thereof. Although a few illustrative embodiments have been described, those skilled in the art will readily appreciate that many modifications are possible in the illustrative embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific illustrative embodiments disclosed, and that modifications to the disclosed illustrative embodiments, as well as other embodiments, are intended to be included within the scope of the appended claims.

What is claimed is:

1. A method of manufacturing a semiconductor device, the method comprising:

forming a first conductive pattern structure in a first insulating interlayer formed on a first substrate, a portion of the first conductive pattern structure protruding upwardly from the first insulating interlayer;

forming a first bonding insulation layer pattern on the first insulating interlayer, the first bonding insulation layer pattern covering the portion of the first conductive pattern structure protruding from the first insulating interlayer;

forming a first recess on the first bonding insulation layer pattern;

forming a first adhesive pattern containing a polymer to fill the first recess;

forming a second conductive pattern structure in a second insulating interlayer formed on a second substrate, a portion of the second conductive pattern structure protruding upwardly from the second insulating interlayer;

forming a second bonding insulation layer pattern on the second insulating interlayer, the second bonding insulation layer pattern covering the portion of the second conductive pattern structure protruding from the second insulating interlayer;

forming a second recess on the second bonding insulation layer pattern;

forming a second adhesive pattern containing a polymer to fill the second recess; and melting adhesive in the first adhesive pattern and the second adhesive pattern; and bonding the first and second substrates with each other so that the first conductive pattern structure and the second conductive pattern structure are in contact with each other.

2. The method of claim 1, wherein the first recess is formed to be spaced apart from the first conductive pattern structure, and wherein the second recess is formed to be spaced apart from the second conductive pattern structure.

3. The method of claim 2, wherein a plurality of first recesses is formed to be spaced apart from the first conductive pattern structure by different distances from each other, and wherein a plurality of second recesses is formed to be spaced apart from the second conductive pattern structure by different distances from each other.

4. The method of claim 3, wherein the plurality of first recesses has different shapes from each other, in a plan view, and wherein the plurality of second recesses has different shapes from each other in a plan view.

5. The method of claim 1, wherein the first recess surrounds the first conductive pattern structure in a plan view, and wherein the second recess surrounds the second conductive pattern structure in a plan view.

6. The method of claim 5, wherein a plurality of first recesses is formed to partially surround the first conductive pattern structure, and wherein a plurality of second recesses is formed to partially surround the second conductive pattern structure.

7. The method of claim 1, wherein a top surface of the first bonding insulation layer pattern is substantially coplanar with a top surface of the first conductive pattern structure, and wherein a top surface of the second bonding insulation layer pattern is substantially coplanar with a top surface of the second conductive pattern structure.

8. The method of claim 1, wherein a height of a top surface of the first bonding insulation layer pattern gradually decreases toward the first conductive pattern structure at a portion thereof adjacent to the first conductive pattern structure, so that an upper sidewall of the first conductive pattern structure is exposed, and wherein a height of a top surface of the second bonding insulation layer pattern gradually decreases toward the second conductive pattern structure at a portion thereof adjacent to the second conductive pattern structure, so that an upper sidewall of the second conductive pattern structure is exposed.

9. The method of claim 8, wherein at least one of the first and second adhesive patterns protrudes upwardly from the first bonding insulation layer pattern and/or the second bonding insulation layer pattern, respectively, and wherein the first and second substrates are bonded with each other so as not to generate an empty space between the first and second substrates.

10. A method of manufacturing a semiconductor device, the method comprising:

forming a first conductive pattern structure in a first insulating interlayer formed on a first substrate, a portion of the first conductive pattern structure protruding upwardly from the first insulating interlayer;

forming a first bonding insulation layer pattern on the first insulating interlayer, the first bonding insulation layer pattern at least partially covering the portion of the first conductive pattern structure protruding from the first insulating interlayer;

forming a first adhesive layer containing a polymer on the first insulating interlayer and the first conductive pattern structure;

planarizing the first adhesive layer until a top surface of the first conductive pattern structure is exposed to form a first adhesive pattern;

forming a second conductive pattern structure in a second insulating interlayer formed on a second substrate, a portion of the second conductive pattern structure protruding upwardly from the second insulating interlayer;

forming a second bonding insulation layer pattern on the second insulating interlayer, the second bonding insulation layer pattern partially covering the portion of the second conductive pattern structure protruding from the second insulating interlayer;

forming a second adhesive layer containing a polymer on the second insulating interlayer and the second conductive pattern structure;

planarizing the second adhesive layer until a top surface of the second conductive pattern structure is exposed to form a second adhesive pattern;

heating the first and second adhesive patterns to be melted; and bonding the first and second substrates with each other so that the first and second conductive pattern structures contact with each other.

11. The method of claim 10, wherein forming the first bonding insulation layer pattern on the first insulating interlayer includes:

forming a first bonding insulation layer on the first conductive pattern structure and the first insulating interlayer; and planarizing the first bonding insulation layer to form the first bonding insulation layer pattern by performing a chemical mechanical polishing (CMP) process until the top surface of the first conductive pattern structure is exposed, a height of the top surface of the first bonding insulation layer pattern gradually decreasing toward the first conductive pattern structure at a portion thereof adjacent to the first conductive pattern structure so that an upper sidewall of the protruding portion of the first conductive pattern structure is exposed, and wherein forming the second bonding insulation layer pattern on the second insulating interlayer includes:

forming a second bonding insulation layer on the second conductive pattern structure and the second insulating interlayer; and planarizing the second bonding insulation layer to form the second bonding insulation layer pattern by performing a CMP process until the top surface of the second conductive pattern structure is exposed, a height of the top surface of the second bonding insulation layer pattern gradually decreasing toward the second conductive pattern structure at a portion thereof adjacent to the second conductive pattern structure so that an upper sidewall of the protruding portion of the second conductive pattern structure is exposed.

12. The method of claim 11, wherein the top surface of the first bonding insulation layer pattern is substantially coplanar with the top surface of the first conductive pattern structure, except for the portion thereof adjacent to the first conductive pattern structure, which is lower than the top surface of the first conductive pattern structure, and wherein the top surface of the second bonding insulation layer pattern is substantially coplanar with the top surface of the second conductive pattern structure, except for the portion thereof adjacent to the second conductive pattern structure, which is lower than the top surface of the second conductive pattern structure.

13. The method of claim 10, wherein forming the first conductive pattern structure in the first insulating interlayer formed on the first substrate includes:

forming a first opening through the first insulating interlayer to expose a top surface of the first substrate;

forming a first barrier layer on the exposed top surface of the first substrate, a sidewall of the first opening, and the first insulating interlayer;

forming a first conductive layer on the first barrier layer to fill a remaining portion of the first opening; and planarizing the first conductive layer and the first barrier layer by performing a CMP process until a top surface of the first insulating interlayer is exposed to form a first conductive pattern and a first barrier layer pattern, respectively, and wherein forming the second conductive pattern structure in the second insulating interlayer formed on the second substrate includes:

forming a second opening through the second insulating interlayer to be exposed a top surface of the second substrate;

forming a second barrier layer on the exposed top surface of the second substrate, a side wall of the second opening, and the second insulating interlayer;

forming a second conductive layer on the second barrier layer to fill a remaining portion of the second opening; and planarizing the second conductive layer and the second barrier layer by performing a CMP process until the top surface of the second insulating interlayer is exposed to form a second conductive pattern and a second barrier layer pattern, respectively.

14. The method of claim 13, wherein a top surface of the first barrier layer pattern is lower than a top surface of the first conductive pattern, and wherein a top surface of the second barrier layer pattern is lower than a top surface of the second conductive pattern.

15. The method of claim 14, wherein the first adhesive pattern contacts a sidewall of the first conductive pattern and vertically overlaps the first barrier layer pattern, and wherein the second adhesive pattern contacts a sidewall of the second conductive pattern and vertically overlaps the second barrier layer pattern.

16. A semiconductor device comprising:

a first substrate comprising a first conductive pattern structure formed in a first insulating interlayer formed on the first substrate, a portion of the first conductive pattern structure protruding upwardly from the first insulating interlayer, with a first bonding insulation layer pattern formed on the first insulating interlayer, the first bonding insulation layer pattern covering the portion of the first conductive pattern structure protruding from the first insulating interlayer, with a first recess formed on the first bonding insulation layer pattern, the first recess being filled with a first adhesive pattern containing a polymer; and a second substrate comprising a second conductive pattern structure in a second insulating interlayer formed on the second substrate, a portion of the second conductive pattern structure protruding upwardly from the second insulating interlayer, with a second bonding insulation layer pattern formed on the second insulating interlayer, the second bonding insulation layer pattern covering the portion of the second conductive pattern structure protruding from the second insulating interlayer, with a second recess formed on the second bonding insulation layer pattern, the second recess being filled with a second adhesive pattern containing a polymer, wherein adhesive in the first adhesive pattern and adhesive in the second adhesive pattern have been melted, and caused bonding of the first substrate and the second substrate so that the first and second conductive pattern structures are in contact with each other.

17. The semiconductor device of claim 16, configured as a photosensor.

18. The semiconductor device of claim 17, further comprising an anti-reflective layer disposed over the photosensor.

19. The semiconductor device of claim 17, further comprising a waveguide layer disposed over the photosensor.

20. The semiconductor device of claim 19, wherein the waveguide layer is configured to concentrate incident light.

* * * * *